(12) United States Patent
Bauer et al.

(10) Patent No.: US 6,550,949 B1
(45) Date of Patent: *Apr. 22, 2003

(54) SYSTEMS AND COMPONENTS FOR ENHANCING REAR VISION FROM A VEHICLE

(75) Inventors: Frederick T. Bauer, Holland, MI (US); Lois Bauer, Holland, MI (US); John K. Roberts, East Grand Rapids, MI (US); Joseph S. Stam, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/153,654

(22) Filed: Sep. 15, 1998

Related U.S. Application Data

(63) Continuation-in-part of application No. 09/148,375, filed on Sep. 4, 1998, now Pat. No. 6,132,072, which is a continuation of application No. 08/664,055, filed on Jun. 6, 1996, now Pat. No. 5,803,579.

(51) Int. Cl.[7] ................................................ B60Q 1/00
(52) U.S. Cl. ................. 362/545; 362/231; 362/800; 340/937; 340/468; 257/118; 257/148
(58) Field of Search ................. 362/543, 544, 362/545, 249, 252, 230, 231; 340/461, 435, 903, 932.2, 937, 468; 348/118, 148; 257/89; 313/502, 503

(56) References Cited

U.S. PATENT DOCUMENTS

| | | |
|---|---|---|
| 3,875,456 A | 4/1975 | Kano et al. |
| 4,211,955 A | 7/1980 | Ray |
| 4,214,266 A | 7/1980 | Myers |
| 4,256,372 A | 3/1981 | Yasukuni et al. |
| 4,277,804 A | 7/1981 | Robinson |
| 4,298,869 A | 11/1981 | Okuno |
| 4,377,768 A | 3/1983 | Gallaro et al. |
| 4,450,512 A | 5/1984 | Kristofek |
| 4,554,587 A | 11/1985 | Ooi et al. |

(List continued on next page.)

FOREIGN PATENT DOCUMENTS

| | | | |
|---|---|---|---|
| CA | 905475 | * | 7/1972 |
| DE | 3916875 | | 12/1990 |
| DE | 0417397 | | 3/1991 |

(List continued on next page.)

OTHER PUBLICATIONS

Photographs of a CHMSL of a 1995 Ford F150 Pickup Truck.

(List continued on next page.)

Primary Examiner—Thomas M. Sember
(74) Attorney, Agent, or Firm—Price, Heneveld, Cooper, DeWitt & Litton; Brian J. Rees

(57) ABSTRACT

A vehicle system is disclosed that includes a vehicle lamp assembly including a plurality of LEDs that emit white light so as to function as an illuminator light. The lamp assembly also may include a plurality of LEDs that emit colored light, such as red or red-orange, so as to function as a signal light. Alternatively or additionally, the lamp assembly may include a camera of a vehicle imaging system. The lamp assembly may serve as a center high mounted stop light or as a tail light. The system also includes a controller that rapidly pulses the LEDs on and off at a rate that is imperceivable by the human eye. The pulsing intervals of the LEDs may be related to the readout intervals of the camera sensor array. In this manner, the LEDs may be pulsed on during camera readout so as to increase their intensity while the camera is capturing an image, or may be pulsed off during camera readout to prevent feedback glare from interfering with image capture by a highly sensitive image sensor array of the camera.

42 Claims, 29 Drawing Sheets

U.S. PATENT DOCUMENTS

| | | |
|---|---|---|
| 4,580,196 A | 4/1986 | Task |
| 4,631,516 A | 12/1986 | Clinker |
| 4,646,210 A | 2/1987 | Skogler et al. |
| 4,647,975 A | 3/1987 | Alston et al. |
| 4,667,177 A | 5/1987 | Athalye |
| 4,733,336 A | 3/1988 | Skogler et al. |
| 4,734,697 A | 3/1988 | Robinson et al. |
| 4,807,096 A | 2/1989 | Skogler et al. |
| 4,868,542 A | 9/1989 | Thompson |
| 4,882,565 A | 11/1989 | Gallmeyer |
| 4,891,624 A | 1/1990 | Ishikawa et al. |
| 4,893,112 A | 1/1990 | Hatcher |
| 4,896,136 A | 1/1990 | Hotovy |
| 4,902,108 A | 2/1990 | Byker |
| 4,910,591 A | 3/1990 | Petrossian et al. |
| 4,917,477 A | 4/1990 | Bechtel et al. |
| 4,928,084 A | 5/1990 | Reiser |
| 4,929,866 A | 5/1990 | Murata et al. |
| 4,947,291 A | 8/1990 | McDermott |
| 4,985,816 A | 1/1991 | Seko et al. |
| 4,992,704 A | 2/1991 | Stinson |
| 5,001,609 A | 3/1991 | Gardner et al. |
| 5,008,595 A | 4/1991 | Kazar |
| 5,027,200 A | 6/1991 | Petrossian et al. |
| 5,038,258 A * | 8/1991 | Koch et al. ............ 362/237 |
| 5,083,192 A | 1/1992 | Rzeznik et al. |
| 5,121,200 A | 6/1992 | Choi |
| 5,126,926 A | 6/1992 | Chiang Wen |
| 5,136,483 A * | 8/1992 | Schoniger et al. ......... 362/31 |
| 5,143,433 A | 9/1992 | Farrell |
| 5,194,957 A | 3/1993 | Kyuma |
| 5,241,457 A | 8/1993 | Sasajima et al. |
| 5,255,171 A | 10/1993 | Clark |
| 5,289,321 A | 2/1994 | Secor |
| 5,303,037 A | 4/1994 | Taranowski |
| 5,307,136 A | 4/1994 | Saneyoshi |
| 5,325,271 A | 6/1994 | Hutchisson |
| 5,371,659 A | 12/1994 | Pastrick et al. |
| 5,384,519 A | 1/1995 | Gotoh |
| 5,387,958 A | 2/1995 | Pashley |
| 5,471,515 A | 11/1995 | Fossum et al. |
| 5,477,436 A | 12/1995 | Bertling et al. |
| 5,490,049 A | 2/1996 | Montalan et al. |
| 5,495,243 A | 2/1996 | McKenna |
| 5,497,305 A | 3/1996 | Pastrick et al. |
| 5,497,306 A * | 3/1996 | Pastrick ............... 362/83.1 |
| 5,550,677 A | 8/1996 | Schofield et al. |
| 5,555,069 A | 9/1996 | Albrecht et al. |
| 5,631,704 A | 5/1997 | Dickinson et al. |
| 5,646,614 A | 7/1997 | Abersfelder et al. |
| 5,670,935 A | 9/1997 | Schofield et al. |
| 5,699,044 A | 12/1997 | Van Lente et al. |
| 5,765,940 A | 6/1998 | Levy et al. |
| 5,798,691 A | 8/1998 | Kao |
| 5,803,579 A | 9/1998 | Turnbull et al. |
| 5,895,115 A * | 4/1999 | Parker et al. ............ 362/511 |
| 5,949,346 A | 9/1999 | Suzuki et al. |

FOREIGN PATENT DOCUMENTS

| | | |
|---|---|---|
| EP | 0244230 | 11/1987 |
| EP | 0573235 | 12/1993 |
| EP | 0625793 | 11/1994 |
| EP | 0689000 | 12/1995 |
| GB | 2313973 | 12/1997 |
| JP | 62018775 | 1/1987 |
| JP | 62235787 | 10/1987 |
| JP | 9207664 | 8/1997 |
| WO | 96 38319 | 12/1996 |
| WO | 97 17800 | 5/1997 |

OTHER PUBLICATIONS

Photographs of a CHMSL of a 1996 Chevy Blazer.

Photographs of a CHMSL of a 1996 Chrysler Town & Country.

Yadid–Pecht, Orly et al., "Image Sensors With Individual Pixel Reset," *NASA Tech Briefs*, Nov. 1996 (2 pages).

Yadid–Pecht, Orly et al., "Readout Schemes to Increase Dynamic Ranges of Image Sensors," *NASA Tech Briefs*, Jan. 1997 (2 pages).

Fossum, Eric R., "Low Power Camera–on–a–Chip Using CMOS Active Pixel Sensor Technology," *1995 Symposium on Low Power Electronics*, Oct. 9–10, 1995, San Jose, California (pp. 1–4).

Fossum, Eric R., "Active Pixel Sensors: Are CCD's Dinosaurs?, " *SPIE*, vol. 1900 (pp. 2–14).

Mendis, Sunetra K., "Low–Light–Level Image Sensor With On Chip Signal Processing," *SPIE*, vol. 1952, pp. 23–33.

SAE J578, Surface Vehicle Standard—Color Specification, revised Jun. 1995.

English Translation "LED–Baulement" of 2087 ELEKTRONIC, vol. 44, No. 15, Jul. 25, 1995, p. 134.

J.L. Schnapf et al., "Spectral sensitivity of human cone photoreceptors," NATURE, vol. 325, Jan. 29, 1987, pp. 439–441.

David H. Brainard, COLORIMETRY, XP 002040706, Chapter 26, pp. 26.1–26.53.

* cited by examiner

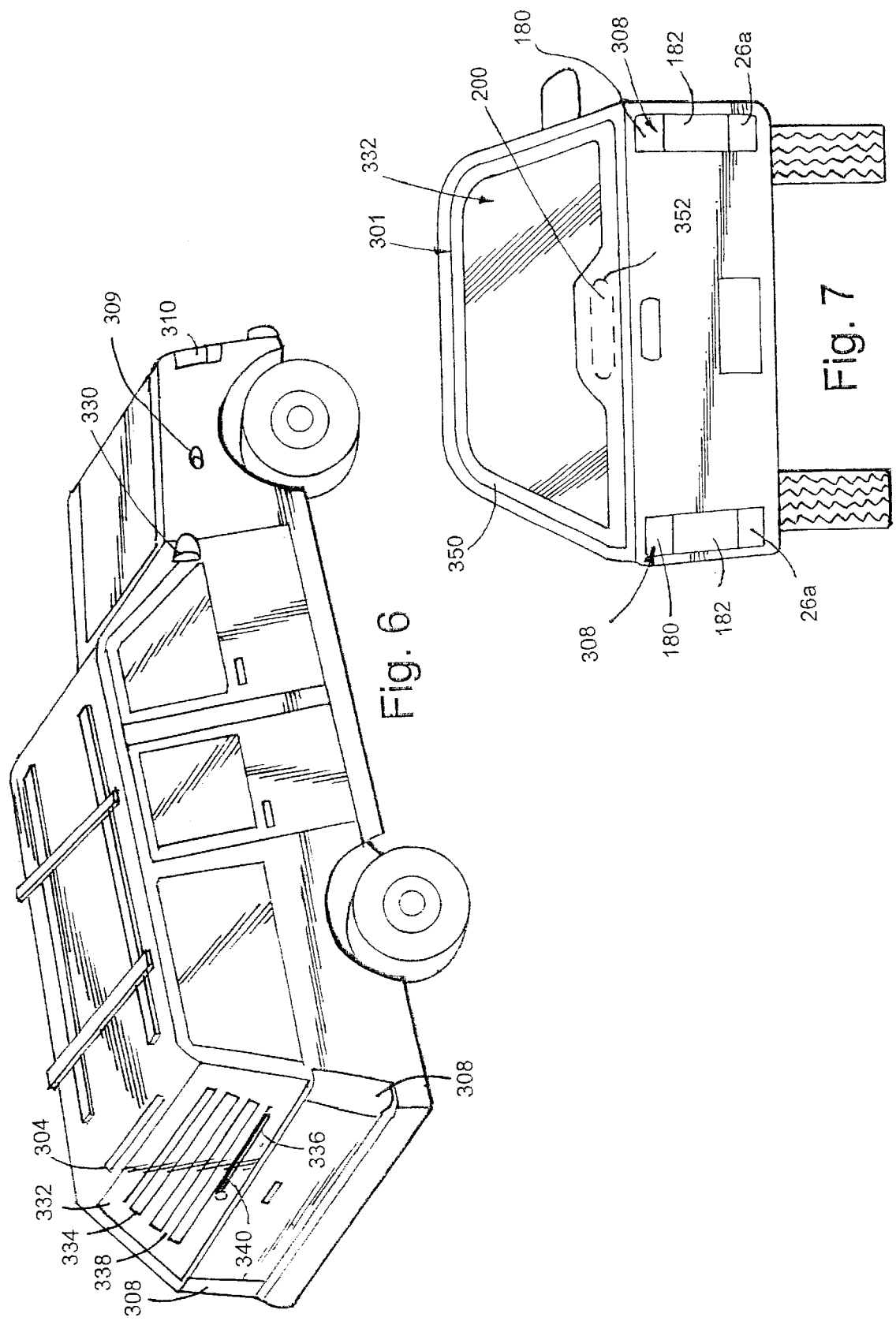

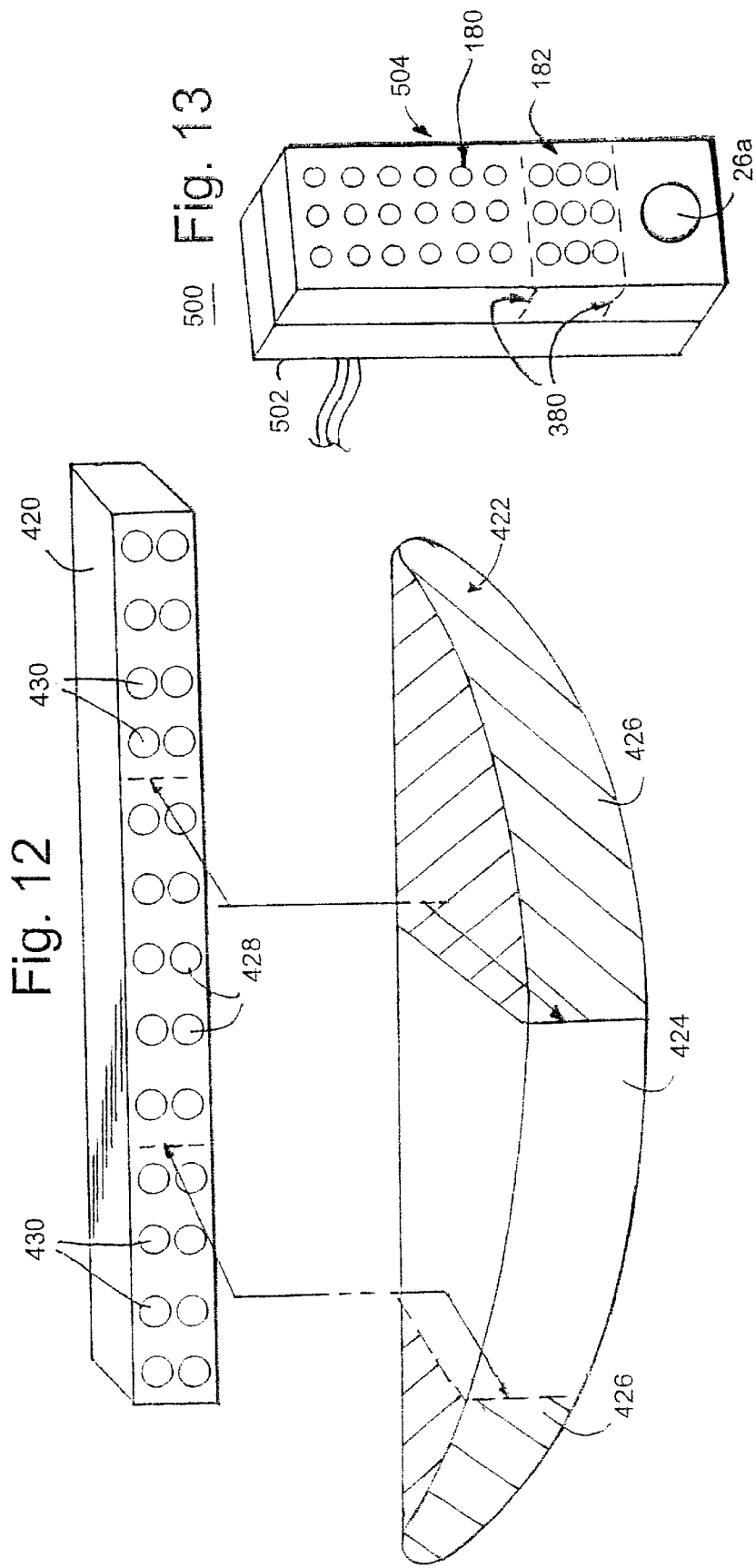

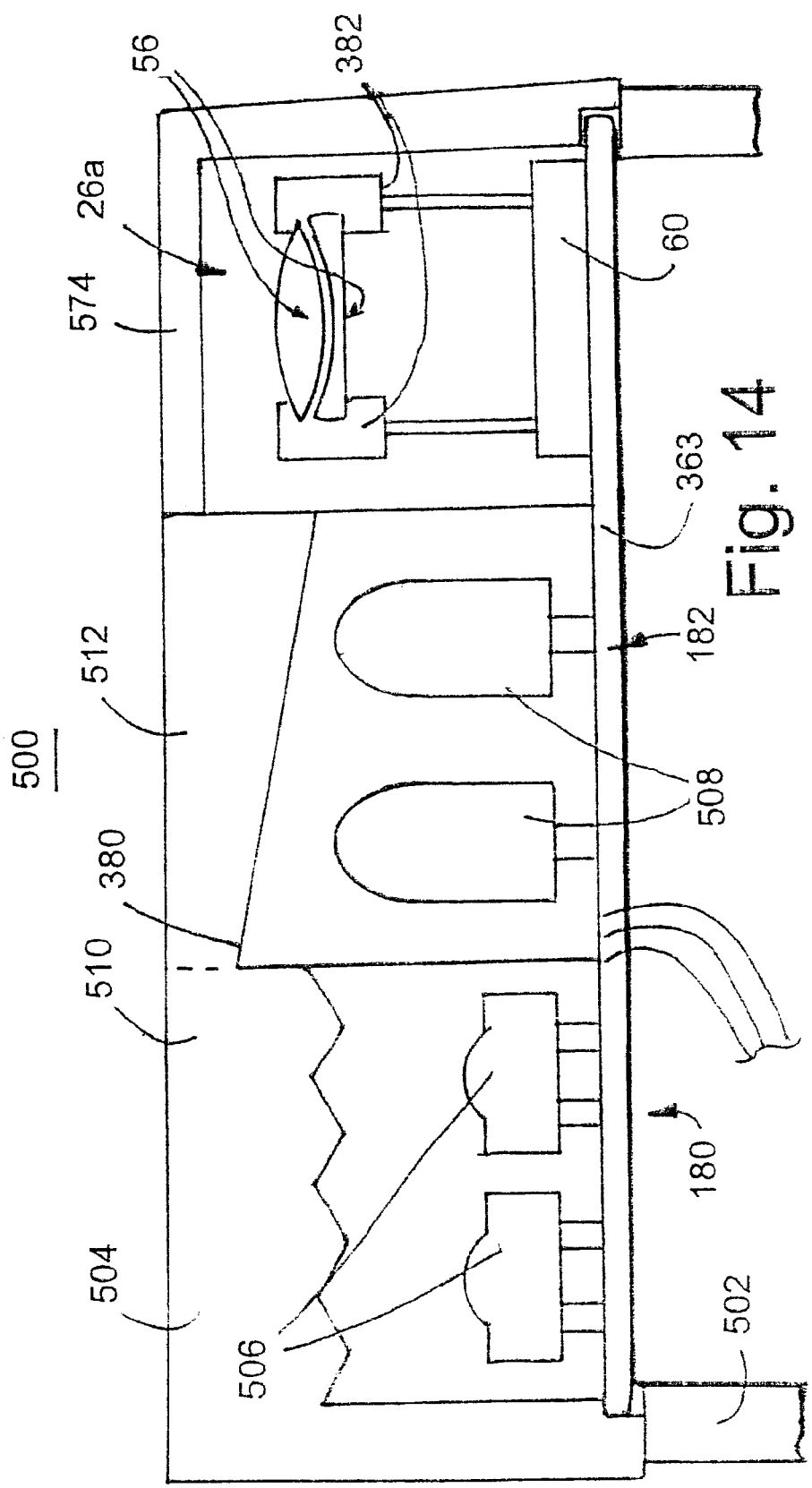

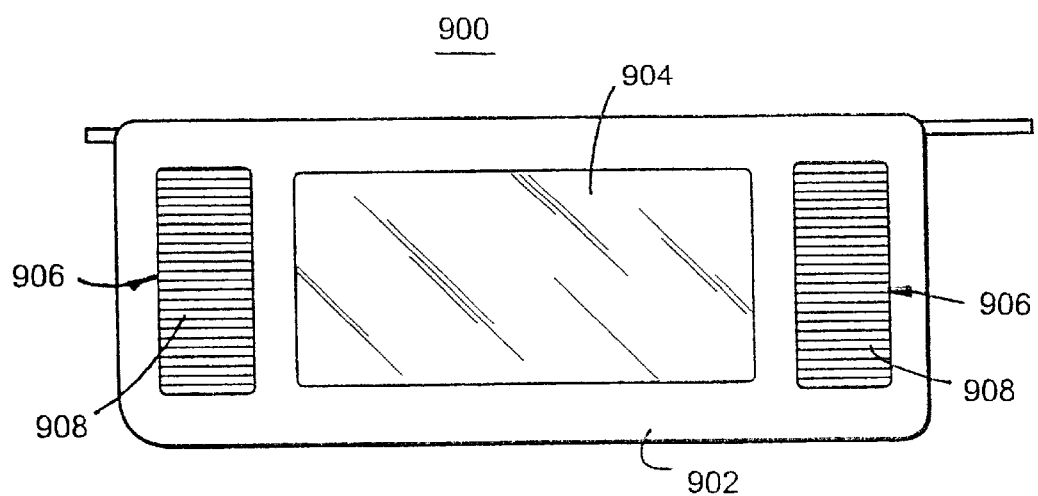
Fig. 25
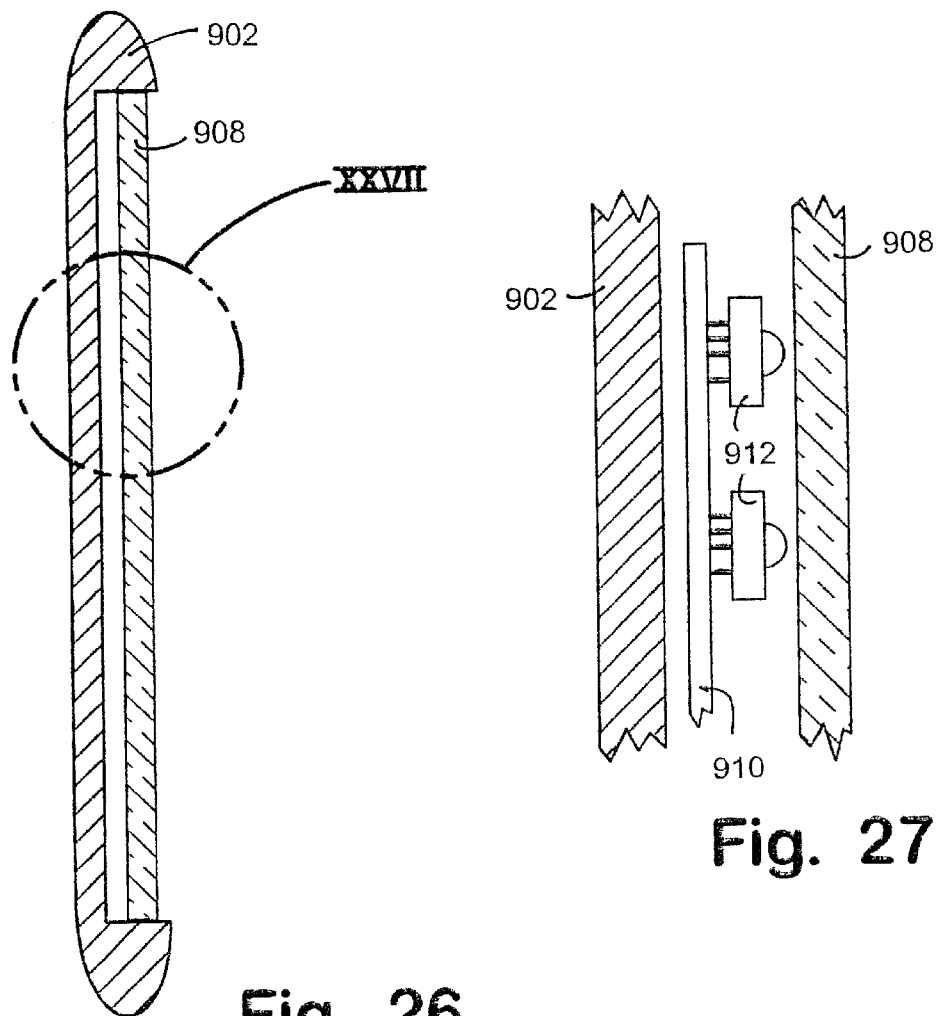
Fig. 26
Fig. 27

SYSTEMS AND COMPONENTS FOR ENHANCING REAR VISION FROM A VEHICLE

CROSS-REFERENCE TO RELATED APPLICATIONS

This application is a continuation-in-part of U.S. patent application Ser. No. 09/148,375, entitled ILLUMINATOR ASSEMBLY INCORPORATING LIGHT EMITTING DIODES, filed on Sep. 4, 1998, by Robert R. Turnbull et al., now U.S. Pat. No. 6,132,072, which is a continuation of U.S. patent application Ser. No. 08/664,055, filed on Jun. 6, 1996, now U.S. Pat. No. 5,803,579, the entire disclosures of which are incorporated herein by reference.

BACKGROUND OF THE INVENTION

The present invention generally relates to systems and devices for enhancing rear vision from a vehicle. More specifically, the present invention relates to vehicle exterior illumination systems, vehicle visual signaling systems, and/or electronic rear vision systems.

Privacy glass has recently become a very popular option for vehicles due to its aesthetic appearance, reduction of solar loading, and due to a belief that the privacy glass provides some deterrence to a carjacker who consequently cannot see who the driver is, who else may be in the vehicle, or whether there may be a dog in the vehicle. The use of privacy glass, however, introduces many safety concerns. Currently, privacy glass is allowed on all vehicle windows, with the exception of the front windshield and the side windows of the driver and front passenger. Typical privacy glass has only 15 to 20 percent transmittance. When such privacy glass is used on the rear window of a vehicle, the driver's vision through the rear window is significantly impaired, particularly at night. Because the back-up lights on a vehicle do not provide sufficient illumination to the rear of the vehicle to counter the effects of the privacy glass, the use of privacy glass significantly increases the risk that a driver will accidentally back into or run over something or someone. Therefore, there exists a need for practical systems and/or devices that enhance a driver's rear vision from within a vehicle having privacy glass.

SUMMARY OF THE INVENTION

Accordingly, it is an aspect of the present invention to solve the above problems by providing a vehicle lamp assembly for providing additional illumination to the rear of a vehicle. An additional aspect of the present invention is to provide a vehicle lamp assembly that is relatively inexpensive and does not require frequent replacement of the light source.

To achieve these and other aspects and advantages, a vehicle lamp assembly constructed in accordance with the present invention comprises a support structure for mounting to the rear of a vehicle, a lens mounted to the support structure, and a plurality of LEDs mounted to the support structure behind the lens. The LEDs are selectively activated in response to an activation signal such that substantially white light is emitted from the lens in a rearward direction from the vehicle.

Another aspect of the present invention is to provide a vehicle lamp assembly that provides supplemental illumination while also emitting colored light that may serve as a signal light, such as a brake light or turn signal light. To achieve this and other aspects and advantages, a vehicle signal lamp assembly according to the present invention comprises a support structure for mounting to a vehicle, a lens mounted to the support structure, a first set of LEDs mounted to the support structure behind the lens, and a second set of LEDs mounted to the support structure behind the lens. The first set of LEDs is activated in response to a first activation signal such that colored light is emitted from the lens. The second set of LEDs is selectively activated in response to a second activation signal such that substantially white light is emitted from the lens.

An additional aspect of the present invention is to provide an electronic imaging system for enabling images to the rear of the vehicle to be captured with a camera and displayed to the driver on a display device. Another aspect of the present invention is to mount the camera of the imaging system to the rear of a vehicle in a location that is relatively covert and aesthetically pleasing, and that is very practical and economical from a manufacturing stand point.

To achieve these and other aspects and advantages, an electronic imaging system according to the present invention comprises a support structure for mounting to the rear of a vehicle, a lens mounted to the support structure, a plurality of LEDs mounted to the support structure behind the lens, and a camera mounted to the support structure behind the lens for capturing images to the rear of the vehicle for display to a vehicle operator. The LEDs are selectively activated in response to an activation signal such that radiation is emitted from the lens in a rearward direction from the vehicle.

Still another aspect of the present invention is to integrate a camera of a vehicle imaging system with an existing vehicle component to thereby enable such cameras to be more easily installed in a vehicle. To achieve this and other aspects and advantages, a modular integrated vehicle rear window assembly according to the present invention comprises a rear window and a camera. The camera may be mounted to an inner surface of the rear window so as to capture an image to the rear of the vehicle through the rear window or the camera may be mounted to a window frame structure in which the rear window is mounted.

Yet another aspect of the present invention is to provide a vehicle imaging system that has an enhanced ability to capture images to the rear of the vehicle whether driving forward down the road or backing up. To achieve this aspect and other aspects and advantages, a vehicle imaging system according to the present invention comprises a camera for capturing an image, a radiation source for emitting radiation to which the camera is sensitive within the field of view of the camera, and a controller coupled to the camera and the radiation source for reading the image captured by the camera at periodic intervals and for periodically activating the radiation source during intervals at which the controller is reading the image from the camera. The radiation source may emit infrared radiation while the vehicle is driving forward down a road, and/or may emit visible light when the vehicle is backing up.

Another aspect of the present invention is to reduce the adverse effects a signal light or illumination light may have on a camera that is mounted proximate to the lights. To achieve this and other aspects and advantages, a lighting and electronic imaging system according to the present invention comprises a light source mounted to the vehicle, a camera mounted to the vehicle for capturing images for display to a vehicle operator, and a controller coupled to the camera and to the light source for reading the image captured by the camera at periodic intervals and for periodically activating the light source during those intervals when the controller is not reading images captured by the camera.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 6 is an oblique perspective view of a vehicle in which the present invention is implemented;

FIG. 7 is a rear perspective view of a vehicle in which a first embodiment of the present invention is implemented;

FIG. 12 is an exploded perspective view of the CHMSL assembly shown in FIG. 11;

FIG. 13 is a perspective view of a light/camera assembly constructed in accordance with a third embodiment of the present invention;

FIG. 14 is a cross-sectional view of the light/camera assembly shown in FIG. 13;

FIG. 25 is a perspective view of a sun visor constructed in accordance with another embodiment of the present invention;

FIG. 26 is a cross-sectional view of the sun visor shown in FIG. 25 taken along line XXV—XXV;

FIG. 27 is an enlarged view of the cross section shown in FIG. 26;

DETAILED DESCRIPTION OF THE PREFERRED EMBODIMENTS

Figure 1:
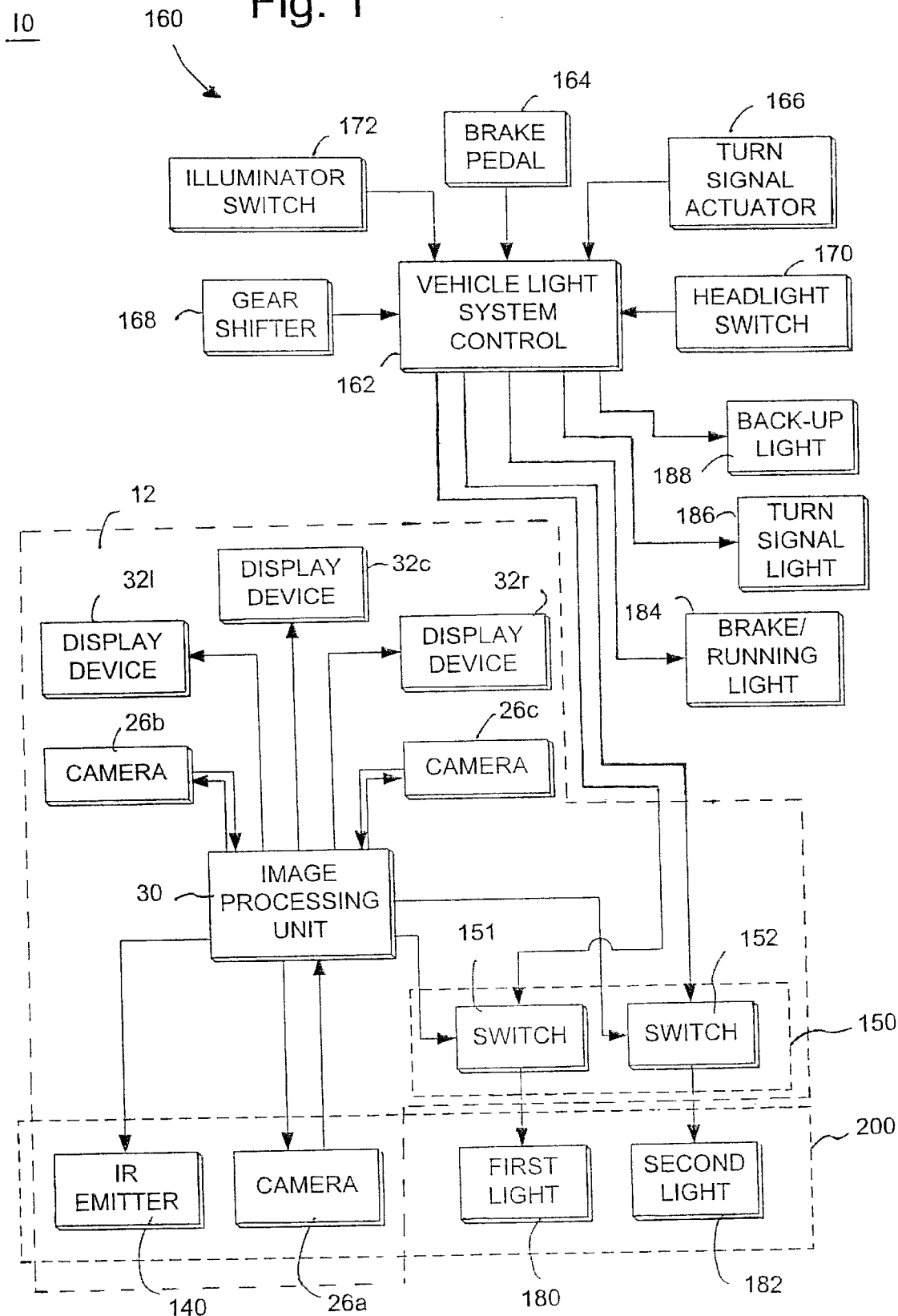
FIG. 1 is an electrical circuit diagram in block form illustrating the system constructed in accordance with the present invention.

FIG. 1 shows a system diagram illustrating the various components constituting the system 10 of the present invention. As illustrated, system 10 includes an electronic imaging subsystem 12. Imaging subsystem 12 includes at least one camera 26a, 26b, and/or 26c; at least one display device 32a, 32b, and/or 32c; and an image processing unit 30. Imaging subsystem 12 may also include an ambient light sensor 34, a direct glare sensor 36, a manual intensity adjustment mechanism 116, and/or an infrared (IR) emitter 140.

System 10 further includes a first light 180 and optionally a second light 182 housed in the same assembly 200 as camera 26a. IR emitter 140 may also be housed in the same integral assembly 200. As described in further detail below, first light 180 may be a signal light such as a brake light, and second light 182 may also be a signal light or an illumination light such as a cargo light for a pick-up truck or a rear illumination light. If, for example, light 180 is the brake light for a CHMSL, assembly 200 may take the form of a CHMSL assembly having an integrated camera 26a and CHMSL brake light. Alternatively, assembly 200 could take the form of a tail light assembly in which light source 180 is a running/brake light. The various physical embodiments of integral assembly 200 are described below following the detailed description of imaging subsystem 12.

As will also be described in more detail below, system 12 preferably includes a switching interface circuit 150 including switches 151 and 152 for controlling the application of activation signals to each of the lights 180 and 182 that are mounted in a common assembly 200 with camera 26a. Switches 151 and 152 are controlled by image processing unit 30 in the manner described below to reduce feedback glare from the light emitted from lights 180 and 182 during operation of camera 26a.

The activation signals applied to lights 180 and 182 may be those applied from a conventional vehicle light system 160. Conventional vehicle light systems typically include some form of vehicle light system control 162 that receives inputs from, for example, a brake pedal 164, a turn signal actuator 166, a gear shifter 168, a head light switch 170, and/or an illuminator switch 172. Vehicle light system control 162 utilizes these inputs to provide power or activation signals to the various signal lights (identified generally as block 184) including the brake lights, turn signal lights, and back-up lights, as well as to the various interior and exterior illuminator lights of the vehicle (identified generally as block 186), such as the head lights and running lights, interior dome and map lamps, and exterior illumination lamps (i.e., cargo and puddle lamps). In its simplest form, vehicle light system control 162 may merely include a plurality of switches for turning the lights on and off.

Imaging Subsystem

Figure 2:
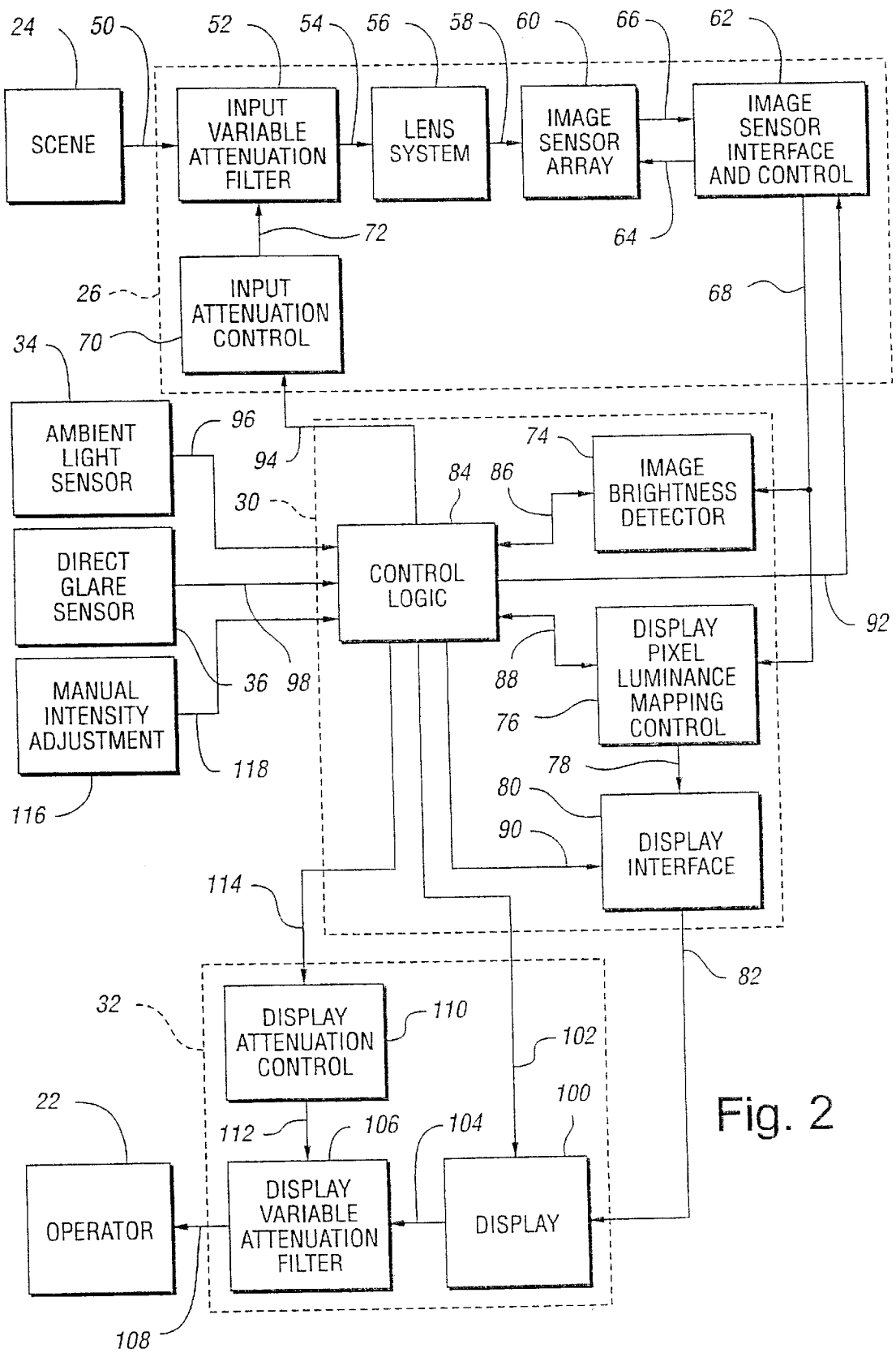
FIG. 2 is an electrical circuit diagram in block form illustrating an electronic vehicle vision subsystem that may be used in the system of the present invention.

Referring to FIG. 2, a preferred imaging subsystem 12 is shown, which is disclosed in detail in commonly-assigned U.S. patent application Ser. No. 09/001,855, entitled VEHICLE VISION SYSTEM, filed on Dec. 31, 1997, by Jon H. Bechtel et al. As shown, a camera system 26 accepts image rays 50 from scene 24. Image rays 50 pass through optional input variable attenuation filter 52 emerging as attenuated image rays 54. Rays 50 or 54 are focused by lens system 56 to become focused rays 58. An image sensor array 60 is placed in the focal plane of lens system 56. The image sensor array is comprised of individual pixel sensors, ideally arranged in rows and columns. An image sensor interface and control unit 62 provides control signals 64 to image sensor array 60 and receives electrical signals 66 corresponding to scene 24 from image sensor array 60. Image sensor interface arid control 62 may operate on signals 66, preferably including digitizing the signals prior to forwarding the camera system output signals 68. If optional lens attenuating filter 52 is used, the amount of attenuation is controlled by lens attenuation control 70 through lens attenuation filter signal 72.

In a preferred embodiment, camera system 26 is designed to handle a large dynamic range. A significant improvement over prior systems is the ability of camera system 26 to capture and transmit detail in scene 24 that has previously been obscured due to low illumination levels or due to glare from lights, such as headlamps.

One limitation on the dynamic range of camera system output is due to the pixel sensors in the image sensor array. The preferred embodiment uses complementary metal-oxide semiconductor/metal-on-silicon (CMOS) photogate active pixel sensor (APS) cells. The photogate in each cell is used to integrate charge developed from incident light. A storage site is capable of holding the integrated charge. The storage site can be reset to a reference level indicative of pixel sensor noise. A selectable buffer circuit outputs a signal proportional to the integrated charge or reference value at the storage site. By subtracting the reference noise signal from the integrated charge signal, a significant effect of the noise can be eliminated, increasing pixel sensor sensitivity.

Another limitation on the dynamic range of camera systems has been the restriction on the length of time for integrating charge produced by incident light. Current systems limit the integration time to slightly less than the frame time. Since it is desirable to display scene 24 as near real time, a high frame rate of preferably not less than 30 frames per second is required. Traditionally, this has resulted in integration times of no greater than 33 msecs.

An optical sensor combining image sensor array 60 and image sensor interface and control 62 with a wide dynamic range is described in commonly assigned U.S. patent application Ser. No. 6,008,486 entitled WIDE DYNAMIC RANGE OPTICAL SENSOR, filed on Dec. 31, 1997, by Joseph S. Stam et al., the disclosure of which is incorporated herein by reference. One method described implements a double integration architecture by using storage in each pixel cell to hold the charge integrated from the previous frame period while integrating charge for the current frame period. By summing the signals representing charge integrated during the current and previous frame periods, a signal is produced that has an effective integration time of twice the frame period.

A second method described by Stam et al. uses an interlacing architecture to read a subset of pixel sensors each frame period. Those pixel sensors not read in a given frame period continue to integrate light-induced charge. By reading each pixel sensor at a period that is a multiple of the frame time, an effective integration time greater than the frame time is achieved. Values representing pixel cells not read in a given frame period may be interpolated from neighboring pixel cells that are read.

A third method described by Stam et al. uses a dual integration architecture to provide two integration signals. A first signal is generated by integrating charge over a relatively long period. This charge is stored in the pixel sensor cell. A second signal is generated by integrating charge over a relatively short period. If a signal corresponding to the long integration period is less than a threshold, the long integration signal is used as the output. If the long integration signal is not less than a threshold, the short integration signal is used. This provides an output signal with greater resolution at low light levels while still covering a wide range of brightness.

A fourth method described by Stam et al. uses individual pixel resets to extend the effective dynamic range. In this method, individual or groups of pixel sensors can be reset during the integration time, thereby providing a shorter integration period. Areas of the image of scene 24 that are dimly lit receive longer integration periods than areas that are brightly lit. Using this technique, the bright headlamps of a trailing vehicle in scene 24 are locally sensed at a much lower sensitivity so that saturation in the corresponding portion of the image is reduced or eliminated while still sensing the remainder of scene 24 with sufficient sensitivity. This allows viewing of detail which has heretofore been obscured by bright headlamps. Since there are frequently only two headlamps causing most of the glare in the field of the view of scene 24, and since the image of each headlamp projects a small sized area typically striking at most a two-by-two pixel sensor area, the capability to position as few as two reduced integration time windows of standard size, such as, for example, three-by-three pixel sensors, can yield considerable benefit in control of brightness in the image of scene 24.

The four methods described in Stam et al. can be implemented in the same optical sensor. Control inputs determine which methods are in use, the integration times, and the reset times.

To accommodate wide inter-scene variations in lighting conditions, variable attenuation filter 52 may be used. Input attenuation filter 52 may be implemented with an electrochromic window. The window transitions from substantially clear to maximum attenuation based on attenuation filter signal 72. The steady state attenuation is a reasonably stable and reproducible function of voltage so that, having experimentally determined the relationship between voltage and light attenuation, a controller may be used to set the amount of attenuation. This allows camera system 26 to employ a highly sensitive image sensor array 60 without excessive saturation in bright daylight.

While highly sensitive sensors are desirable because of their sensitivity in low light levels, which approaches the sensitivity of night vision systems, it has been discovered that such sensors are significantly adversely affected by glare from lights on the vehicle that are in close proximity to the camera's optics, particularly at night. Such external lights include tail lights, brake lights, CHMSLs, back-up lights, and turn signal lights. Therefore, it is an aspect of the present invention to provide a mechanism whereby the imaging subsystem may interact with the vehicle lighting system.

The electronic imaging system described above is capable of capturing useful images in very dark conditions, such as those experienced on a moonless night. The light sources in lights 180–182 are preferably arrays of light emitting diodes (LEDs). LEDs have the unique property of very rapid turn-on/turn-off times, unlike incandescent lamps, which require a significant fraction of a second to reach full brightness. Therefore, it is possible to rapidly pulse the LEDs on and off several times a second. The human eye is not capable of detecting flashes at rates greater than about 60 times per second. Consequently, if LEDs are pulsed on and off at a rate of 60 Hz or greater, the human eye will perceive the LEDs as being on continuously. The same averaging effect of the human eye allows discrete frame motion video to appear as continuous motion. A frame rate of 30 frames per second allows video, which is generally accepted as continuous at a frame rate of 60 frames per second, to have superb quality. Interlacing at 60 fields per second (of 30 full frames per second) is standard in NTSC television broadcasts.

Figure 3:
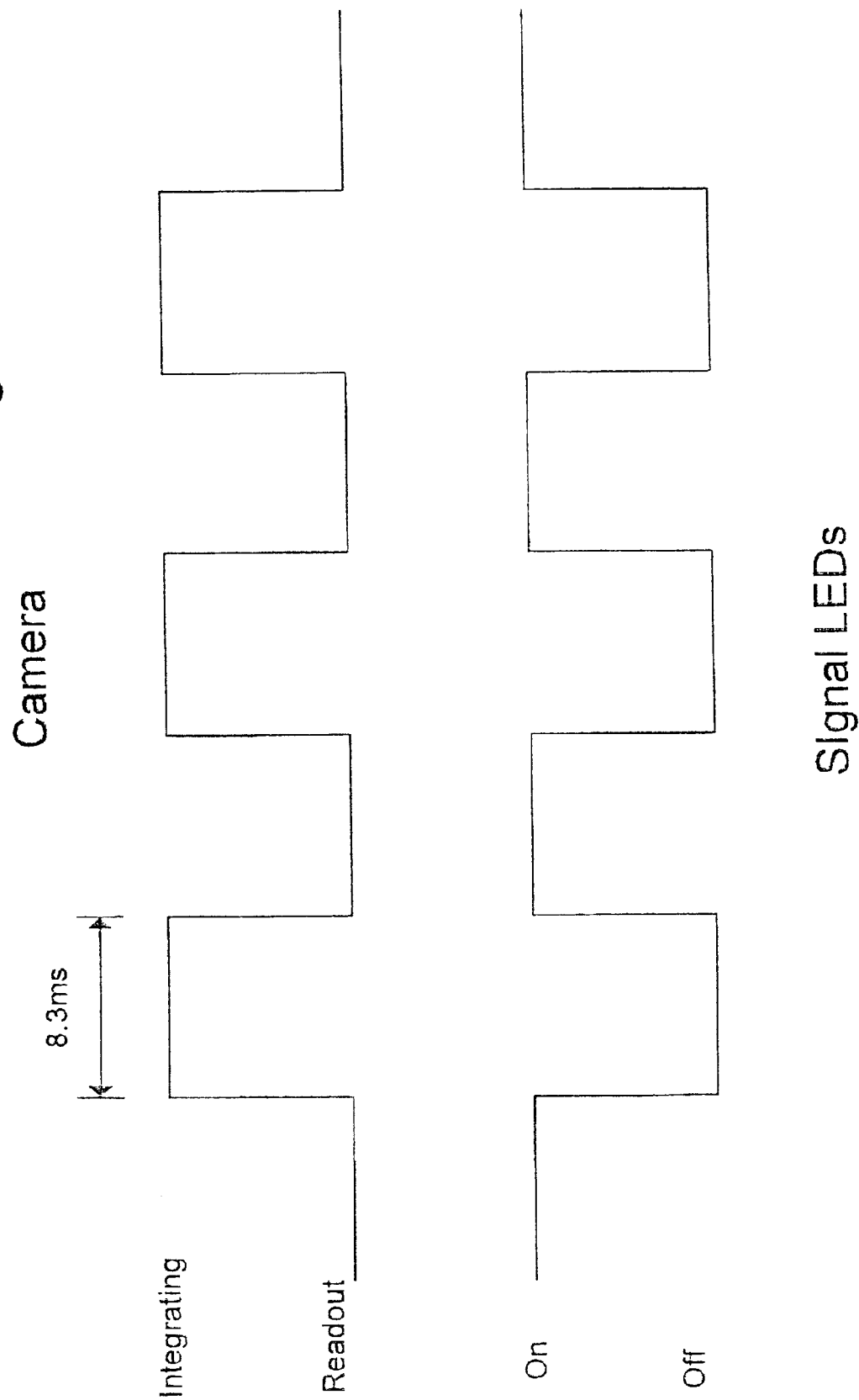
FIG. 3 is a timing diagram illustrating the relation between the reading of images from a sensor array and the on/off state of a proximate light source.

Using these two concepts, it is now possible to construct an integrated assembly 200 including at least one light 180–182 and a camera 26a, where the camera does not experience feedback glare from integrated lights. This is done by alternatively capturing frames with the imaging system and pulsing the LEDs of the integrated lights on and off. The LEDs are pulsed between frame integration periods. For example, if 60 frames per second video is desired, camera 26a can acquire with the LEDs off for 8.3 msec. This is followed by an 8.3 msec period, where camera 26a is not acquiring and the LEDs are turned on. Such a system may be implemented by driving switches 151 and 152 such that the on-phase of the illuminators 180 and 182 are synchronized with the integration period of the image sensor array 60 as indicated in FIG. 3.

The ability of camera 26a to capture useful images at low light levels depends directly on the integration time of image sensor array 60. The longer the image sensor is able to integrate light, the better able the camera is to produce images with resolvable detail in reduced light conditions. While the 8.3 msec frame period mentioned above should be suitable for daylight image capture, it is probable that a longer integration period will be required at night. As stated, the 8.3 msec frame period refers to both the integration and readout time periods. The readout time is typically limited by the rate of A/D conversion in a digital camera system or the scan rate in an analog system. This means the actual integration time could be much less than 8.3 msec. However, the CMOS photogate active pixel architecture used in the imaging subsystem described above, allows the entire 8.3 msec to be used for integration and the readout to occur during the period when the LEDs are on. This is accomplished by integrating for 8.3 msec and then transferring the charge from the photosite into each pixels' floating diffusion. The charge transfer can occur simultaneously for all pixels or rapidly row by row. Finally, during the next 8.3 msec period, the signal is read out of the floating diffusion.

If additional integration time is needed, the frame adding technique described in detail in the above-cited U.S. patent application Ser. No. 6,008,486, can be used to combine two 8.3 msec integration periods into one frame. This is done by storing the charge from one frame in the floating diffusion while the next frame is being acquired. The charge from both frames is added together to give a greater signal. Finally, the pulse frequency of the LED/camera cycle can be reduced to give greater integration times. However, this comes at the disadvantage of increased flicker of the integrated light with decreased pulse frequency.

The determination of the required integration times and duty cycles can be made by image processing unit 30, which evaluates the average brightness of each image. The image processing unit provides the signal to turn the LEDs on and off and initiates the image acquisition process. Image processing unit 30 is described below and is described more completely in the above-cited U.S. patent application Ser. No. 09/001,855, which also contains a circuit to provide rapid evaluation of the brightness of an image.

In addition to signal lights, binary complementary white LED illumination may be provided to further assist the driver in backing up or as cargo lighting in a pick-up truck. In this case, it is assumed that this light is not needed by the image subsystem for satisfactory imaging, but instead is intended to provide illumination to assist the driver. As described further below, such driver assistance illuminators are particularly advantageous when the vehicle is equipped with privacy glass. To avoid glare from this light, the binary complementary white LEDs can be pulsed on and off in the same fashion as the signal LEDs.

Although the above description describes the use of a CMOS photogate active pixel sensor for image sensor array 60, other imaging technologies can be used. For example, a frame transfer CCD (charge coupled device) would allow the integration of light during a period where the LEDs are off and the readout while the LEDs are on. Other CMOS imaging technologies including photodiode active pixel sensors, passive pixel sensors, and PIN photodiode pixel sensors could also be used. CIDs (charge injection devices), BCMDs (bulk charge modulated devices), and any other imaging technology may be used with various degrees of performance.

A second method of eliminating the glare from the integrated signal lights involves filtering out the light emitted from those lights. This method is appropriate for any type of electronic imaging technology. LEDs typically have a relatively narrow spectral band in which they emit the majority of their light energy. The light emitted from an LED is distributed in an approximately normal distribution with a standard deviation of approximately about 10 nm. As a result, a relatively narrow band notch interference filter can prevent the majority of light from an LED from entering the camera's optical system, while not significantly reducing the total light reaching the camera across the spectrum in the region where the camera is sensitive.

In the preferred embodiment, a narrow band reflecting interference filter 385 (FIG. 9) is placed in the optical path of camera 26a. The filter is designed to have maximum reflection at the peak emission wavelength of the LEDs used in the integrated signal lights. The filter is also designed to transmit light of wavelengths shorter and longer than those that are substantially emitted by the LED. Therefore, the camera is effectively blind to the specific wavelengths of light emitted by the LED while being able to image the majority of the spectrum. The filter can be placed in front of the lens, integral with the lens, or behind the lens in front of the image sensor.

The final embodiment to prevent light from the integrated signal lights from interfering with the electronic imaging subsystem is to provide a baffling means to block light from outside the camera's desired field of a view from entering the imaging system. This can be accomplished by placing a black shroud or baffling means around the lens extending beyond the integrated lights in the manner described in more detail below with reference to FIGS. 8 and 9.

For some imaging systems, it may be necessary to provide supplementary illumination during dark conditions to achieve satisfactory imaging. This is particularly true when the camera is positioned behind privacy glass. In this case, a variety of LED illuminators can be used to provide such illumination. IR LEDs have the advantage of providing light which is detectable by silicon imaging technologies while not being visible to the human eye. Therefore, if IR supplementary illumination is used, IR emitter 140 can be on whenever camera 26a is operating without becoming distracting to other drivers. LEDs of between 780 and 800 nm peak wavelength are preferred, since they are not visible to humans but are near enough to the visible spectrum to not be severely aberrated by an optical system designed for visible wavelengths. Various visible illuminators can also be used, including binary complementary white light illumination.

The alternating pulse system described above provides a mechanism for achieving a greater output from an illumination LED. It is well known that LEDs can be operated at substantially higher powers if pulsed than if operated continuously. Since the image system is only integrating during pulsed cycles, it is advantageous to only operate the supplementary illumination LEDs when the camera is integrating. This pulsed operation allows higher currents to be used in higher output levels from the LEDs thereby reducing the number of LEDs needed in the application.

The disadvantage of providing supplemental illumination for the rear vision system incorporated in the same assemblies as the camera assembly is the potential glare back into the camera lens as described for integrated signal lights. This is overcome using a baffling means similar to that shown in FIGS. 8 and 9 to baffle light from the integrated signal lights. Alternatively, the supplementary illumination could be provided in a separate location from the integrated signal light/camera assembly. Another possibility would place the lights and supplementary illuminator in one package and the camera in a different location. In any case, the three devices are preferably controlled from a central source, such as image processor unit 30, which coordinates the timing of the signal lights, driver assistance illuminators, supplementary imaging system illuminator, and camera.

Image processor unit 30 includes an image brightness detector 74 and a display pixel luminance mapping control 76, both of which receive the camera system output 68. Image brightness detector 74 may determine the brightness level of the entire image and may determine brightness levels of regions within the image. Display pixel luminance mapping control 76 may compress the wide dynamic range of camera system output 68 to one which is comfortably viewable by operator 22. Display pixel luminance mapping control 76 may also increase the visibility of scene 24 while limiting higher light levels, which are detrimental to the night vision of operator 22. Display luminance signal 78 is processed by display interface 80 to produce display signal 82 for display device 32a. Control logic 84 is in communication with image brightness detector 74 through bus 86, display pixel luminance mapping control 76 through bus 88, display interface 80 through bus 90, image sensor interface and control 62 using image sensor control signal 92, input attenuation control 70 using input attenuation control signal 94, and other elements as are described in above-cited U.S. patent application Ser. No. 09/001,855.

Display device 32 includes a display interface 80 that feeds a display signal 82 to display 100. Display rays 104 generated by display 100, pass through optional display variable attenuation filter 106 and emerge as filtered display rays 108. Filtered display rays 108 representing scene 24 are viewed by operator 22. If optional display attenuation filter 106 is used, the amount of attenuation is controlled by display attenuation control 110 through display attenuation filter signal 112.

Display 100 may be implemented with a number of different technologies, including cathode ray tubes (CRT), field emission displays, back lit liquid crystal displays (LCD), and heads-up display (HUD). Many displays do not have the brightness range necessary to cover a good dynamic range within one frame in addition to a very large total brightness range for use in ambient light conditions, which range from darkness to bright sunlight. To reduce requirements on display 100, a display variable attenuation filter 106 may be used. In the preferred embodiment, attenuation filter 106 is implemented with an electrochromic window. The attenuation filter is controlled by image processor system 30 through display attenuation control signal 114. A method for controlling filter 106 is described in more detail in the above-cited U.S. patent application Ser. No. 09/001,855.

Physical Implementations

Figure 4:
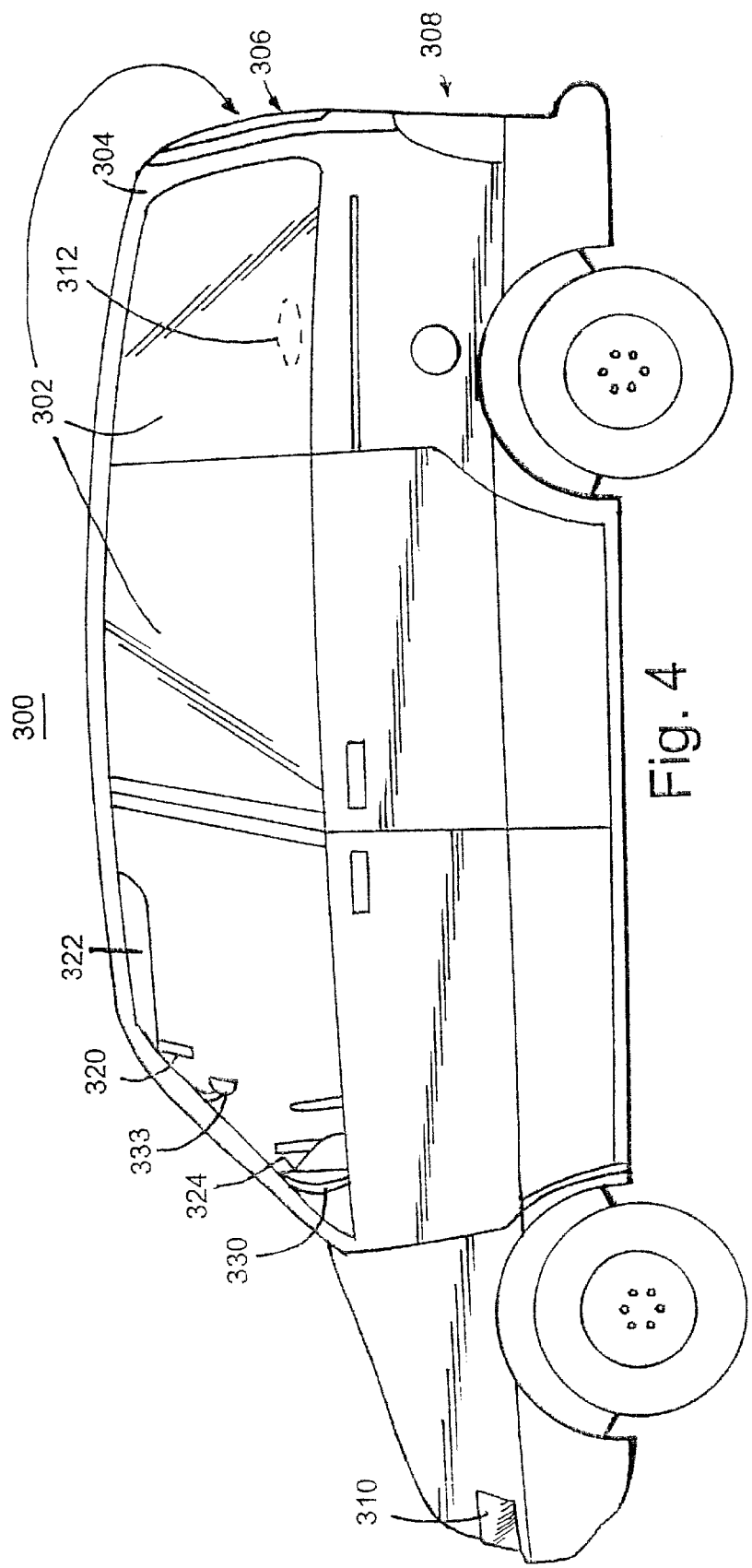
FIG. 4 is a side perspective view of a vehicle in which the present invention is implemented.

Having generally described the present invention on a system level, the physical implementation of the system and various components will now be described. FIG. 4 shows a side view of a vehicle 300 having side and rear windows 302 that may be made of privacy glass. If assembly 200 (FIG. 1) is constructed as a CHMSL, assembly 200 may be mounted in any central location on the rear of vehicle where CHMSLs are commonly mounted. For example, assembly 200 may be mounted in a central location 304 on the roof of a vehicle above the rear window. Alternatively, assembly 200 may be mounted behind the rear window as indicated by reference 306. For vehicles having a trunk, assembly 200 may be mounted to the trunk lid (not shown).

If the light integrated in assembly 200 with camera 26a is not a CHMSL but is a turn signal light, running light, back-up light, or brake light, assembly 200 may be mounted in one or both tail light assemblies 306. Additional cameras 26b and 26c may be mounted in assemblies 200 that are located within the front head light/turn signal light assemblies 310. Such additional cameras may be mounted to capture images forward of the vehicle, perpendicular to the direction of travel of the vehicle to improve vision at blind intersections, or to the side and rear of the vehicle. Additional side cameras 26b and 26c may also be mounted behind the vehicle's side windows in location 312, for example.

As will be explained in further detail below with reference to FIGS. 15–20, one or more display devices 32 may be mounted in various locations within the view of the vehicle operator. For example, a display device 32 may be mounted in an overhead console 322 of the vehicle and/or may be mounted to support 324 on an instrument panel 320. Alternatively or additionally, display device 32 may be provided in interior rearview mirror 333 or in one or both of the exterior rearview mirrors 330.

Figure 5:
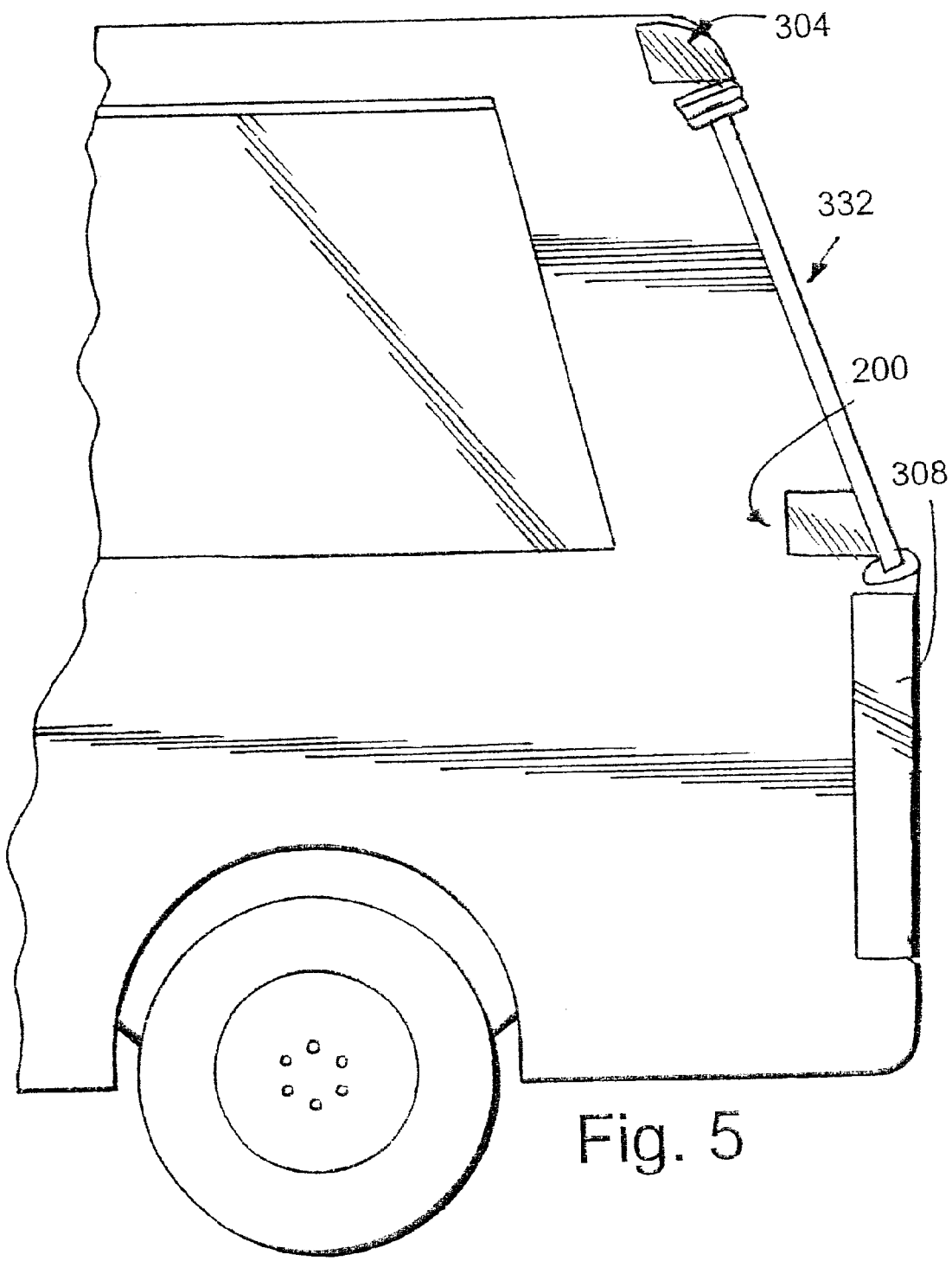
FIG. 5 is a partial side perspective view of the vehicle shown in FIG. 4 taken in partial cross section.

FIG. 5 shows an enlarged partial section of vehicle 300 of FIG. 4 in which assembly 200 is mounted to the interior surface of rear window 332. As shown in FIG. 6, rear window 332 may include an integral defroster 334 that defines a defroster zone of rear window 332. Window 332 may also have a windshield wiper 336 mounted thereto or in proximity thereto for wiping dirt, snow, or other debris from a wiper zone 338 on the outer surface of rear window 332. Also, a washer fluid nozzle 340 may be mounted to windshield wiper 336 or to the body of vehicle 300 in proximity to rear window 332 so as to dispense washer fluid in a washer zone on the outer surface of rear window 332.

As shown in FIG. 7, assembly 200 is mounted in a central location in the lower portion of rear window 332. Preferably, assembly 200 is mounted behind at least one of the washer zone, wiper zone 338, or defroster zone, such that a camera 26a mounted in assembly 200 will have as clear a view as possible through rear window 332. If rear window 332 includes a frit 350, which is a black or opaque coating or film forming a band around the periphery of rear window 332, assembly 200 may be covertly mounted behind a masked-out portion 352 in frit 350. The masked-out portion 352 is a substantially transparent region of window 332 bounded by frit 350. The portion of the rear window 332 that corresponds to masked-out portion 352, may be completely clear or tinted regardless of whether the rest of window 332 is clear or tinted.

Figure 8:
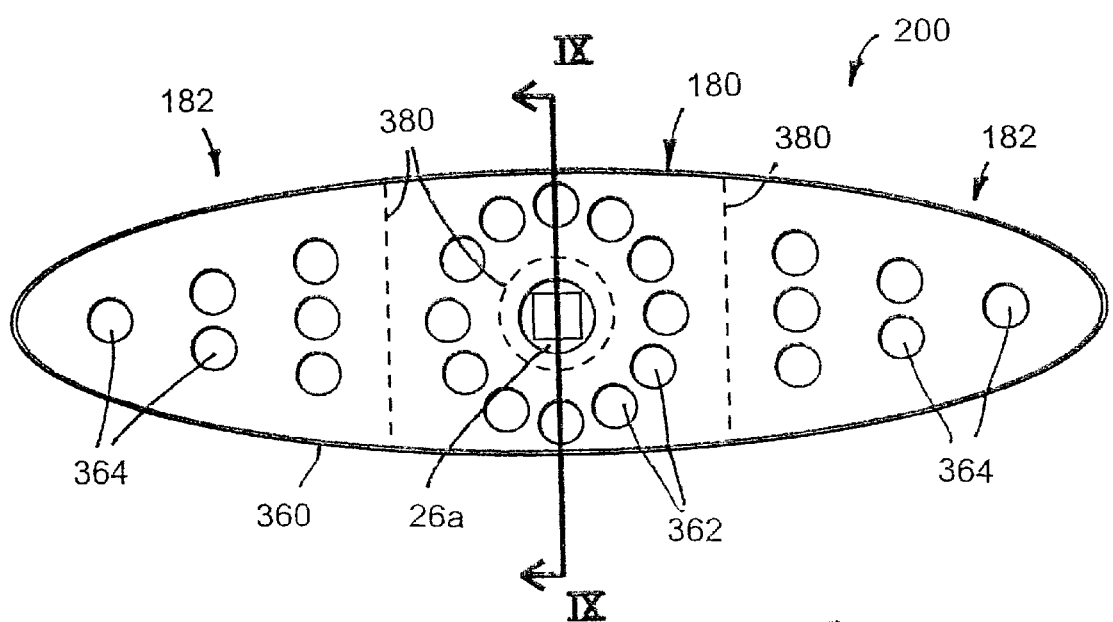
FIG. 8 is a front perspective view of a light/camera assembly constructed in accordance with a first embodiment of the present invention.
Figure 9:
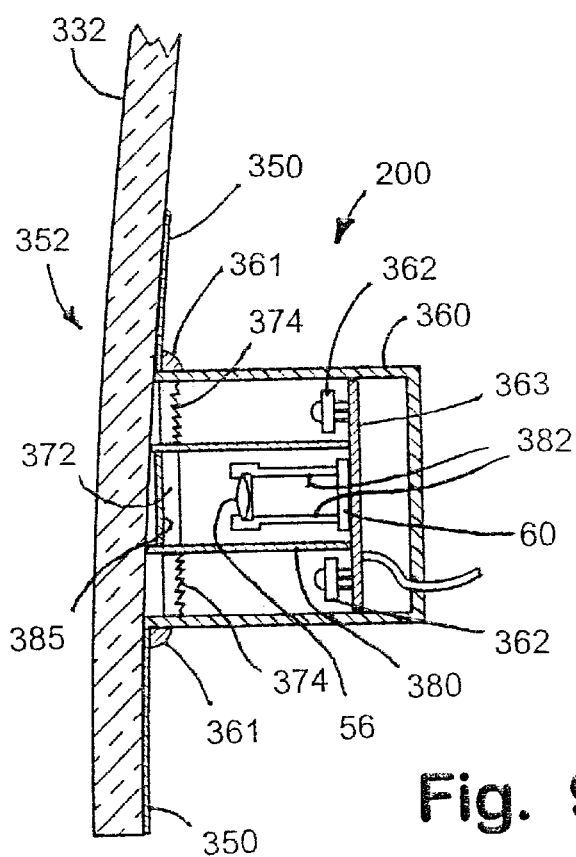
FIG. 9 is a side cross-sectional view of the light/camera assembly shown in FIG. 8 as applied to a vehicle window.

FIGS. 8 and 9 show an exemplary construction of an assembly 200 that may be mounted to the inside surface of rear window 332. Assembly 200 includes a support structure 360 that together with a lens 370 constitutes a housing. To improve the aesthetic appearance of assembly 200 as seen through rear window 332, at least the inner surfaces of support structure 360 are painted black or some other dark color. As shown in FIG. 9, support structure 360 may be mounted within a masked-out region 352 in frit 350 using a dark colored adhesive and/or caulk 361 to prevent light from exiting through any gaps formed between support structure 360 and the interior surface of rear window 332.

As shown in FIG. 8, first light 180 includes a central array of first LEDs 362, and second light 182 includes two arrays of second LEDs 364 each positioned on opposite sides of first light 180. Camera 26a is mounted in the center of the array of first LEDs 362 forming first light 180. To prevent stray light from lights 180 and 182 from causing feedback glare through the camera optics, baffles 380 are provided between the first and second arrays of LEDs 362 and 364 and between camera 26a and first array of LEDs 362. Baffles 380 are preferably formed of an opaque material and extend through and outward from lens 370.

Referring back to FIG. 9, LEDs 362 (as well as LEDs 364) are mounted to a printed circuit board 363 that is mounted within support structure 360. Camera 26a is also preferably mounted to circuit board 363. Specifically, image sensor array 60 is mounted on circuit board 363 with the camera lens system 56 supported a distance away from board 363 by lens supports 382. With this construction, baffles 380 should extend to circuit board 363.

Lens 370 is preferably formed with four separate zones corresponding to the two arrays of LEDs 364 of second light 182, the array of LEDs 362 of first light 180, and camera 26a. Lens zone 372 overlies camera 26a and is generally a flat transparent structure so as to not distort the image captured by camera 26a. Lens zone 374 overlies the array of LEDs 362 of first light 180 and preferably has a roughened surface to diffuse the light emitted from LEDs 362. For example, lens zone 374 could be configured as a corner cube diffuser. The lens zone overlying the two arrays of LEDs 364 of second light 182 may be configured as a Fresnel lens or in any other manner so as to project illumination as fully as possible within the field view of camera 26a. For reasons stated above, a bandpass notch filter 385 may be applied as a coating or film to a surface of lens 370 in lens zone 372 so as to filter out light having wavelengths similar to that emitted from LEDs 362 and/or LEDs 364.

By making all the components black with the exception of the lens, camera lens, and LEDs, assembly 200 may be covertly hidden behind rear window 332. Preferably, the portion of rear window 332 corresponding to masked-out portion 352 of frit 350 is tinted privacy glass to further hide assembly 200. In this manner, no one would be able to notice the presence of the camera and would only notice the presence of the assembly when one of the lights is illuminated. This offers a safety advantage that it is much less likely that bright sunlight could cause the brake lights or CHMSL to erroneously appear as though it were on. In addition, camera 26a could be used for security purposes as well as rear vision.

The assembly may further be made more covert by employing a metallic or interferential bandpass filter to rear window 332 or by mounting an active element such as an electrochromic element to the window that can be made transparent when the camera or lights are activated and may be darkened at all other times. For example, the electrochromic element could be maintained in a normally darkened state, and could be controlled to clear in response to the application of the vehicle's brakes and to return to the normally darkened state when the brakes are no longer applied. Because the electrochromic element does not clear instantaneously, the LEDs constituting the brake light may be controlled to initially emit light at a greater intensity to compensate for the lack of immediate clarity of the electrochromic element. Once the electrochromic element has fully cleared, which only takes less than a half of a second, the intensity of the LEDs may be correspondingly reduced. Examples of electrochromic elements that can be used for this purpose are disclosed in U.S. Pat. No. 4,902,108 and in U.S. patent application Ser. No. 08/832,596, entitled AN IMPROVED ELECTROCHROMIC MEDIUM CAPABLE OF PRODUCING A PRE-SELECTED COLOR, by Kelvin Baumann et al., the disclosures of which are incorporated herein by reference.

With assembly 200 mounted in the location shown in FIG. 7, first light 180 preferably functions a CHMSL, and thus, LEDs 362 are preferably red or red-orange and are activated when vehicle light system control 162 issues a brake signal. As described above, the brake signal applied to LEDs 362 may be pulsed by application of a signal to a corresponding switch 151 (FIG. 1) by image processing unit 30. Second light 182 may function as any form of signal or illumination light. Preferably, second light 182 functions as IR emitter 140 to provide supplemental illumination for camera 26a in which case LEDs 164 are LEDs that emit IR radiation in the 780 to 800 nm range. As stated above, any IR radiation emitted may be continuous since it would not impair the vision of any other drivers. Alternatively, IR LEDs may be pulsed on during those periods in which camera 26a is integrating in order to maximize the intensity of their emissions.

Second light 182 could also function as a rearward driver assistance illuminator whereby it would project substantially white light rearward to assist the driver while backing up the vehicle. In this case, LEDs 362 may be white light emitting LEDs or may include LEDs that emit light of binary complementary or ternary complementary colors. Binary complementary LEDs that, in combination, project metameric white light are disclosed in the above-cited U.S. Pat. No 5,803,579 and described further below. When such white light illumination is to be projected from second light 182, the activation signal used to turn on the back-up lights would also be used to activate LEDs 362 when the vehicle is in reverse. Again, to maximize the illumination from second light 182, LEDs 362 may be pulsed on while camera 26a is integrating. However, to minimize the glare from LEDs 362 from adversely impacting the image captured by camera 26a, LEDs 362 are preferably spaced apart from camera 26a and baffles 380 are provided to block as much glare as possible. It will be appreciated, however, that assembly 200 may be constructed without camera 26a, in which case, LEDs 362 may, but need not, be pulsed.

By having assembly 200 directly mounted to rear window 332 in the manner described above, a rear window modular structure 301 may be created that may be shipped as a single OEM product to an assembly plant. By integrating the camera and the CHMSL in a single assembly and incorporating that assembly into a module structure including a rear window and any defroster and/or wiper, wiring for the electrical components may extend from a single location on rear window module 301 thereby simplifying the installation of these components at the assembly plant. Moreover, the inclusion of the camera in such a rear window modular structure enables a rear window manufacturer to offer an added value to the vehicle manufacturer.

Figure 10:
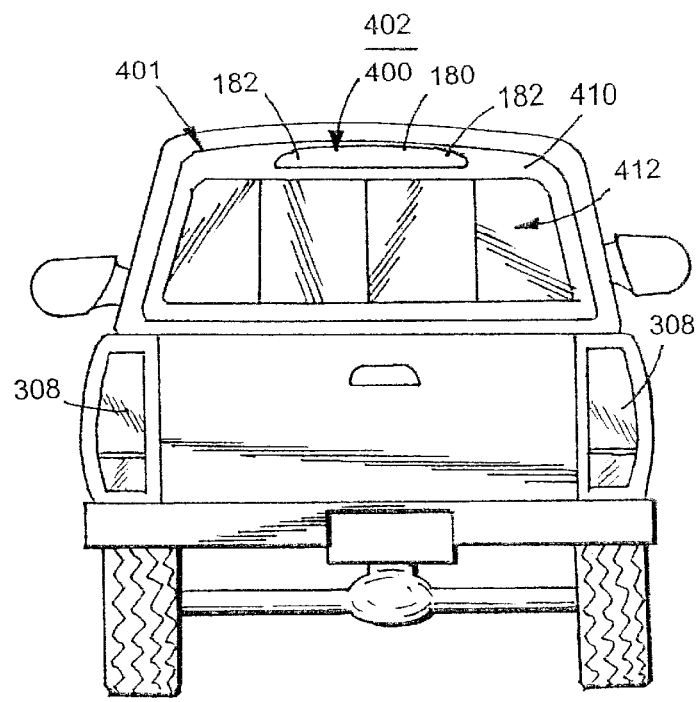
FIG. 10 is a rear perspective view of a vehicle in which a second embodiment of the present invention is implemented.

FIG. 10 shows an alternative mounting of a light assembly 400 constructed in accordance with the present invention. As shown, assembly 400 is mounted within the frame structure 410 surrounding and supporting a rear window 412. Assembly 400, rear window 412, and frame 410 may be preassembled into a single modular structure 401 that may be supplied as an OEM product and installed at an assembly plant. Modular structure 401 differs from modular structure 301 (FIG. 6) in that assembly 400 is not mounted behind rear window 412, but rather is mounted adjacent rear window 412 such that light emitted therefrom is not projected through window 412, which may be made of privacy glass. Modular structure 401 also offers the advantage that a camera mounted in assembly 400 will not have its effective sensitivity reduced by privacy glass. As explained further below, assembly 400 may, but need not, include a camera.

Figure 11:
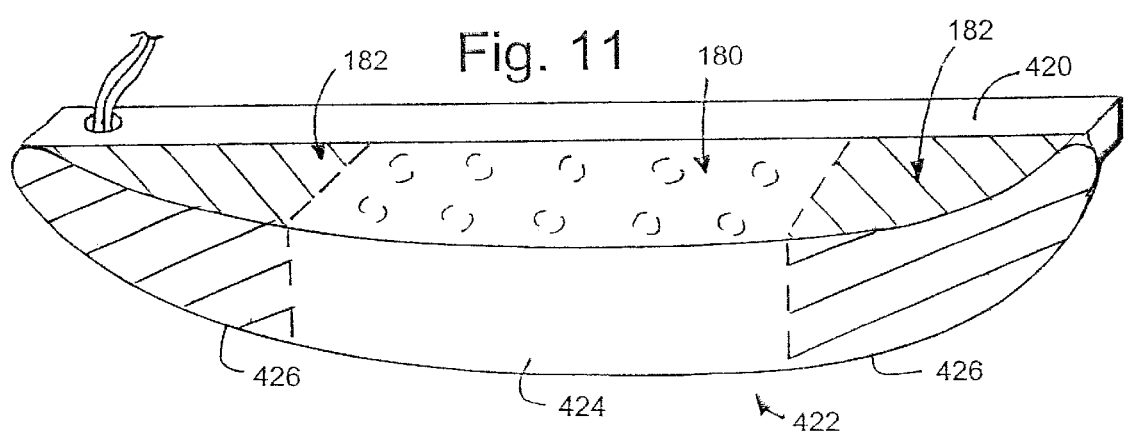
FIG. 11 is a perspective view of a center high mounted stoplight (CHMSL) assembly constructed in accordance with the second embodiment of the present invention.

As shown in FIGS. 11 and 12, assembly 400 includes a support structure 420 and a lens structure 422 that together form a housing for a first light 180 and second light 182. Preferably, first light 180 includes an array of red or red-orange LEDs 428 that are activated in response to an activation signal received when the vehicle brakes are applied so as to function as a CHMSL. Second light 182 preferably includes two arrays of LEDs 430 provided on opposite sides of the array of LEDs 428. LEDs 430 preferably include LEDs that are capable of causing white light to be emitted from lens 422. More preferably, LEDs 430 include binary complementary LEDs as disclosed in the above-cited U.S. Pat. No. 5,803,579 and described further below. LEDs 430 may thus function as a cargo light for a pick-up truck 402 (FIG. 10), as signal lights, and/or as driver assistance illumination lights. As can be readily perceived, such driver assistance illumination lights are particularly useful when used in a vehicle such as a minivan, sport utility vehicle, or pick-up truck with privacy glass that inherently limits rearward visibility.

Lens 422 preferably includes three regions overlying each of the three arrays of LEDs. Central region 424, which overlies LEDs 428, may be clear or red and function as a diffusion lens. Peripheral regions 426, which overlie the two arrays of LEDs 430, are preferably clear with integrated optics suitable for functioning as a cargo light or as a signal light. An example of optics that may be used to direct the light is disclosed in U.S. patent application Ser. No. 09/109, 527, entitled OPTICAL ASSEMBLY FOR SEMICONDUCTOR LIGHTING DEVICE ILLUMINATOR, the disclosure of which is incorporated herein by reference.

As mentioned above, a camera/light assembly may be mounted in the tail light assembly 308 of a vehicle. FIGS. 13 and 14 show the possible construction of such an assembly 500. Assembly 500 preferably includes a support structure 502 and a lens 504 that together provide a housing for the integrated lights and camera system. A first light 180 is provided in an upper portion of assembly 500 that includes an array of red or red-orange LEDs 506 mounted to a circuit board 363. First light 180 is preferably controlled in such a manner so as to function as the brake lights, turn signal lights, and running lights of the vehicle. Second light 182 preferably includes an array of LEDs 508 mounted to circuit board 363 adjacent the array of LEDs 506. LEDs 508 are preferably capable of projecting white light from lens 504. More preferably, LEDs 508 are binary complementary LEDs. By projecting white light, second light 182 may function as a back-up light.

A camera 26a is also mounted to circuit board 363. As discussed above, camera 26a includes image sensor array 60 and a lens system 56 supported by lens supports 382. Lens 504 preferably includes three regions including a first region 510 overlying the LEDs of first light 180, a second region 512 overlying the LEDs of second light 182, and a third region 514 overlying camera 26a. First region 510 is preferably either red or clear and acts as a diffuser. Second and third regions 512 and 514 are preferably clear. Third region 514 does not introduce optical effects while second region 512 preferably serves to direct the emitted light in a particular direction. To prevent stray light from lights 180 and 182 from interfering with the imaging by camera 26a, baffles 380 are preferably provided between the two arrays of LEDs 506 and 508 and between the array of LEDs 508 and camera 26a.

LEDs 508 may additionally include LEDs for emitting IR radiation. As described above, such IR radiation enhances the ability of camera 26a to capture images at night.

If cameras are mounted in both tail light assemblies 308, a stereoscopic image may be obtained and synthesized according to the teachings of International Application No. PCT/US096/07382, the disclosure of which is incorporated herein by reference. If additional cameras 26b and 26c are also mounted in the front headlamp/turn signal assemblies 310 (FIG. 6), in the front side fenders of the vehicle (as indicated by reference numeral 309 in FIG. 6), or in exterior rearview mirror assemblies 330, the two side images may be synthesized with the image captured by rear camera(s) 26a into a single display image as taught in International Application No. PCT/US96/07382. Alternatively, each captured image may be displayed on a separate display device 32a–32c. Some options for mounting display devices 32 are described below with reference to FIGS. 15–20.

Figure 15:
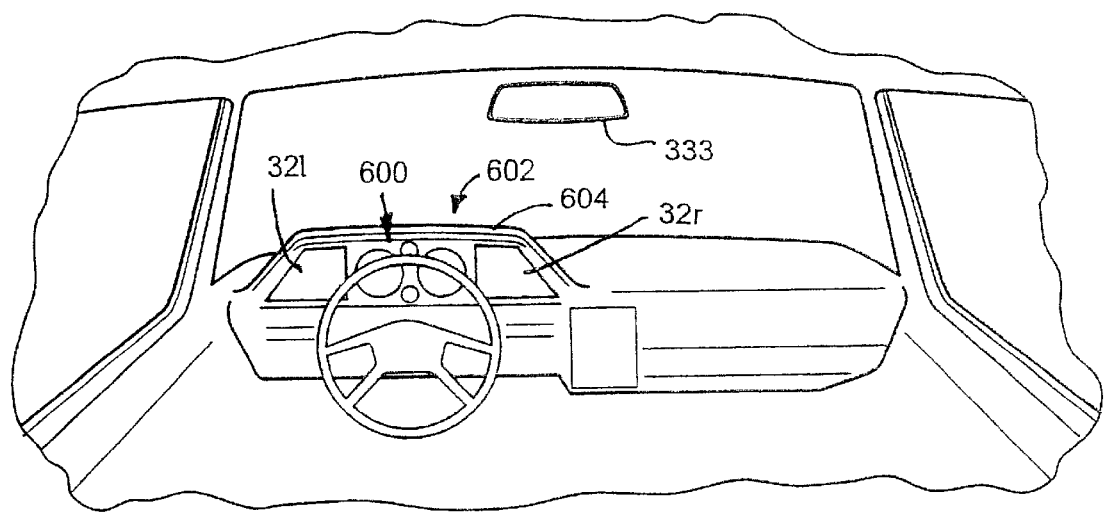
FIG. 15 is a perspective view of the front interior of a vehicle in which the present invention is implemented according to an alternative embodiment.
Figure 16:
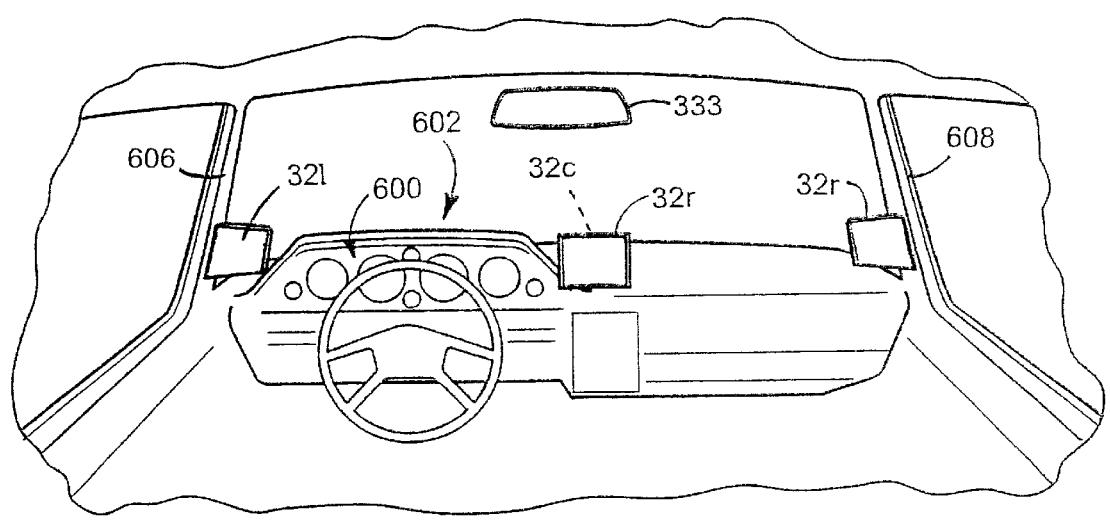
FIG. 16 is a perspective view of the front interior of a vehicle in which the present invention is implemented according to an alternative embodiment.

FIGS. 15 and 16 illustrate two possible implementations for providing two displays within the view of the driver. Two displays would be used when two corresponding cameras are used that are both mounted to the rear of the vehicle or on opposite sides of the vehicle. In FIG. 15, a left display 32l and a right display 32r are incorporated in the instrument panel 602 on opposite sides of the conventional gauges 600 (e.g., speedometer, tachometer, fuel gauge, etc.) normally provided in a vehicle instrument panel. In this manner, the cowling 604 that extends over and around gauges 600 will prevent glare by blocking direct sunlight from impinging upon the surfaces of displays 32.

FIG. 16 shows two alternative arrangements for implementing two displays in a vehicle. In both arrangements, left display 32l is mounted on the driver's side A-pillar 606. In one arrangement, the right display 32r is mounted on instrument panel 602 on the right side of display gauges 600. In the other arrangement, right display 32r is mounted to the passenger's side A-pillar 608. By mounting left and right displays to the respective A-pillars, the driver may look in the same general direction as the driver would normally look to view the left and right rear images through conventional exterior review mirrors. Thus, the second arrangement shown in FIG. 16 offers the advantage that would be more likely to receive consumer acceptance, since it does not require any significant change in driving habits.

Figure 17:
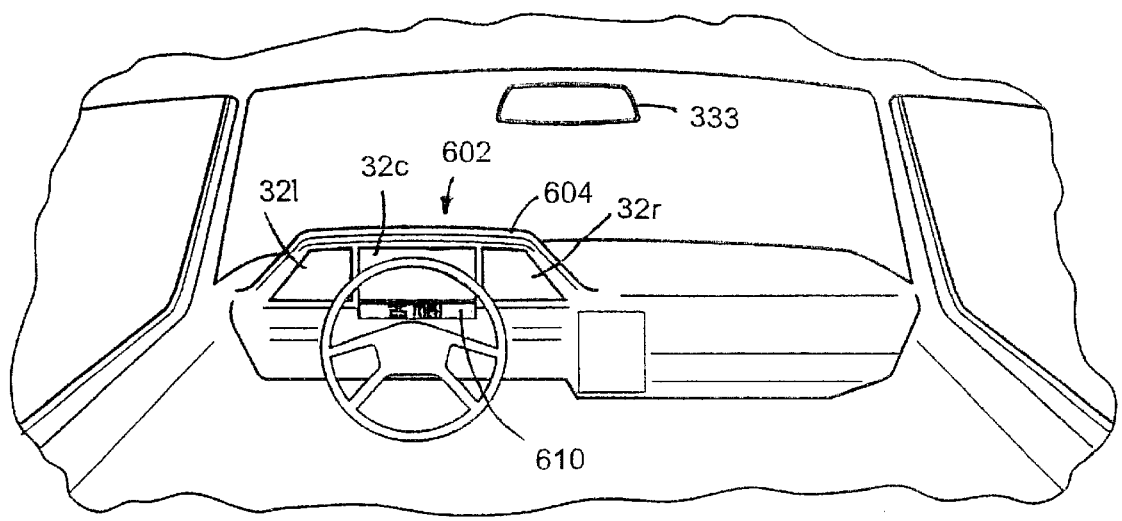
FIG. 17 is a perspective view of the front interior of a vehicle in which the present invention is implemented according to an alternative embodiment.

The arrangements shown in FIG. 16 may also be combined so as to provide three displays 32 with left and right displays 32l and 32r mounted to the respective left and right A-pillars 606 and 608, and a central display 32c mounted on instrument panel 602 in a central location. Such a three-display configuration is particularly advantageous when images are obtained from cameras mounted to the two sides of the vehicle as well as from a camera mounted to the rear of the vehicle. FIG. 17 shows an alternative arrangement for a three-display configuration whereby the left, center, and right displays are all mounted on instrument panel 602 in the region where the gauges are normally provided. In this case, the gauges may be replaced with a digital alphanumeric display 610 that may extend along the instrument panel in a position below the right, center, and left displays.

Figure 18:
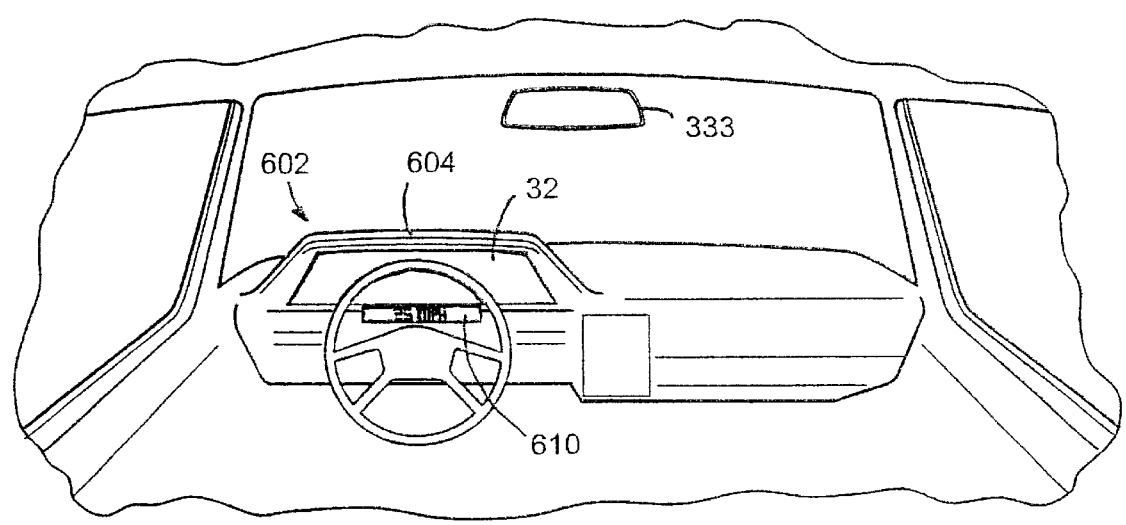
FIG. 18 is a perspective view of the front interior of a vehicle in which the present invention is implemented according to an alternative embodiment.

FIG. 18 shows an implementation that is similar in effect to that shown in FIG. 17, only instead of including three separate displays, a single display 32 is provided in instrument panel 602 to display a synthesized image obtained by combining the images from more than one camera. Like the arrangement shown in FIG. 17, a digital alphanumeric display 610 is provided that extends along the instrument panel in a position below display 32.

Figure 19:
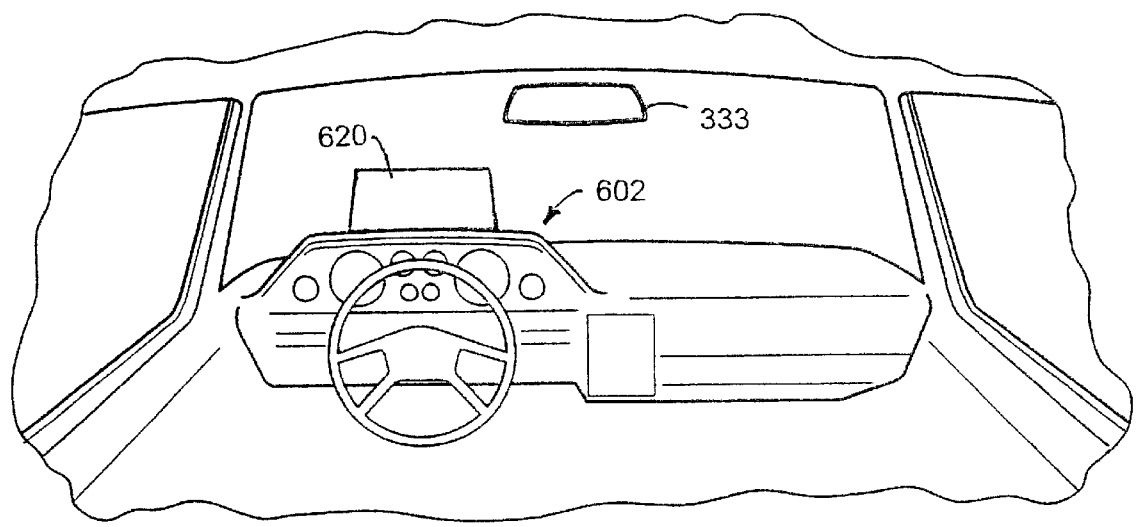
FIG. 19 is a perspective view of the front interior of a vehicle in which the present invention is implemented according to an alternative embodiment.

Alternatively, as shown in FIG. 19, a heads-up or virtual display device 620 may be mounted above or within instrument panel 602 to project an image obtained from a single camera or a synthesized image obtained from multiple cameras.

Figure 20:
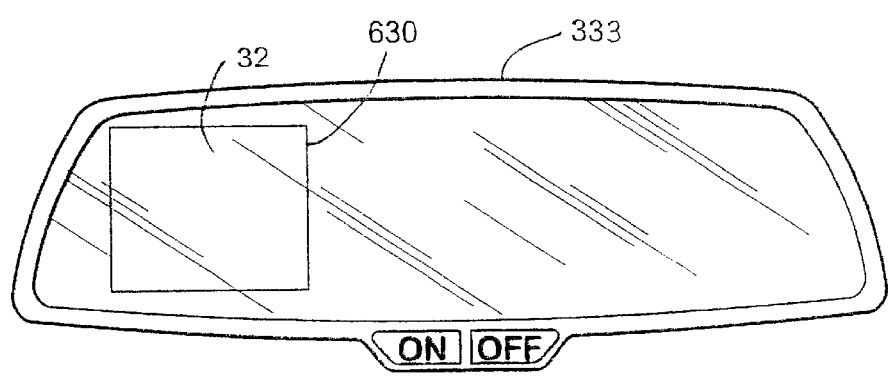
FIG. 20 is a perspective view of an interior rearview mirror constructed in accordance with the present invention.

FIG. 20 shows an interior rearview mirror assembly 333 having a display window 630 through which a mini in-mirror display 32 may be mounted. Such an arrangement is particularly advantageous when combined with the arrangement shown in FIG. 16 whereby the right and left camera images are displayed on respective right and left displays mounted to the right and left A-pillars and the image from a rear mounted camera is fed to display 32 in rearview mirror assembly 333. In this manner, all the images from three separate cameras may be discretely displayed in locations where a driver is accustomed to seeing similar images as would be viewed through the internal and external rearview mirrors.

Figure 21:
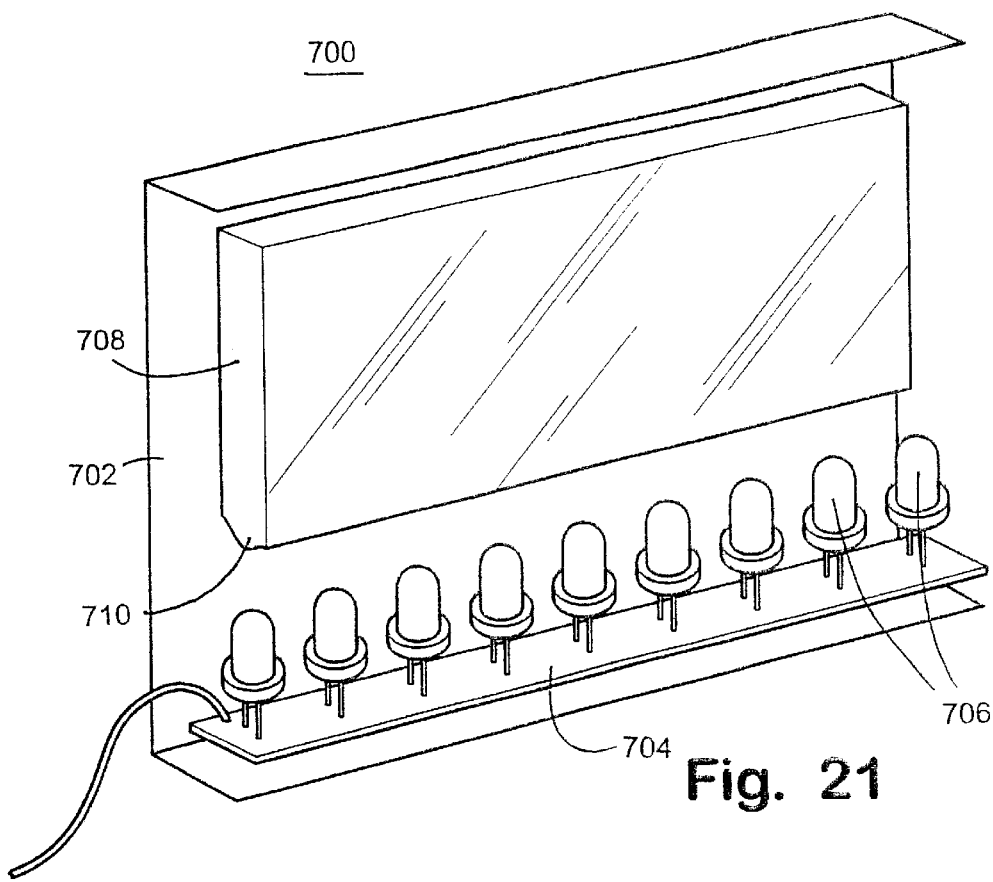
FIG. 21 is an oblique perspective view of a CHMSL light source constructed in accordance with the present invention.
Figure 22:
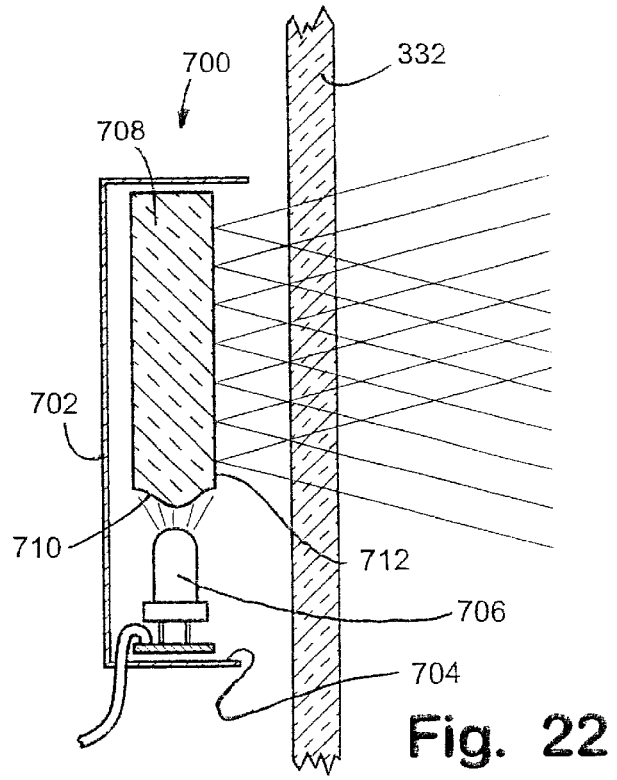
FIG. 22 is a side perspective view of the CHMSL light source shown in FIG. 21.

According to another aspect of the present invention, a CHMSL 700 may be constructed as shown in FIG. 21. CHMSL 700 includes a support structure 702 to which a circuit board 704 is mounted. Circuit board 704 has mounted thereon a linear array of red or red-orange LEDs 706. Also mounted on support structure 702 is a diffuser/collimator 708. Diffuser/collimator 708 is preferably a light-directing film, light-directing array, or equivalent as commercially available from Allied Signal, Inc. of Moorestown, N.J. Diffuser/collimator 708 has a shape of a generally flat rectangle. Circuit board 704 and diffuser/collimator 708 are mounted on support structure 702, such that the light emitted from LEDs 706 is projected into a lower convex toric edge surface 710 of diffuser/collimator 708. As shown in FIG. 22, the light projected into edge 710 from the plurality of LEDs 706 is mixed, diffused, and collimated into beams projected from the flat rear facing surface 712 of diffuser/collimator 708 outward through rear window 332.

Figure 23:
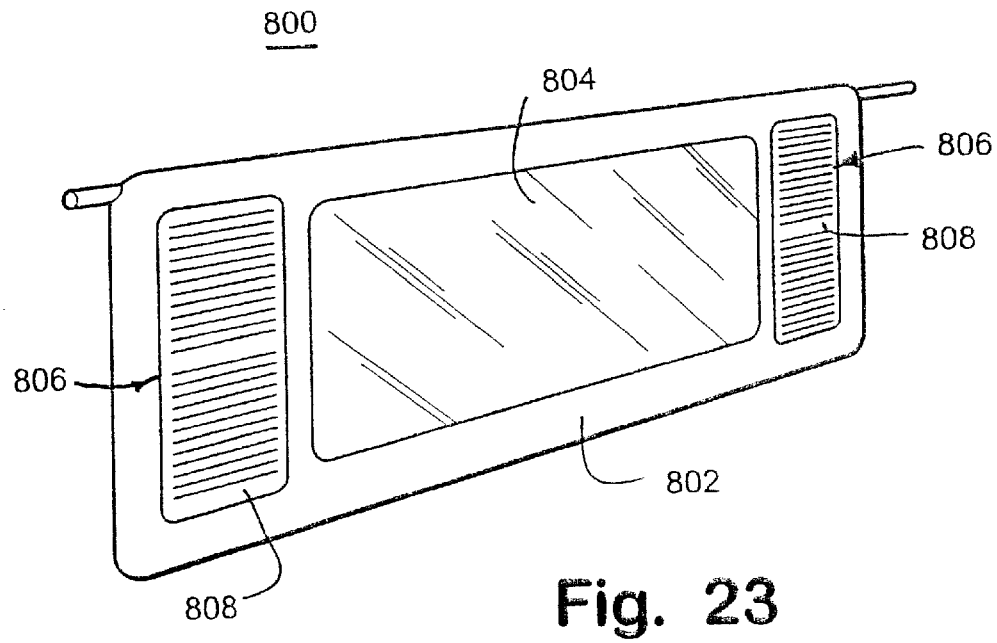
FIG. 23 is a perspective view of a sun visor constructed in accordance with one embodiment of the present invention.
Figure 24:
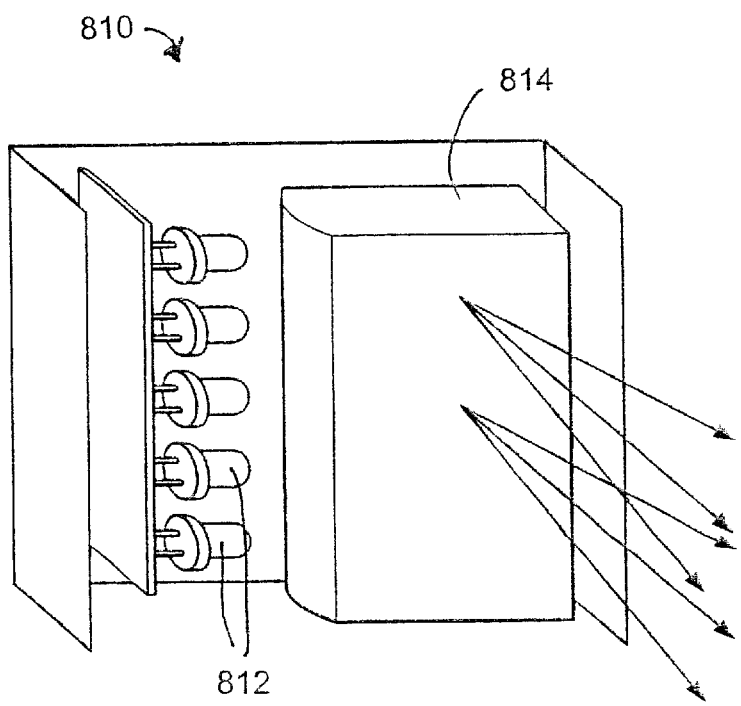
FIG. 24 is a perspective view of a light source for use in the sun visor assembly shown in FIG. 23 as constructed in accordance with the present invention.

By constructing CHMSL 700 in the manner illustrated, a very low profile, high intensity signal light is provided. The low profile of CHMSL 700 is particularly advantageous when mounting the CHMSL in the interior of the vehicle behind rear window 332. It will be appreciated, however, that structures similar to that shown in FIGS. 21 and 22 may be used to construct other signal lights or vehicle illuminators. For example, a particularly suitable application for a light source having the general structure shown in FIG. 21 is to utilize such a light source in a vehicle sun visor assembly 800 as shown in FIGS. 23 and 24. As illustrated, sun visor assembly 800 includes a visor body 802 having a vanity mirror 804 and two light sources 806 mounted on the rear-facing surface of visor body 806. Light sources 806 include a transparent plate or lens 808 and an assembly 810 (FIG. 24) that is similar to that shown in FIG. 21, except that assembly 810 may be turned on its side and the diffuser/collimator is selected to have 90 degree deviation rather than the 40 degree deviation that is preferred for the diffuser/collimator of CHMSL 700. Further, LEDs 812 in assembly 810 produce white light. Preferably, LEDs 812 include binary complementary LEDs such as those disclosed in the above-cited U.S. Pat. No. 5,803,579, and descended further below. Because diffuser/collimator 814 of assembly 810 thoroughly mixes the light projected into its edge from LEDs 812 prior to projecting the mixed light outward, the projected light from diffuser/collimator 814 will appear white to a viewer looking directly at its surface of projection even though different colored LEDs 812 are used to create the white light.

A second embodiment for a sun visor assembly 900 is shown in FIGS. 25–27. As shown, visor assembly 900 includes a visor body 902 having a vanity mirror 904 and light sources 906 mounted to a rear-facing surface thereof. A visor assembly 900 differs from visor assembly 800 shown in FIGS. 23 and 24 in that light sources 906 include an outer optical plate 908 that functions as a diffuser/collimator sheet. Further, LEDs 912 are mounted on a printed circuit board 910 so as to project light through a surface opposite the projection surface rather than through an edge. Again, LEDs 912 are preferably binary complementary LEDs.

Although various features and embodiments of the present invention have been disclosed as being used in particular combinations, it will be appreciated by those skilled in the art that some of the disclosed features may be implemented separately from one another or in combinations or subcombinations not expressly disclosed. For example, certain features of the system, such as the pulsing of lights during non-integration periods of the camera, may be implemented regardless of the particular manner in which the cameras or displays are physically mounted to the vehicle. Similarly, aspects of the invention relating to the physical mounting of the cameras and displays may be separately implemented regardless of the functionality or structure of the imaging system of which the cameras and displays are components.

The present invention provides a highly reliable, low-voltage, long-lived, LED illuminator for vehicles, portable lighting, and specialty lighting capable of producing white light with sufficient luminous intensity to illuminate subjects of interest well enough to be seen and to have sufficient apparent color and contrast so as to be readily identifiable.

The LEDs of the present invention exhibit extremely predictable electronic properties and are well suited for use with DC power sources, pulse-width modulated DC power sources, and electronic control systems. LEDs do not suffer appreciable reliability or field-service life degradation when mechanically or electronically switched on and off for millions of cycles. The luminous intensity and illuminance from LEDs closely approximates a linear response function with respect to applied electrical current over a broad range of conditions, making control of their intensity a relatively simple matter. Finally, recent generations of AlInGaP, AlGaAs, and GaN LEDs draw less electrical power per lumen or candela of visible light produced than incandescent lamps, resulting in more cost-effective, compact, and light-weight illuminator wiring harnesses, fuses, connectors, batteries, generators, alternators, switches, electronic controls, and optics. A number of examples have previously been mentioned and are incorporated within the scope of the present invention, although it should be recognized that the present invention has obvious other applications beyond the specific ones mentioned which do not deviate appreciably from the teachings herein and therefore are included in the scope of this invention.

Figure 28:
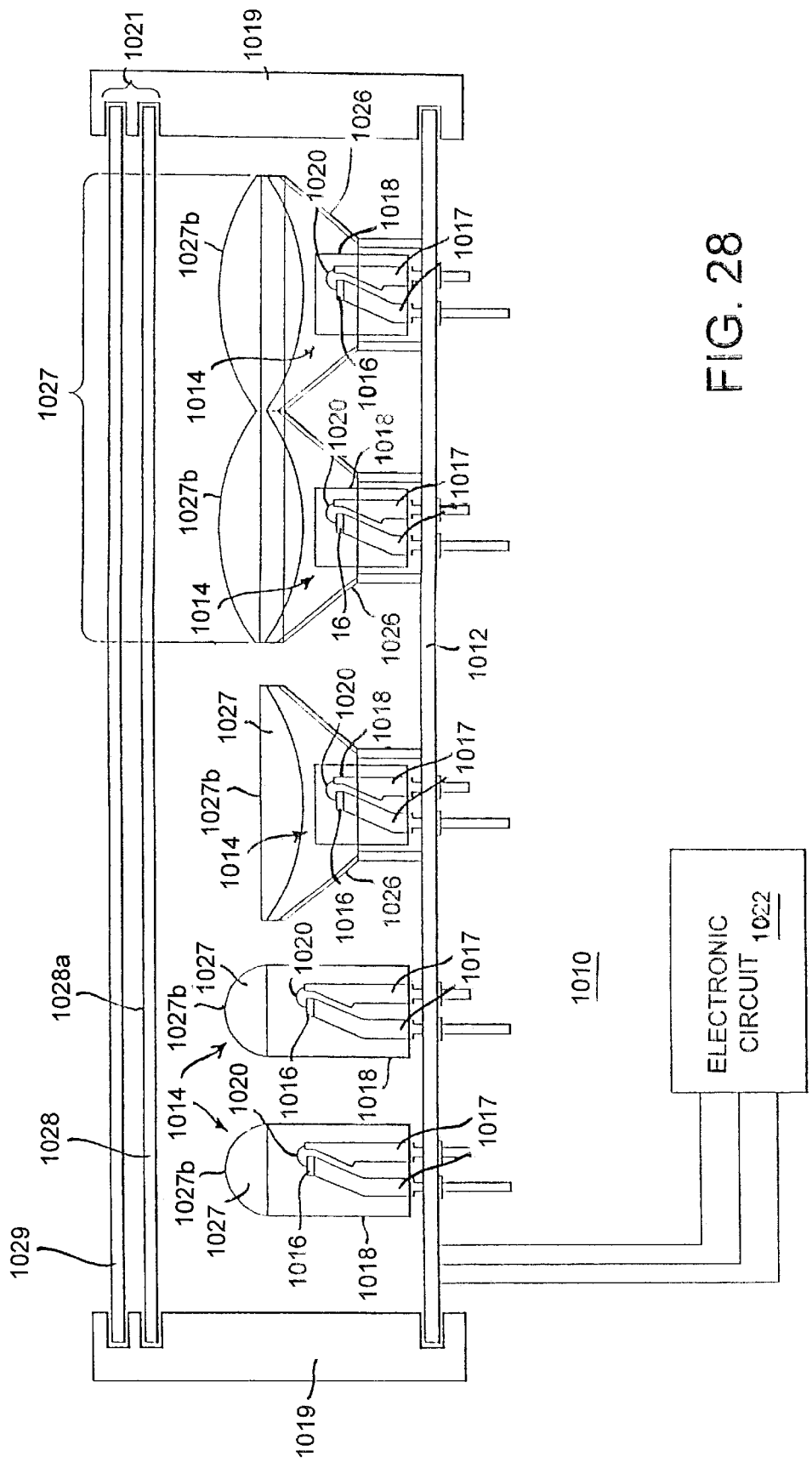
FIG. 28 is a cross-sectional view of an illuminator assembly according to the present invention incorporating conventional discrete LEDs.
Figure 29:
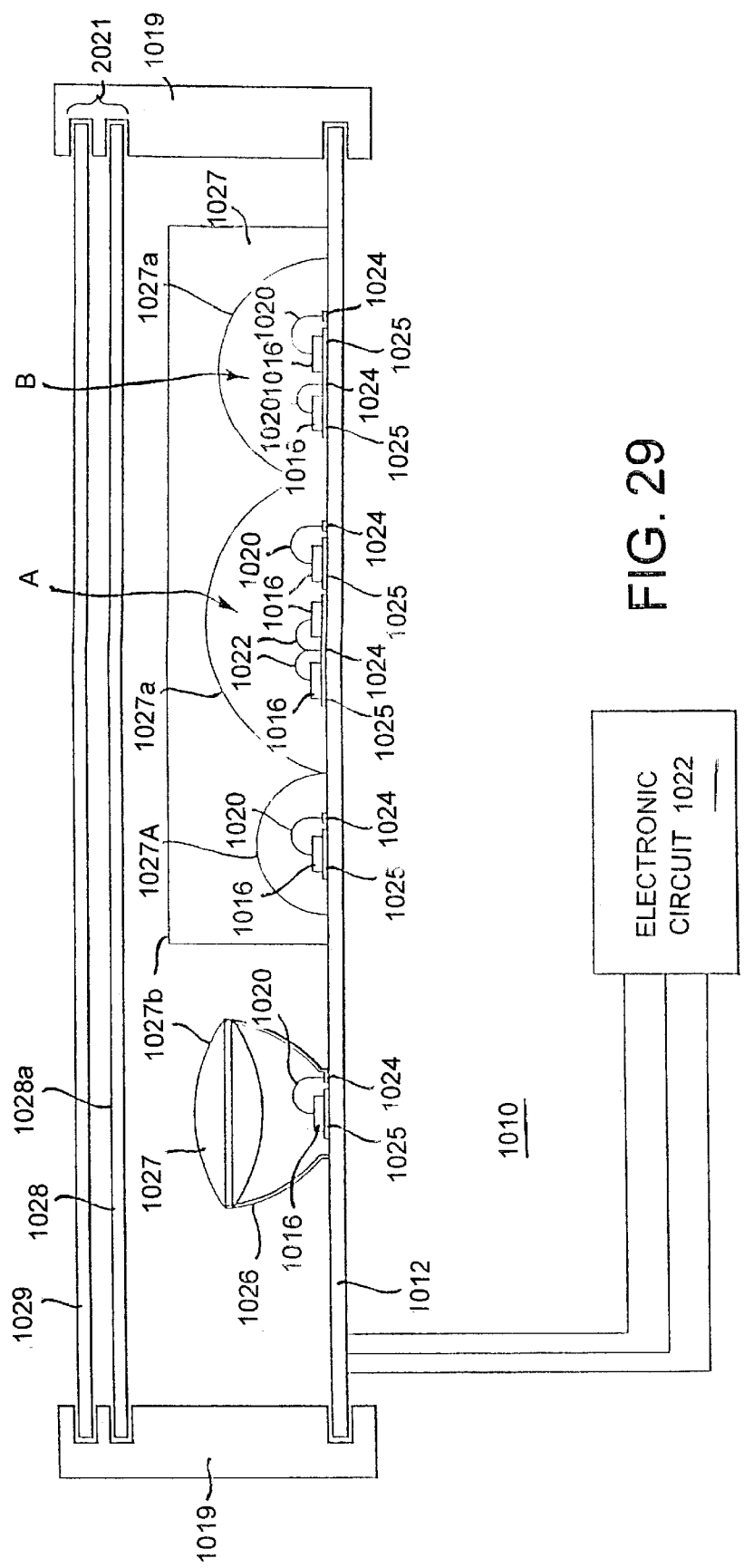
FIG. 29 is a cross-sectional view of an illuminator assembly according to the present invention incorporating a plurality of LED chips in a chip-on-board configuration.

FIGS. 28 and 29 show two embodiments of the present invention using LEDs of two substantially different configurations, FIG. 28 shows an embodiment incorporating conventional discrete LEDs, and FIG. 29 shows an embodiment incorporating individual LED chips.

Conventional discrete LED components include such LED devices such as T 1, T 1-¾, T 5, surface mount (SMD), axial-leaded "polyleds," and high power packages such as the SuperNova, Pirahna, or Brewster lamps, all of which are available with a variety of options known to those skilled in the art such as color, size, beam width, etc. Appropriate conventional discrete LEDs may be obtained from manufacturers such as Hewlett Packard, Inc., Optoelectronics Division, located in San Jose, Calif., Stanley Electric Company, LTD located in Tokyo, Japan, Nichia Chemical Industries, LTD located in Anan-shi, Tokushima-ken, Japan and many others.

Conventional discrete LEDs 1014 are the dominant form of LEDs in general use because of their generic shapes and ease of processing in standard printed circuit board assembly operations. Referring to FIG. 28, illuminator 1010 is shown including a support member 1012 which supports, delivers electrical power to, and maintains a spatial relationship between a plurality of conventional discrete LEDs 1014. The structure of support member 1012 will vary depending on the specific design of the LEDs 1014 and of the illuminator 1010, and may be a conventional printed circuit board or optionally may be a portion of housing 1019 into which the illuminator assembly 1010 is being incorporated. Support member 1012 may be shaped such that the emission of all of the LEDs is aligned or otherwise focused on a common spot at some predetermined distance away from the illuminator 1010. A conventional discrete LED 1014 generally consists of a pre-assembled or packaged "lamp" each of which normally includes a metal lead frame 1017 or other substrate for electrical and mechanical connection and internal mechanical support, a semiconductor LED chip or "die" 1016, a conductive adhesive or "die attach" (not shown) for electrically and mechanically attaching one electrode of the chip 1016 to the lead frame 1017 or other substrate, a fine wire conductor 1020 for electrically connecting the other electrode of the chip 1016 to an area of the lead frame 1017 or other substrate which is electrically isolated from the first electrode and die attach by the chip 1016 itself. Optionally, a miniature reflector cup (not shown) may also be located adjacent to the chip 1016 to further improve light extraction from the device. Finally, a clear, tinted, or slightly diffused polymer matrix enclosure 1018 is used to suspend, encapsulate, and protect the chip 1016, lead frame 1017, optional reflector cup (not shown) and wire conductor 1020 and to provide certain desirable optical characteristics.

In conventional discrete LEDs 1014, the polymer matrix enclosure 1018 typically comprises an optically clear epoxy or any number of materials capable of protecting the LED chip 1016 and an upper portion of lead frame 1017 from environmental contaminants such as moisture. As shown in FIG. 28, polymer matrix enclosure 1018 can further be made integral with lens 1027 which will be discussed in greater detail hereinbelow. The upper portion of lead frame 1017 is connected to the LED semiconductor chip 1016 and a lower portion of lead frame 1017 extends out one end of the enclosure 1018 to attach to support member 1012 and provide electrical connection to an electronic control circuit 1022 through wires 1023. Circuit 1022 is operable to energize, control, and protect the LEDs 1014, and manipulate and manage the illumination they produce. Many variations of electronic control circuit 1022 will be known to those skilled in the art and will vary depending on the application for illuminator 1010. For example, electronic control circuit 1022 for a flashlight may simply be an ON-OFF switch, a battery and a resistor in series with the LEDs 1014 and support member 1012. However, for an automotive rearview mirror assembly, described in detail hereinbelow, circuit 1022 will be slightly more complex.

In most conventional discrete LED designs, enclosure 1018 also acts as an integral optical element such as a lens 1027, deviator 1028, or diffuser 1029, however separate or secondary optical elements 1021 are preferably incorporated in illuminator 1010 to improve illuminator performance or appearance. Furthermore, more than one individual LED chip 1016 of the same color or of different colors may be incorporated within a single polymer matrix enclosure 1018 such that the spacing between conventional discrete LEDs 1014 is greater than the spacing between individual chips 1016.

A second configuration of LEDs is the individual LED chip, consisting solely of a semiconductor LED chip (without a pre-attached lead frame, encapsulating media, conducting wire, etc.). These are generally shipped in vials or adhered to a membrane called "sticky back" and are mounted in an intermediate manufacturing step directly onto a printed circuit board, ceramic substrate, or other structure to support the individual LED chip and provide electrical connections to it. When a plurality of LEDs is so mounted, the result is a "chip-on-board" LED array which in its entirety can then be incorporated into other assemblies as a subcomponent. Individual LED chips suitable for the present invention are available from Hewlett Packard, Showa Denko, Stanley, and Cree Research, to name just a few. Referring to FIG. 29, if chip-on-board LED designs are utilized, then illuminator 1010 has a support member 1012 which may be a printed circuit board, ceramic substrate, housing or other structure capable of supporting the individual LED chips 1016 while simultaneously providing electrical connection for powering the chips 1016. In this configuration, individual LED chips 1016 are placed on support member 1012, thereby eliminating the bulky prepackaged polymer matrix enclosure 1018, and lead frame 1017 of the conventional discrete type of LED 1014 in FIG. 28. A more integrated and optimized system is therefore possible by virtue of the flexibility to place individual LED chips 1016 within very close proximity to one another on the support member 1012 and within very close proximity to reflector 1026, lens 1027, and/or secondary optical elements 1021 used to enhance the light emissions of LED chip 1016. In this manner, one or more LED chips 16 can be placed at or very near to the focus of a single lens 27 or lenslet 27*a* (as shown in areas A and B), improving the alignment and uniformity of the resultant mixed beam projected therefrom. Individual LED chips 1016 are very small (on the order of 0.008 inches×0.008 inches×0.008 inches) and can be placed very closely to one another by precision equipment, e.g., pick-and-place machines. Such close pitch spacing is not possible with the conventional discrete LEDs 1014 of FIG. 28 because of their relatively large size and larger tolerances associated with their manufacture and assembly. Furthermore, the ability to tightly pack the chips 1016 allows extreme design flexibility, improving the aesthetic appeal of illuminator 1010.

For chip-on-board designs, the individual LED chips 1016 are electrically connected to conductive pad 1024 by a fine conductive wire 1020 and attached to conductive pad 1025 by an electrically conductive die attach adhesive (not shown). The chips 1016 and conductive pads 1024 and 1025 are mounted on, and held in a spaced-apart relationship from one another, by support member 1012. LED chips 1016 are electrically connected to the support member 1012, and to electronic circuit 1022, through pads 1024 and 1025, support member 1012 and wires 1023.

Referring to Areas A and B, the number, spacing, color, and pattern of individual LED chips 1016 under each lenslet 1027*a* can vary from system to system. One or more chips 1016 of the same color or different colors chosen according to the teachings of this invention may be placed under a single lenslet 1027*a* such that the spacing between groups of LED chips is greater than the spacing between individual chips. For instance, in Area A, two of the three individual LED chips 1016 shown may be a type that emits amber light when energized and the third may be of a type which emits blue-green light when energized. Alternatively, two may be of the blue-green variety and one may be of the amber variety. Also, it is possible for all of the LEDs in Area A to be of one color, e.g. amber, if another nearby group in the plurality of the illuminator such as that shown in Area B of FIG. 29 contains an appropriate number of complementary LEDs, e.g. two of the blue-green variety.

A reflector 1026 may optionally be used with the above-described conventional discrete LED designs as shown in FIG. 1 or with LED array chip-on-board designs shown in FIG. 29. The reflector 1026, if used, is normally a conical, parabolic, or elliptical reflector and typically is made of metal or metal-coated molded plastic. The purpose of the reflector 1026 is to collect or assist in the collection of light emitted by the LED chip 1016 and project it toward the area to be illuminated in a narrower and more intense beam than otherwise would occur. For chip-on-board LED array designs, reflector 1026 is commonly a planar reflector made integral with conductive pad 1025 by selective plating of a reflective metal (such as tin solder) and is oriented radially around the LED chip 1016. In this case, of course then the combined reflector/conductive pad serves the previously described functions of both the reflector 1026 and the conductive pad 1025. Suitable reflectors 1026 are well known to those skilled in the art and may be obtained from a wide variety of optical molding and coating companies such Reed Precision Microstructures of Santa Rosa, California. More than one reflector 1026 to be used for conventional LEDs 1014 or LED chips 1016 can be combined to make a reflector array whose constituent elements are oriented in substantial registry with the conventional LEDs 1014 or LED chips 1016.

As shown in FIG. 28 and FIG. 29, lens 1027 is normally a magnifier/collimator which serves to collect light emitted by each conventional LED 1014 or LED chip 1016 and reflected by optional reflector 1026 and project it in a narrower and more intense beam than otherwise would occur. As shown in FIG. 28 for an illuminator 1010 using conventional LEDs 1014, lens 1027 is commonly made integral with polymer matrix enclosure 1018, or otherwise may be made separately from polymer matrix enclosure 1018. Lens 1027 may also be made as an integral array of lenslets 1027a which are then substantially registered about the centers of individual conventional discrete LEDs 1014.

As shown in FIG. 29 for an illuminator 1010 using individual LED chips 1016 in a chip-on-board configuration, more than one lenslet 1027a can be combined in an array to make lens 1027 whose constituent elements are lenslets 27a oriented in substantial registry with the LED chips 1016, reflectors 1026, and pads 1024 and 1025. In FIG. 29, lenslets 1027a are shown as Total Internal Reflection (TIR) collimating lenses whose concave surfaces (facing the individual LED chips 1016) consist of radial microprism structures similar to those on a Fresnel lens. However, it should be understood that Plano-convex, bi-convex, aspheric or their Fresnel, total-internal-reflection (TIR), catadioptric or holographic optic element (HOE) equivalents are typical variants of lenslet 1027a. Lens 1027 or lenslets 1027a are used with a wide variety of options known to those skilled in the art such as color, f-number, aperture size, etc. These may be obtained from various manufacturers including U.S. Precision Lens, Reed Precision Microstructures, 3M, Fresnel Optics Company, and Polaroid Corporation.

Referring simultaneously to FIGS. 28 and 29, one or more optional secondary optical elements 1021 are used with the above-described conventional discrete LED designs (FIG. 28) or with LED array die-on-board designs (FIG. 29). Secondary optical elements 1021 are components that influence by combination of refraction, reflection, scattering, interference, absorption, and diffraction the projected beam shape or pattern, intensity distribution, spectral distribution, orientation, divergence and other properties of the light generated by the LEDs. Secondary optical elements 1021 comprise one or more of a lens 1027, a deviator 1028, and a diffuser 1029, each of which may be in conventional form or otherwise in the form of a micro-groove Fresnel equivalent, a HOE, binary optic or TIR equivalent, or another hybrid form.

A deviator 1028 may be optionally mounted on or attached to the housing 1019 or otherwise attached to or made integral with the lens surface 1027b and used to conveniently steer the collimated beam in a direction oblique to the optic axis of the lens 1027 and/or reflector 1026 used in the LED illuminator 1010. Deviator 1028 is normally a molded clear polycarbonate or acrylic prism operating in refractive mode for deviation angles up to about 35 degrees or in TIR mode (such as a periscope prism) for deviation angles in excess of 35 degrees. This prism may further be designed and manufactured in a micro-grooved form such as a Fresnel equivalent or a TIR equivalent. Furthermore, a diffraction grating, binary optic, or holographic optical element can be substituted for this prism to act as a deviator 1028. In any of these cases, the deviator 1028 is configured as a sheet or slab to substantially cover the entire opening of the illuminator housing 1019 from which light is emitted. Such deviators are available from the same sources as the lens manufacturers listed above.

Optionally, a diffuser 1029 may be mounted on or attached to the housing 1019 or otherwise attached to or made integral with the lens surface 1027b or the deviator surface 1028a and is used to aesthetically hide and physically protect the illuminator internal components, and/or to filter the spectral composition of the resultant illuminator beam, and/or narrow, broaden or smooth the beam's intensity distribution. This can be helpful, for instance, in improving color and brightness uniformity of the effective illumination projected by the illuminator. Alternatively, diffuser 1029 may include unique spatial filter or directional film such as Light Control Film (LCF) from 3M to sharpen the beam cut-off properties of the illuminator 1010. The diffuser 1029 may further incorporate a unique spectral filter (such as a tinted compound or an optical coating such as dichroic or band pass filter) to enhance illuminator aesthetics, hide internal illuminator components from external view, or correct the color of mixed light projected by the illuminator 1010. Diffuser 1029 is normally a compression or injection molded clear polycarbonate or acrylic sheet whose embossed surface or internal structure or composition modifies impinging light by refraction, reflection, total internal reflection, scattering, diffraction, absorption or interference. Suitable holographic diffusers 1029 can be obtained from Physical Optics Corporation in Southern California, and binary optics may be obtained from Teledyne-Brown of Huntsville, Ala.

It is preferred to have as few optical members as practical and, therefore, at least two can be combined into one integral piece. For example, deviator 1028 can be incorporated onto an upper surface 1027b of lens 1027 by simply placing an appropriately machined mold insert into the planar half of a mold for a Fresnel or TIR collimator lens. As mentioned hereinabove and shown in FIG. 29, diffuser 1029 may also be attached to or made integral with the lens surface 1027b or the deviator surface 1028a. Procedures for consolidating the optical members will be known to those skilled in the art as will substituting various individual types of optical members for those listed above. All such combinations are intended to be within the scope of the present invention. Clearly, whether conventional discrete LEDs 1014 or individual chips 1016 are used, those skilled in the art will understand that many modifications may be made in the design of support member 1012 while still staying within the scope of the present invention, and all such modifications should be understood to be a part of the present invention.

In accordance with the present invention, the plurality of conventional discrete LEDs 1014 and individual LED chips 1016 consists of two types whose emissions exhibit perceived hues or dominant wavelengths which are color-complementary and distinct from one another and which combine to form a metameric white light. To discuss what "metameric" and "complementary" mean in the present invention, one must understand several aspects of the art of producing and mixing light and the manner in which light made from that mixing will be perceived. In general, however, it is known that the apparent "color" of light reaching an observer depends primarily upon its spectral power distribution and upon the visual response of the observer. Both of these must therefore be examined.

Figure 30:
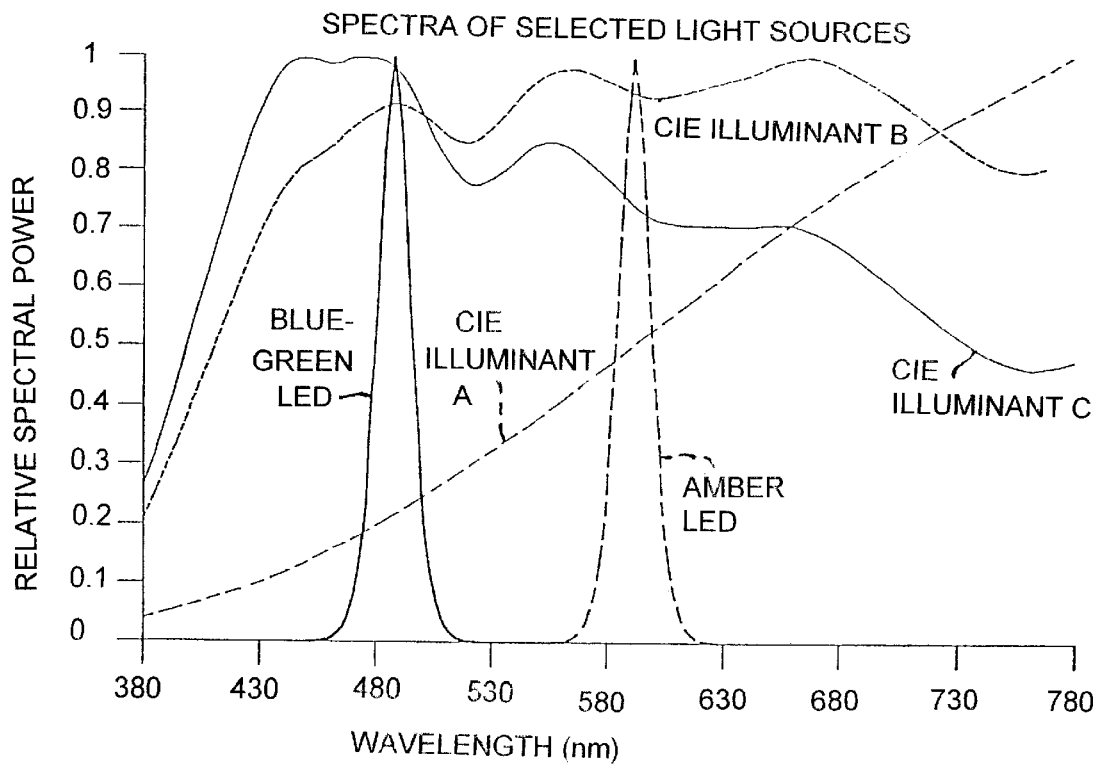
FIG. 30 is a graph plotting the relative spectral power versus wavelength for Standard Illuminants A, B, and C, as well as amber and blue-green LEDs.

FIG. 30 is a graph plotting the relative spectral power versus wavelength for Standard "white" Illuminants A, B, and C. The Standard Illuminants have been developed by the Commission Internationale de l'Eclairage (CIE) as a reference to reduce the complexity that results from colored objects undergoing appreciable changes in color appearance as the light source which illuminates them is changed.

Standard Illuminant A is a source having the same relative spectral power distribution as a Planckian radiator at a temperature of about 2856 K. A Planckian or blackbody radiator is a body that emits radiation, because of its temperature, according to Planck's law. True Planckian radiators are ideal abstractions, not practical sources, but many incandescent sources emit light whose spectral composition and color bears a close approximation thereto. For instance, CIE Standard Illuminant A closely approximates the light emitted by many incandescent lamps such as a tungsten halogen lamp. It is convenient, therefore, to characterize the spectral power distribution of the radiation by quoting the temperature of the Planckian radiator having approximately the same relative spectral power distribution. Standard Illuminants B and C represent "true" daylight and sunlight, respectively; however, they have too little power in the ultraviolet region compared with that of daylight and sunlight.

All of these Illuminants are variations of white light and, as can be seen from FIG. 30, have broadband spectral power distributions. Incandescent light sources are typically solids that emit light when their temperatures are above about 1000 K and the amount of power radiated and the apparent color of this emission is directly related to the source temperature. The most familiar incandescent light sources are the sun, flames from a candle or gas lamp, and tungsten filament lamps. Such sources, similar to CIE Standard Illuminants A, B and C in FIG. 30, have spectral power distributions which are relatively constant over a broad band of wavelengths, are often referred to as broadband sources, and have colors which are perceived as nearly achromatic or white. Given the diversity of white-light sources and the associated range of near-white colors which are de facto accepted as white in various areas of practice, a color shall be deemed as white within the scope-of the present invention, if it is substantially indistinguishable from or has color coordinates or tristimulus values approximately equal to colors within the white color boundary translated from the revised Kelly chart, within the SAE J578 achromatic boundaries, along the blackbody curve including Planckian radiators at color temperatures between 2000 K and 10,000 K, sources close to Standard Illuminants A, B, C, $D_{65}$, and such common illuminants as fluorescent F1, F2, F7, high pressure sodium lamps, xenon lamps, metal halide lamps, kerosene lamps or candles. These are all well known in the art and will be referenced and discussed hereinafter.

Unlike the other sources discussed, LEDs are narrow bandwidth sources. In addition to Standard Illuminants A, B, and C, FIG. 30 shows the spectral power distribution of two LEDs, one emitting a narrow-bandwidth radiation with a peak spectral power emission at 592 nanometers (nm) and the other at 488 nm. As can be seen by examination of this figure, the characteristic spectra of LEDs is radically different from the more familiar broadband sources. Since LEDs generate light by means of electroluminescence (instead of incandescence, pyroluminescence or cathodoluminescence), the emission spectra for LEDs are determined by the band gap of the semiconductor materials they are constructed of, and as such are very narrow-band. This narrow-band visible light emission characteristic is manifested in a highly saturated appearance, which in the present invention means they have a distinctive hue, high color purity, i.e., greater than about 0.8, and are therefore highly chromatic and distinctly non-white. Despite the narrow-band attributes of LED light, a combination of the emissions of two carefully selected LEDs can surprisingly form illumination which appears white in color, with color coordinates substantially identical to Standard Illuminants A, B or C.

Figure 31A:
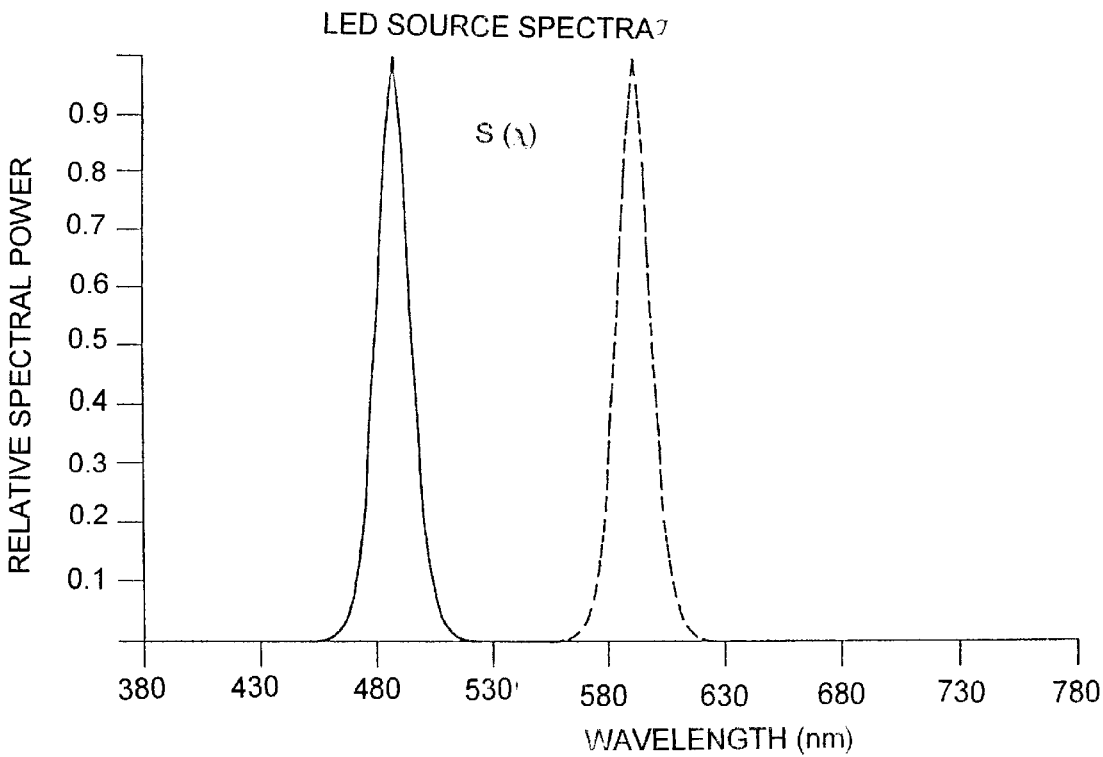
FIGS. 31a, 31b, and 31c are a series of graphs plotting the relative spectral power versus wavelength for amber and blue-green LEDs, the spectral reflectance versus wavelength for a 50 percent neutral gray target, and the relative spectral power versus wavelength for the resultant reflected light, respectively.
Figure 31B:
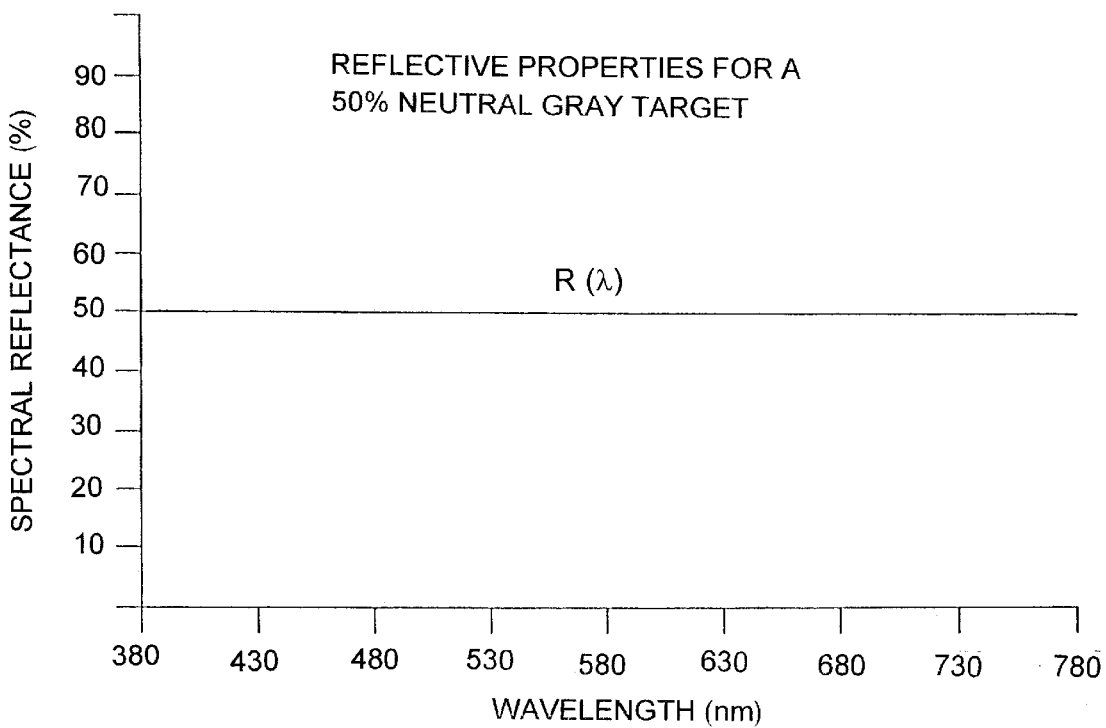
Figure 31C:
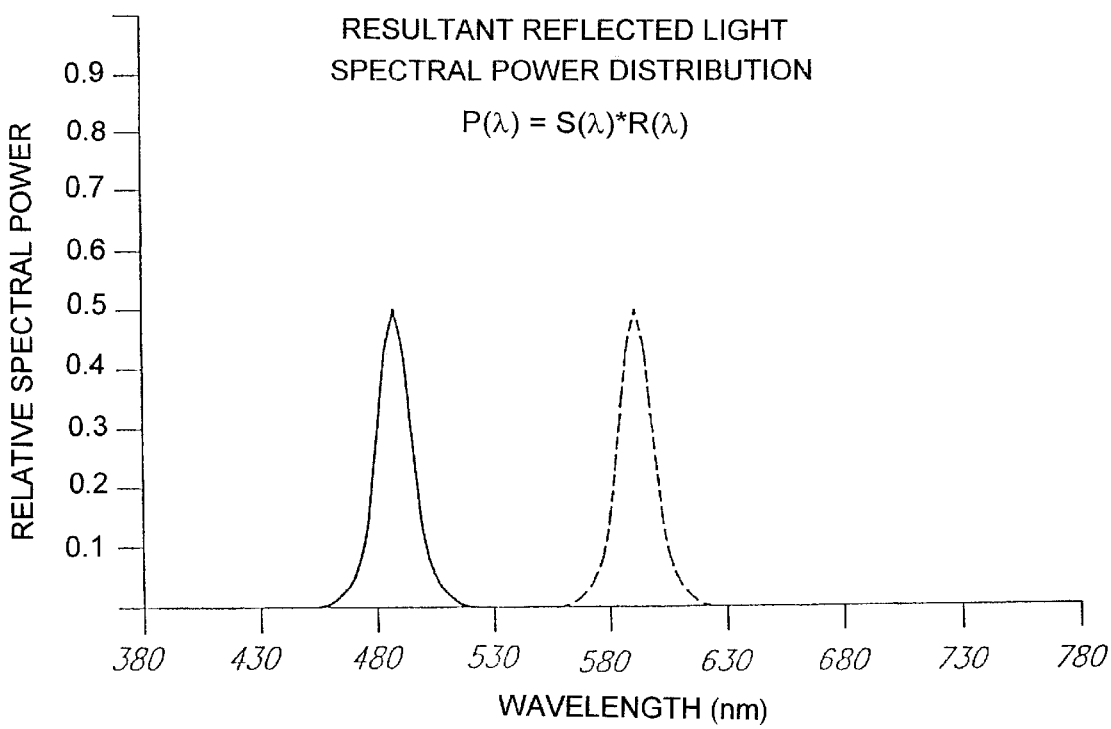

The reason for this is that, as mentioned hereinabove, the apparent color of light such as from a self-luminous source depends upon the visual response of the observer, in addition to the characteristics of the light from the source. In addition, the apparent color of a non-self-luminous object or surface (one which must be illuminated by a separate source in order to be seen) is slightly more complicated and depends upon the visual response of the observer, the spectral reflectance of the object or surface in question, and the characteristics of the light illuminating the object or surface. As illustrated in FIGS. 31a, 31b, and 31c, if a surface or object is a "neutral gray" diffuse reflector, then it will reflect light having a composition proportionally the same as the source which illuminates it, although invariably dimmer. Since the relative spectral power distribution of the light reflected from the gray surface is the same as the illuminating source, it will appear to have the same hue as the illuminating source itself. If the illuminating source is white, then the surface will appear white, gray, or black (depending on its reflectance). FIG. 31c shows the resultant spectral power distribution of the light emitted from a plurality of amber and blue-green LEDs and subsequently reflected from a 50 percent neutral gray target surface.

Figure 32:
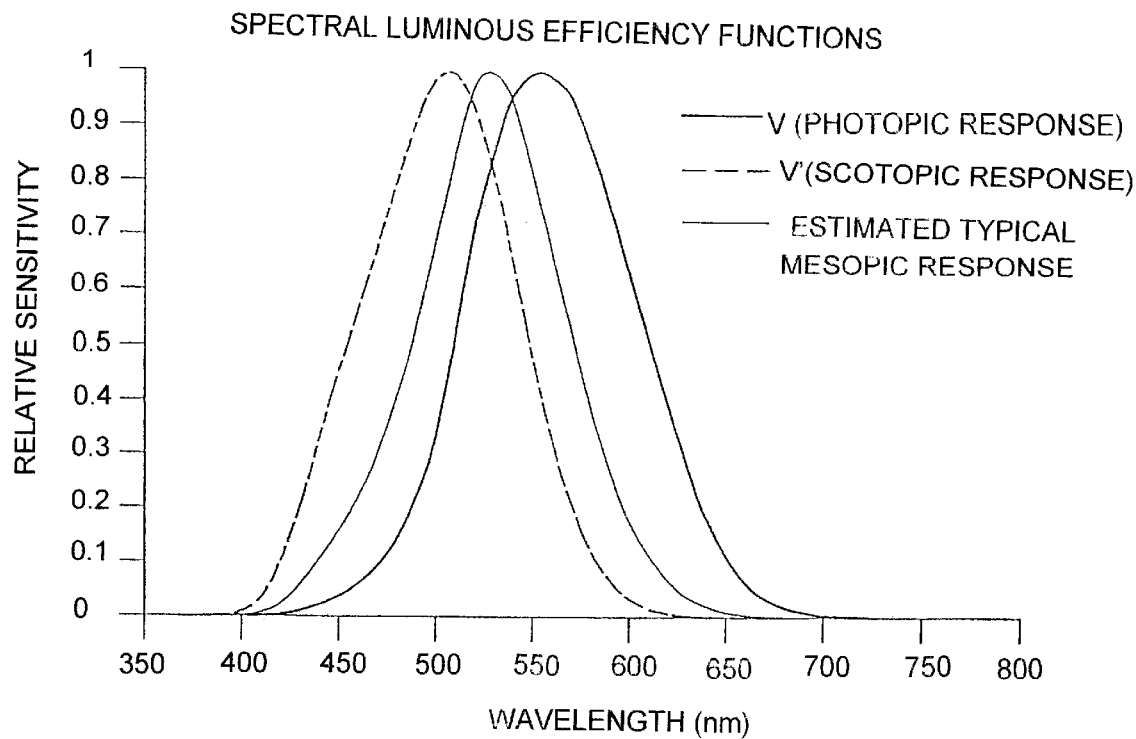
FIG. 32 is a graph plotting the relative sensitivity of a standard two degree observer versus wavelength for photopic vision, scotopic vision as well as an estimated mesopic vision.

As stated hereinabove, the visual response of an observer affects the apparent color of emitted and reflected light. For humans, the sensors or receptors in the human eye are not equally sensitive to all wavelengths of light, and different receptors are more sensitive than others during periods of low light levels. Cone receptors are active during high light levels or daylight and are responsible for color perception. Rod receptors are active during low light levels and have little or no sensitivity to red colors, but have a significant sensitivity to blue light. FIG. 32 is a graph plotting the relative sensitivity of a "standard observer" versus wavelength for the spectral luminous efficiency functions. The curve represented by V represents a standard observer's visual sensitivity to stimuli seen under photopic (or high light level) conditions of vision, and the curve V' represents a standard observer's visual sensitivity to stimuli seen under scotopic (or low light level) conditions of vision. As can be seen, the photopic response (V) has a nearly Gaussian shape with a peak at about 555 nm and the scotopic response (V') has a peak at about 508 nm. This difference between relative spectral sensitivity during photopic and scotopic conditions amounts to an enhanced blue response and diminished red response during darkness and is known as the Purkinje phenomenon. Scotopic conditions exist when observed surfaces have surface luminances of less than a few hundredths of a candela per square meter. Photopic conditions exist when observed surfaces have surface luminances of more than about 5 candelas per square meter. A transition range exists between photopic and scotopic vision and is known as mesopic (or middle light level) vision, represented by the intermediate curve in FIG. 32 which is an estimated typical mesopic response. Another primary difference between photopic, scotopic, and mesopic vision is the absence of color discrimination ability in scotopic conditions (very low light levels) and reduced color discrimination abilities in mesopic conditions. This will be discussed further hereinbelow.

The differences between photopic, mesopic, and scotopic viewing conditions are relevant to the present invention because an illuminator is used to illuminate areas during low light level conditions. Thus, before any illumination, the environment represents scotopic conditions of vision and during full illumination (after the eye has had time to adapt to the increased illumination), the environment is in the photopic conditions of vision. However, during the time the eye is adapting, and on the "outer fringes" of the illuminated region even after adaptation, the environment is in the mesopic conditions of vision. The eye's varying sensitivities to these different levels of illumination are very important in designing a proper illuminator.

Figure 33:
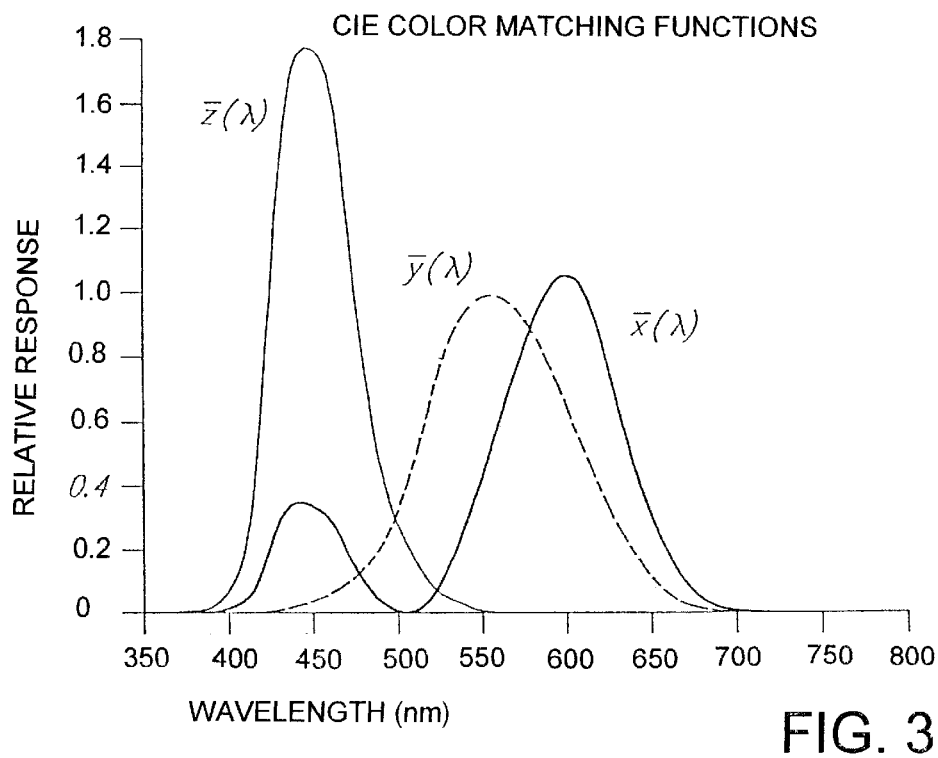
FIG. 33 is a graph plotting the relative response of the color-matching functions for a standard two degree observer versus wavelength during photopic vision.

The colors perceived during photopic response are basically a function of three variables, corresponding to the three different types of cone receptors in the human eye. There are also rod receptors, however, these only become important in vision at low light levels and are typically ignored in color evaluations at high light levels. Hence, it is to be expected that the evaluation of color from spectral power data should require the use of three different spectral weighting functions. FIG. 33 plots the relative response versus wavelength of the CIE color-matching functions for the 1931 standard 2 degree observer. The color-matching functions, $\bar{x}(\lambda)$, $\bar{y}(\lambda)$ and $\bar{z}(\lambda)$ relate to the sensitivity of the three types of cone receptors in the human eye to various wavelengths ($\lambda$) of light through a series of transforms. As can be seen by the curves in FIG. 33, the color-matching function $\bar{x}(\lambda)$ has a moderate sensitivity at about 450 nm, almost no sensitivity around 505, and a large sensitivity around 600 nm. Another color-matching function $\bar{y}(\lambda)$ has a Gaussian shape centered around 555 nm, and the third color-matching function $\bar{z}(\lambda)$ has a significant sensitivity centered around 445 nm.

As stated earlier, it is known that by combining a red color (such as a monochromatic source located at 700 nm and hereinafter designated as R), a green color (such as a monochromatic source located at 546 nm and hereinafter designated as G), and a blue color (such as a monochromatic source located at 435 nm and hereinafter designated as B) in proper ratios, virtually any color can be exactly matched. The necessary proportions of R, G, and B needed to match a given color can be determined by the above described color matching functions $\bar{x}(\lambda)$, $\bar{y}(\lambda)$ and $\bar{z}(\lambda)$ as in the following example.

First, the amount of power per small, constant-width wavelength interval is measured with a spectraradiometer throughout the visible spectrum for the color to be matched. Then, the color matching functions $\bar{x}(\lambda)$, $\bar{y}(\lambda)$ and $\bar{z}(\lambda)$ are used as weighting functions to compute the tristimulus values X, Y and Z, by further using the following equations:

$$X = k[P_1 x(\lambda)_1 + P_2 x(\lambda)_2 + P_3 x(\lambda)_3 + \ldots P_n x(\lambda)_n] \quad [1]$$

$$Y = k[P_1 y(\lambda)_1 + P_2 y(\lambda)_2 + P_3 y(\lambda)_3 + \ldots P_n y(\lambda)_n] \quad [2]$$

$$Z = k[P_1 z(\lambda)_1 + P_2 z(\lambda)_2 + P_3 z(\lambda)_3 + \ldots P_n z(\lambda)_n] \quad [3]$$

where k is a constant; $P_{1,2,3,n}$ are the amounts of power per small constant width wavelength interval throughout the visible spectrum for the color to be matched and $\bar{x}(\lambda)_{1,2,3,n}$, $\bar{y}(\lambda)_{1,2,3,n}$ and $\bar{z}(\lambda)_{1,2,3,n}$ are the magnitudes of the color-matching functions (taken from the curves of FIG. 6) at the central wavelength of each interval. Finally, the approximate desired proportions of the above-described monochromatic sources R, G, and B are calculated from the above computed X, Y and Z tristimulus values using the following equations:

$$R = 2.365X - 0.897Y - 0.468Z \quad [4]$$

$$G = -0.515X + 1.426Y + 0.0888Z \quad [5]$$

$$B = 0.005203X - 0.0144Y + 1.009Z \quad [6]$$

Therefore, the color-matching functions of FIG. 6 can be used as weighting functions to determine the amounts of R (red), G (green) and B (blue) needed to match any color if the amount of power per small constant-width interval is known for that color throughout the spectrum. Practically speaking, R, G, and B give the radiant intensities of 3 monochromatic light sources (such as lasers) with emissions at 700 nm, 546 nm and 435 nm, respectively, needed to match the chosen color.

Referring again to FIG. 30, the reason that the combined emissions from the two depicted LEDs will look like a broadband white-light source, even though they possess radically different spectral compositions, is because their combined emissions possess the same tristimulus values (as computed by Equations 1–3) as those of the broadband source Standard Illuminant B. This phenomenon is known as metamerism and is an essential aspect of the present invention.

Metamerism refers to a facet of color vision whereby two light sources or illuminated objects may have entirely different emitted or reflected spectral power distributions and yet possess identical tristimulus values and color coordinates. A result of metamerism is that additive mixtures of light from two completely different pairs of luminous sources (with their associated distinct spectra) can produce illumination having exactly the same perceived color. The principles and application of additive color mixing and metamerism to the present invention are discussed in greater detail later in this disclosure.

Figure 34:
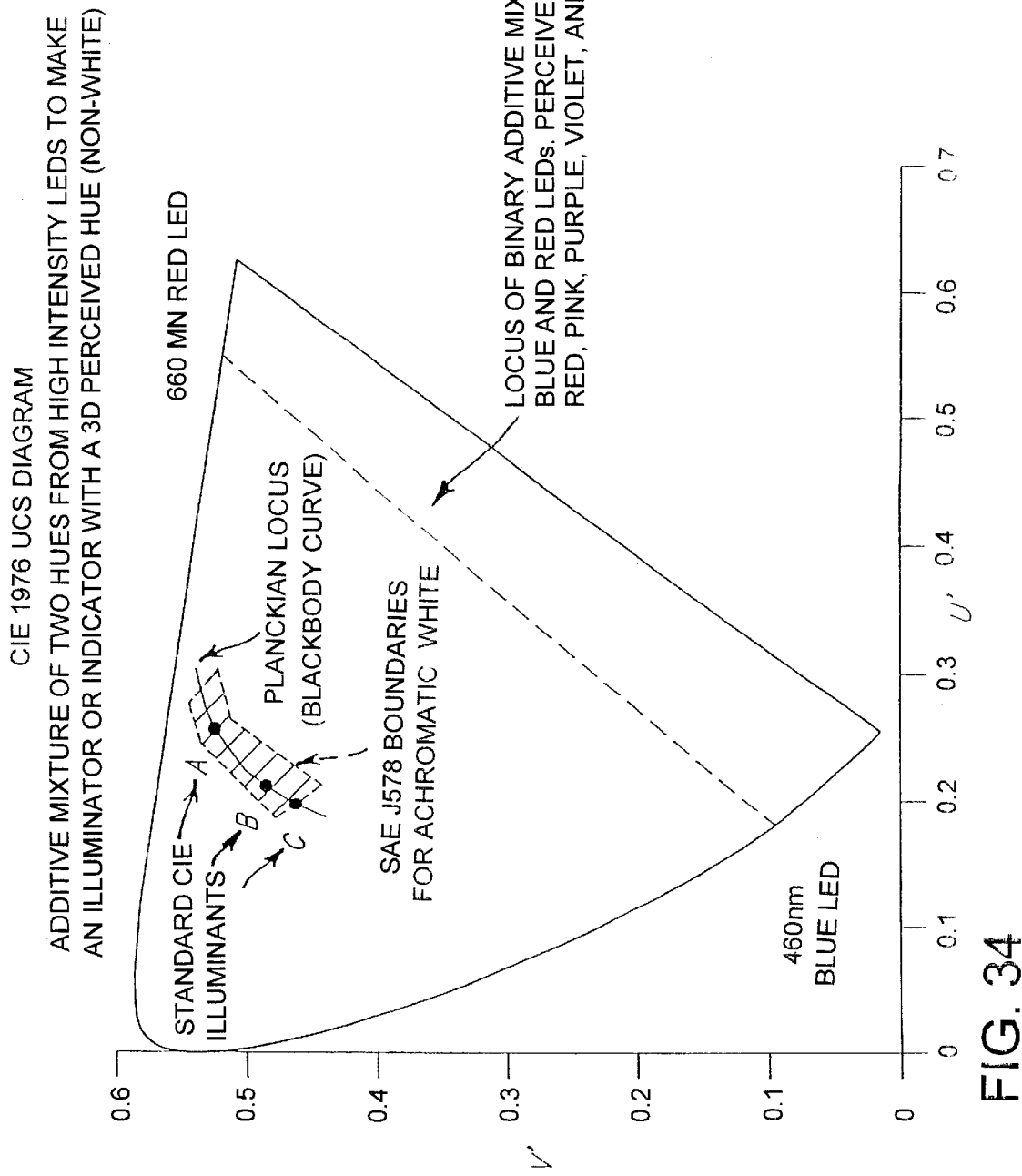
FIG. 34 is a CIE 1976 uniform chromaticity scale (UCS) diagram showing the location of the Planckian Locus, the location of the translated SAE J578 boundaries for achromatic white light, the locations of CIE Standard Illuminants A, B, and C as well as the locus of binary additive mixtures from blue and red LEDs.

FIG. 34 is a CIE 1976 uniform chromaticity scale (UCS) diagram, commonly referred to as the u', v' diagram. The u', v' diagram is used to conveniently provide numerical coordinates that correlate approximately with the perceptible color attributes, hue, and saturation. A UCS diagram is also used to portray the results of color matching computations, color mixing, and metamerism in a form that is well recognized in the art and is relatively easy to understand and use. Of course, exact color perceptions will depend on the viewing conditions and upon adaptation and other characteristics of the observer. In addition, other color coordinate systems are available, such as the CIE 1931 2 degree Chromaticity Diagram (commonly referred to as the x, y chart), CIELAB, CIELUV, Hunter and Munsell systems to name a few. For the sake of simplicity, the present invention is further described hereinbelow using the CIE 1976 UCS system. However, it should be understood that teachings of the present invention apply regardless of the color system used to describe the invention and therefore are not limited by this exclusive use of the CIE 1976 UCS system.

Referring again to FIG. 34, the location of a color on the u', v' diagram is obtained by plotting v' and u', where:

$$u' = 4X/(X+15Y+3Z) = 4x/(-2x+12y+3) \quad [7]$$

$$v' = 9Y/(X+15Y+3Z) = 9y/(-2x+12y+3) \quad [8]$$

and where X, Y, and Z are the tristimulus values described hereinabove (x and y correspond to the CIE 1931 Chromaticity x, y coordinates and are provided for convenient conversion). Thus, any color can be described in terms of its u' and v' values. FIG. 34 shows the respective positions on the u', v' diagram for the Planckian Locus, the SAE J578 boundaries for achromatic white light, Standard Illuminants A, B, and C, as well as the locus of binary additive mixtures from blue and red LEDs are shown. As can be seen, Standard Illuminants A, B, and C, closely corresponding to blackbody radiators, lie along the Planckian Locus.

The Planckian Locus is a curve on the u', v' diagram connecting the colors of the Planckian radiators at various temperatures, a large portion of which traverses the white, or achromatic region of the diagram. The SAE J578 achromatic white boundaries shown were translated from CIE 1931 Chromaticity x, y coordinates using Equations 6 and 7 hereinabove and are generally used to define what is an acceptable white light for automotive purposes (although many automotive white lights in use fall outside these boundaries).

Also shown in FIG. 34 is the range of colors producible by a hypothetical additive color-combination of red (660 nm) and blue (460 nm) LEDs. FIG. 34 clearly shows how far off the Planckian Locus and the SAE J578 achromatic boundaries that the colors produced by this combination fall. In fact, the locus of binary additive mixtures from these blue and red LEDs has perceived hues of red, pink, purple, violet, and blue. This system would therefore not be suitable as the improved white-light illuminator of the present invention.

A white-light illuminator might in fact be constructed, however, from a three-color system. As stated hereinabove, a R-G-B combination can produce almost every conceivable color on the 1976 UCS diagram. Such a system would be complex and expensive, however, and/or would suffer from unacceptable manufacturing variations inherent to R-G-B systems.

Figure 35:
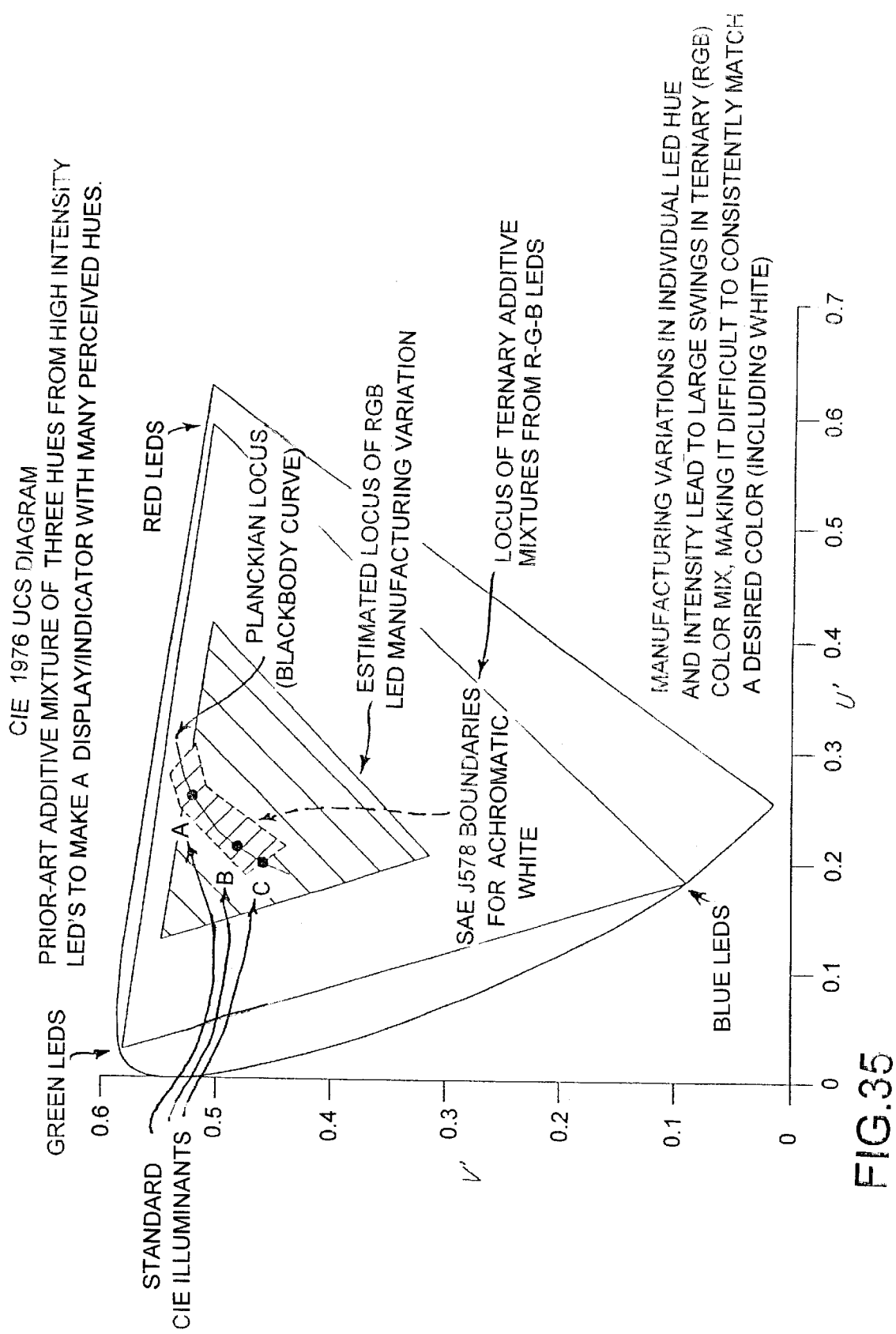
FIG. 35 is a CIE 1976 UCS diagram showing the location of the Planckian Locus, the locations of Standard Illuminants A, B, and C, the location of the translated SAE J578 boundaries for achromatic white light, the locus of ternary additive mixtures from red, green, and blue LEDs, as well as an estimated locus of red, green, and blue LED manufacturing variation.

This is illustrated best by reference to FIG. 35, which again shows the CIE 1976 UCS diagram, the Planckian Locus, and the translated SAE J578 boundaries. In addition, the locus of ternary additive mixtures producible from hypothetical R-G-B LED configuration combinations and estimated manufacturing variations associated therewith are shown. Due to various uncontrolled processes in their manufacture, LEDs of any given type or color (including red, green, and blue) exhibit large variations from device to device in terms of their radiant and luminous intensities, and smaller variations in hue. As can be confirmed by reference to typical LED product literature, this variation can represent a 200 percent change in intensity from one LED to another or from one batch to another, even if the compared LEDs are of the same type and hue. Equations 7 and 8 clearly show the dependency of a color's u', v' coordinates upon its tristimulus values X, Y and Z, and Equations 4–6 show a linking dependency to source power (or intensity). Thus, variations in R-G-B LED intensity and hue will cause variations in the u', v' color coordinates of their mixed light. Therefore, it would be very difficult to construct a large number of R-G-B LED illuminators with any assurance that their light would reproducibly match a desired color such as a white. This is illustrated by the shaded area in FIG. 35 and is referred to as the Locus of R-G-B LED Manufacturing Variation.

Thus, with a red, green, and blue (RGB) combination, white light can be reproducibly created only if extraordinary measures were invented to ensure that the additive color mix proportions are maintained during LED and illuminator assembly production. This would involve extensive measurement and for every LED to be used or perhaps incorporation of active electronic control circuits to balance the LED output in response to some process sensor. The extra costs and complexity associated with such an approach, combined with the obvious complexity of supplying three different types of LEDs through inventory and handling systems, is daunting and renders such a configuration unsuitable for the illuminator applications of the present invention.

In the broadest sense, therefore, the present invention relates to producing nearly achromatic light by additively combining complementary colors from two types of colors of saturated LED sources or their equivalents. By complementary we mean two colors that, when additively combined, reproduce the tristimulus values of a specified nearly achromatic stimulus, e.g. a reference white. By appropriately tailoring the proportions of light from each of these two complementary colors, we produce a metameric white resultant color, or alternatively any other resultant color between the two complementary color stimuli (depending on the proportion of the additive mixture). Although the saturated sources of greatest interest are LEDs, whose emissions are narrow-band, the present invention clearly teaches that similar results could be achieved with other appropriately chosen narrow-band light sources.

Figure 36:
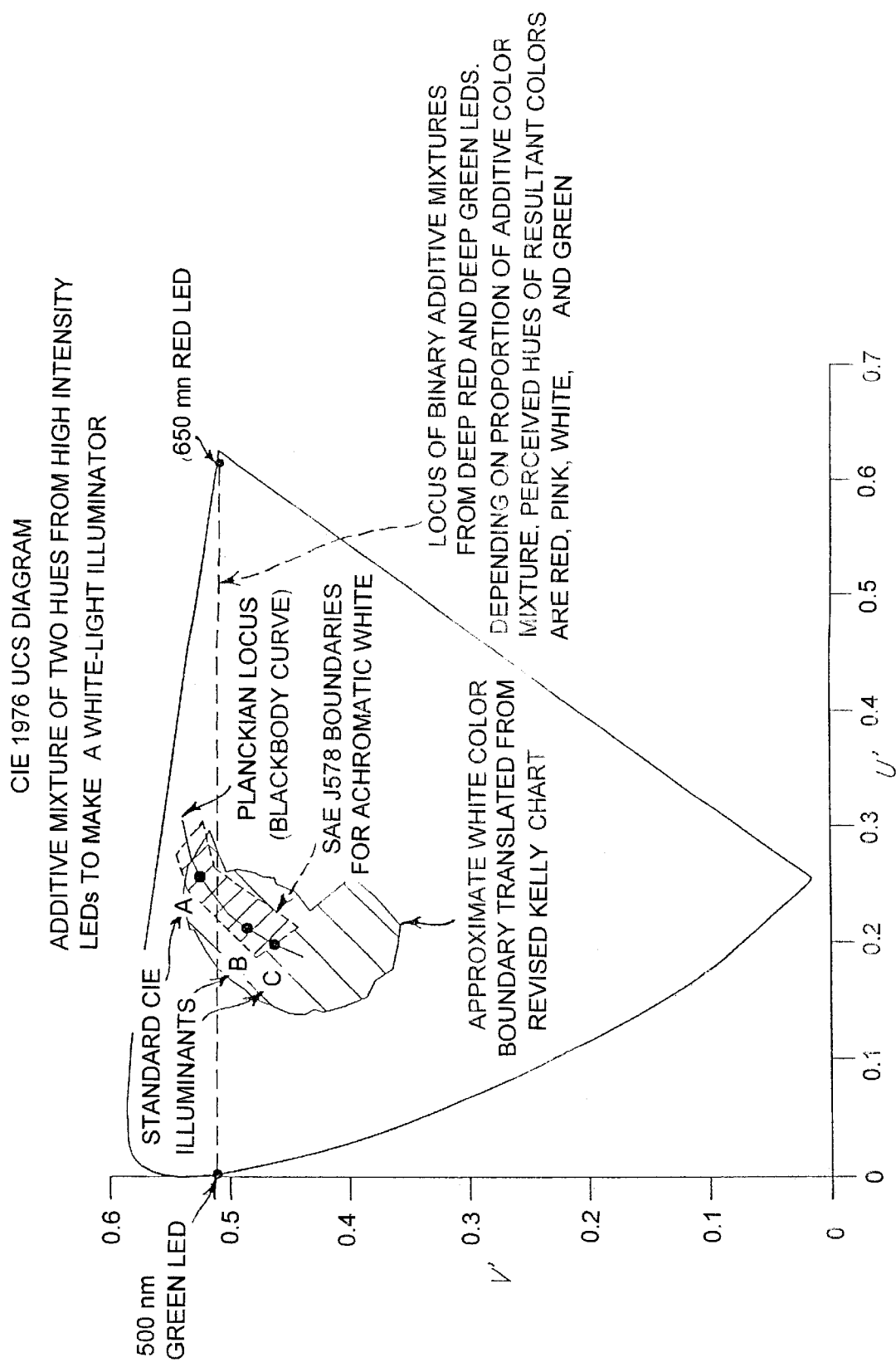
FIG. 36 is a CIE 1976 UCS diagram showing the location of the Planckian Locus, the locations of Standard Illuminants A, B, and C, the location of the translated SAE J578 boundaries for achromatic white light, and the approximate location of the white color boundary translated from the revised Kelly chart, as well as the locus of binary additive mixtures from deep red and deep green LEDs.

FIG. 36 is a CIE 1976 UCS diagram which broadly illustrates how the additive mixture of light from two LEDs having complementary hues can be combined to form a metameric white light. Also shown are the approximate boundaries of the "white" color region which has been translated from the revised Kelly chart and the CIE 1931 x, y Chromaticity Diagram. The Kelly chart and 1931 x, y Chromaticity Diagram are not shown but are well known in the art. FIG. 36 further depicts a first embodiment of the present invention utilizing a combination of one or more LEDs whose emissions have peak wavelengths of approximately 650 nm and 500 nm and perceived hues of red and green. As the diagram shows, this produces a "white" light located between Standard Illuminants A and B on the Planckian Locus.

It should be understood, however, from the above discussions that substantial variations inherent to conventional discrete and individual chip LEDs will cause changes in the coordinates of the resultant additive color mixture. The 650 nm LED depicted in FIG. 36 may fall into a range of LEDs with peak wavelengths ranging from 635 to 680 nm whose light has the hue of red, and the 500 nm LED depicted in FIG. 36 may fall into a range of LEDs with peak wavelengths ranging from 492 nm and 530 nm and whose light has the hue of green. In this embodiment, this variation, and more particularly the pronounced intensity manufacturing variations of the plurality of LEDs used, will cause the coordinates of the resultant mixture to traverse the u', v' chart in a direction generally substantially perpendicular to the Planckian Locus into either the yellowish pink or the yellowish green region of the u', v' diagram. Fortunately, as discussed hereinabove, there is some tolerance in the human visual system for acceptance of slightly non-white colors as effectively white. It should be understood that a similar mixture of red-orange or red LED light (with a peak wavelength between 600 nm and 635 nm or between 635 and 680 nm, respectively) with a complementary green LED light (with a peak wavelength between 492 nm and 530 nm) or a mixture of yellow-green or yellow LED light (with a peak wavelength between 530 nm and 572 nm) with a purple-blue or blue LED light (with a peak wavelength between 420 nm and 476 nm) can be made to function in the same manner to produce similar results and are included in the scope of this embodiment of the present invention. Thus, a system as described herein would function as an embodiment of the present invention if the other parameters were also met (such as projecting effective illuminance).

Figure 37:
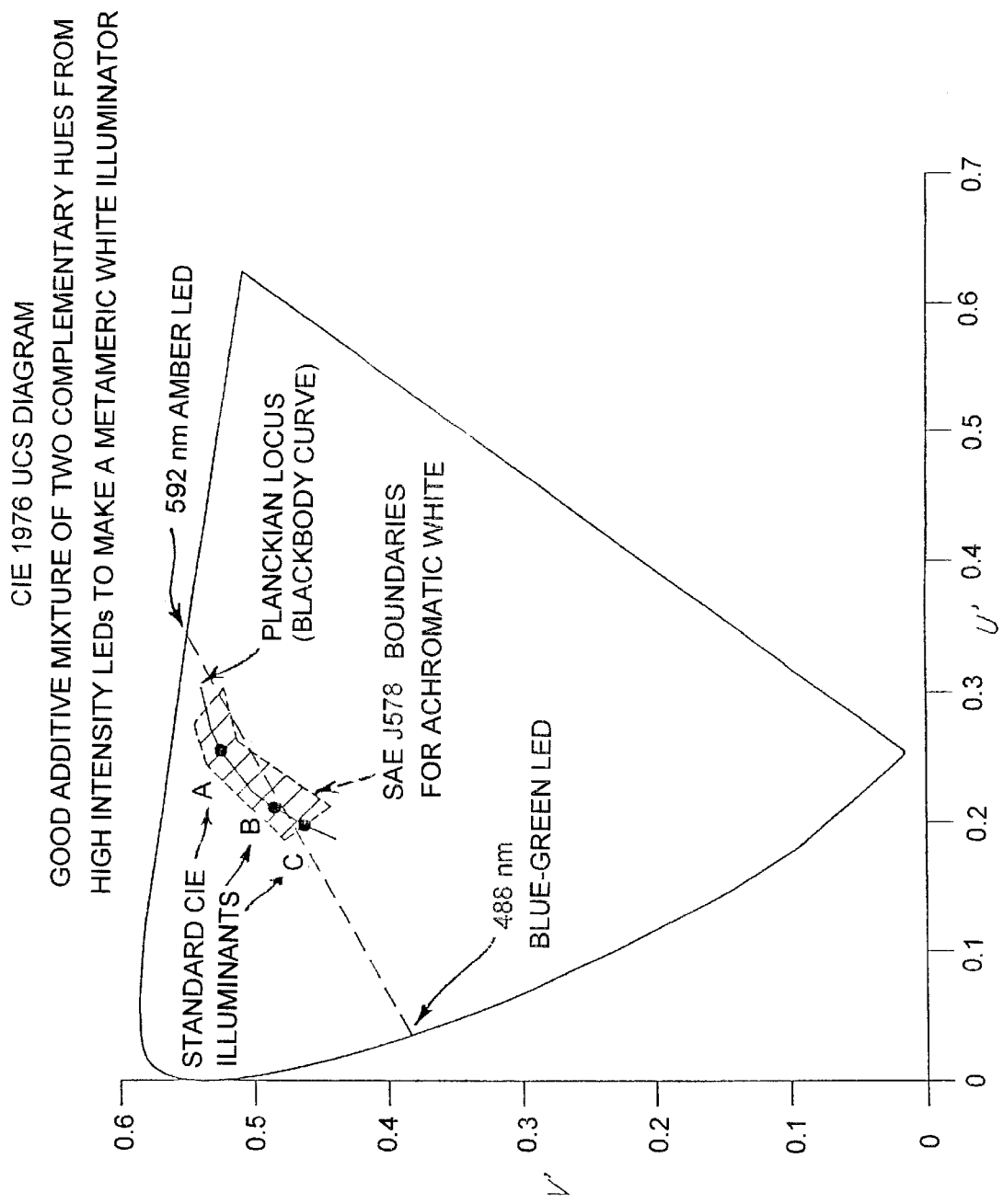
FIG. 37 is a CIE 1976 UCS diagram showing the location of the Planckian Locus, the locations of Standard Illuminants A, B and C, the location of the translated SAE J578 boundaries for achromatic white light, and the locus of binary additive mixtures from amber 592 nm and blue-green 488 nm LEDs which is substantially coaxial with the Planckian Locus.

A more preferred embodiment is illustrated in FIG. 37 which is a CIE 1976 UCS diagram illustrating a binary complementary combination of light from a plurality of LEDs of two different types having peak wavelengths of 592 nm and 488 nm and perceived hues of amber and blue-green, respectively, such that the light from the two types of LEDs overlaps and mixes with sufficient intensity and appropriate proportion to be an effective illuminator projecting white light. Although their spectra are very different from that of any Standard Illuminant, the mixed output of an amber LED and a blue-green LED appears surprisingly to be almost identical to Standard Illuminant B or C when viewed by a "standard" human observer. On FIG. 37, the u', v' coordinates of the nominal mixture occur at the intersection of this dashed line and the Planckian Locus, between Standard Illuminants A and B. Since the u', v' coordinates of the LED colors in this embodiment mark the endpoints of a line segment which is substantially coaxial with the Planckian Locus and the long axis of the SAE J578 achromatic white boundaries, any intensity variation deriving from manufacturing variations will produce colors along an axis remaining in close proximity to the Planckian Locus and within the boundaries of other widely-accepted definitions of white. This significantly simplifies the manufacturing process and control electronics associated with the illuminator, which decreases the overall production cost and makes commercialization more practical. In addition, we have found that of the many types and hues of LEDs presently available, the two preferred types of LEDs for the present invention have very high luminous efficacy in terms of light emitted compared to electrical power consumed. These are transparent substrate AlInGaP amber LEDs available from Hewlett Packard Inc., Optoelectronics Division located in San Jose, Calif., and GaN blue-green LEDs available from Nichia Chemical Industries, LTD located in Anan-shi, Tokushima-ken, Japan.

FIG. 37 further amplifies this embodiment of the invention by illustrating issues of manufacturing variation within the context of other definitions of white. The hatched lines between amber (peak emission between 572 nm and 600 nm) and blue-green (peak emission between 476 nm and 492 nm) show the range in LED hue variations at either endpoint for this embodiment which would be generally capable of producing metameric white light. Since LEDs are solid-state devices comprising a base semiconductor material and one or more dopants which impact the spectral emission characteristics of the LED, the level of doping and other process parameters can be adjusted to intentionally modify the peak wavelength emitted by the LED. Furthermore, as discussed hereinabove, certain random variations also occur, affecting the additive color mixture. In this embodiment of the present invention, however, larger than normal variations can be tolerated. This is because a large part of the area between the hatched lines and within the monochromatic locus of the chart overlaps the areas commonly perceived as and referred to as white, such as the Planckian Locus, the marked region corresponding to the translated Kelly boundaries for the color white, or the shaded region corresponding to the translated SAE J578 boundaries for achromatic white. Therefore, all of the additive colors resulting from reasonable variations in the LED intensity and hue of this embodiment fall within one of the white regions. The figure thus clearly illustrates how there can be a range of amber LEDs whose hues are complementary with a range of blue-green LED hues which, when combined, form substantially white light.

Figure 39:
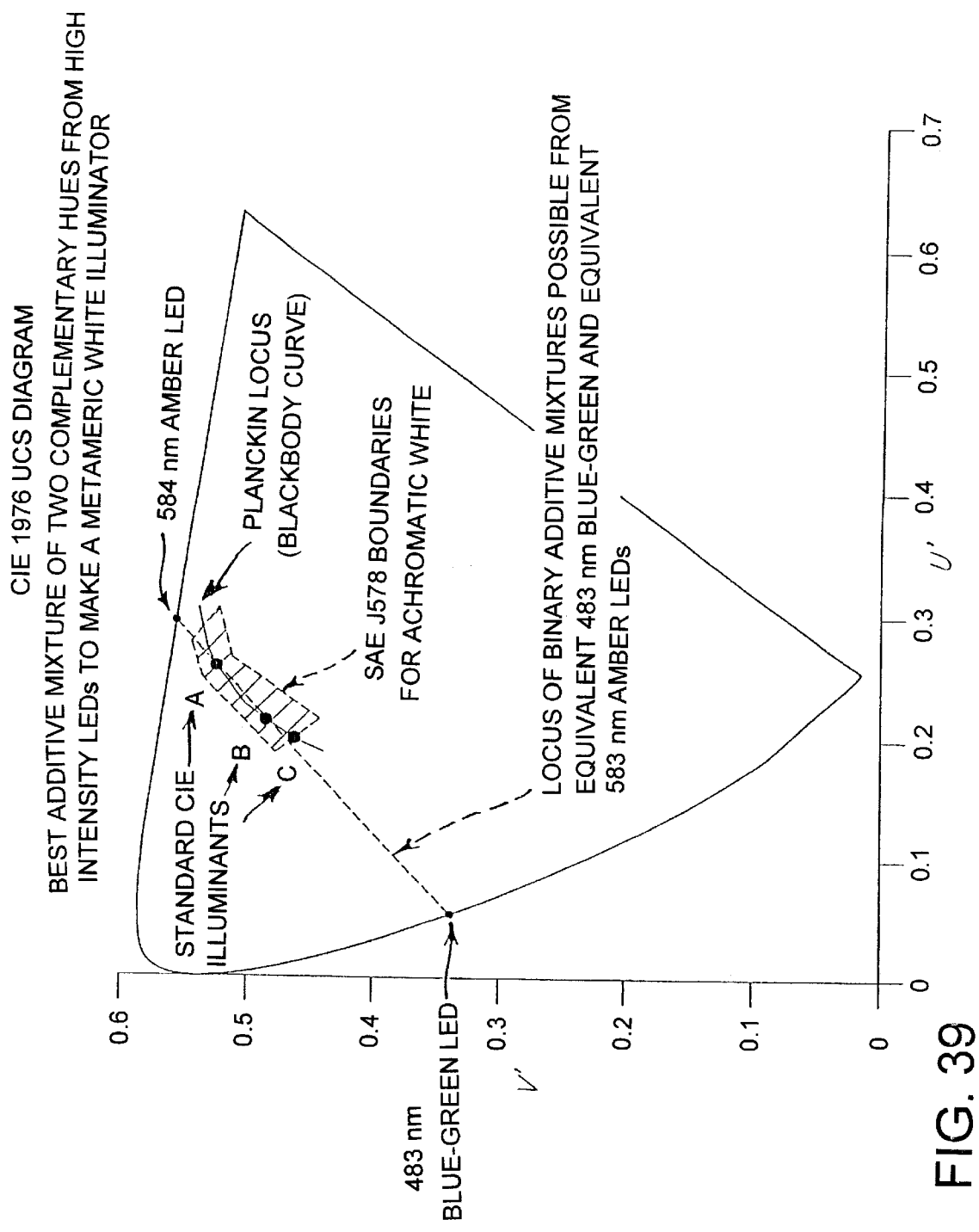
FIG. 39 is a CIE 1976 UCS diagram showing the location of the Planckian Locus, the locations of Standard Illuminants A, B, and C, the location of the translated SAE J578 boundaries for achromatic white light, and the locus of binary additive mixtures from amber 584 nm and blue-green 483 nm LEDs which is substantially coaxial with the Planckian Locus.

The most preferred embodiment of the present invention uses a binary complementary combination of light from a plurality of LEDs of two different types having peak wavelengths of 584 nm and 483 nm and perceived hues of amber and blue-green, respectively, such that the light from the two types of LEDs overlaps and mixes with sufficient intensity and appropriate proportion to project effective white illumination. When plotted on a color chart, the u', v' coordinates of the light emitted by the LEDs of this embodiment mark the endpoints of an interconnecting line segment that is coaxial with the portion of the Planckian Locus which traverses Standard Illuminants A, B and C, as shown in FIG. 39.

As discussed hereinabove, intensity and hue variations are a natural by-product of random variations occurring in production of LEDs. For this embodiment of the present invention, however, the need for intensive in-process manufacturing controls and electronic controls integrated onto an illuminator assembly to compensate for inherent manufacturing variations for LEDs is largely eliminated. This is illustrated by the substantially coaxial relationship between the line connecting the u', v' coordinates of the preferred LEDs of the present invention and a best-fit linear approximation to the portion of the Planckian Locus from 2000 K to 10000 K. In addition, process controls, inventory management, materials handling, and electronic circuit design are further simplified by only having two colors to manipulate rather than three. This substantial simplification decreases manufacturing costs significantly and augments the present invention's capability for creating and projecting white light—the only color of light desired for the practical embodiments of the present invention.

Figure 38:
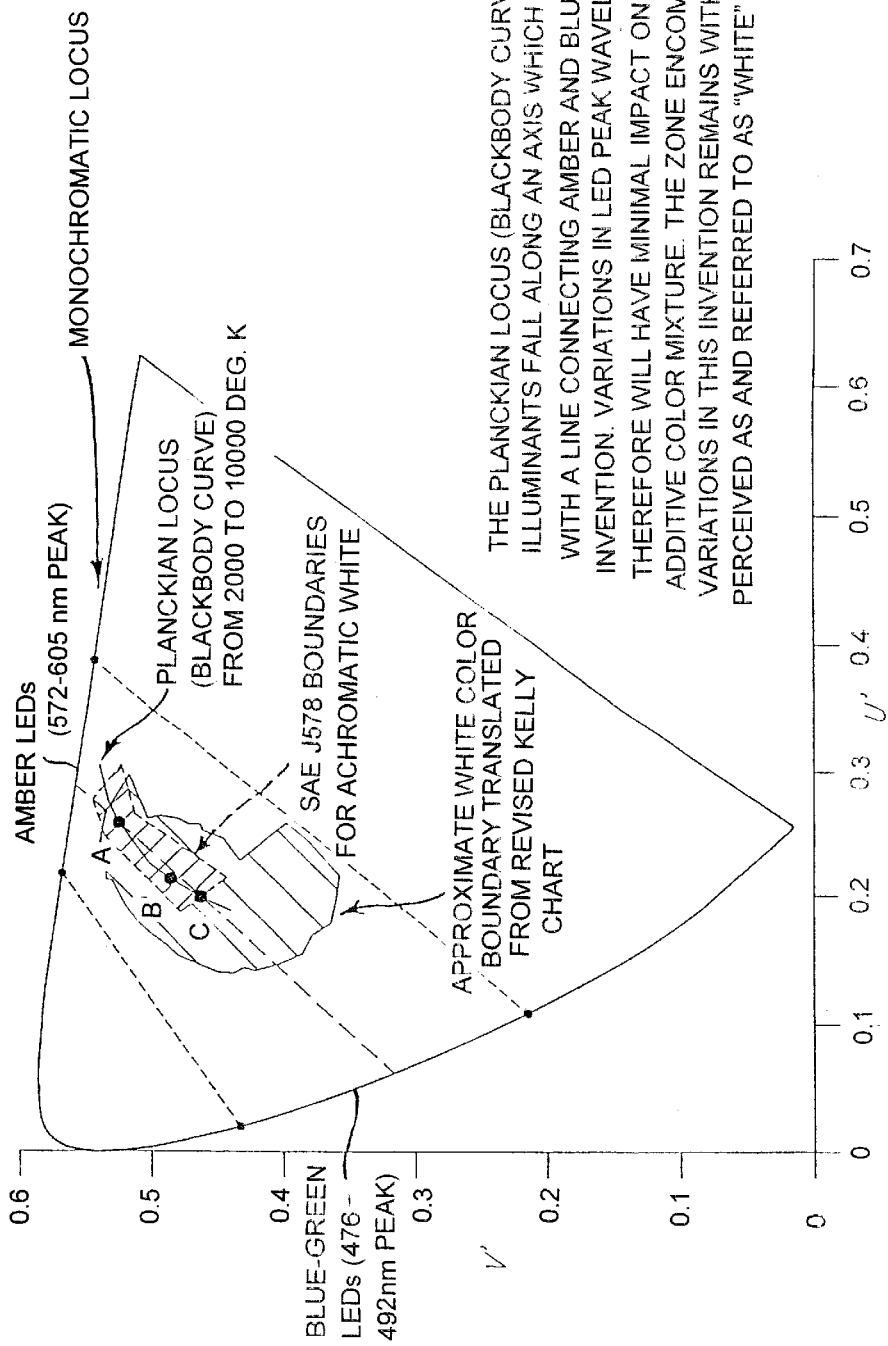
FIG. 38 is a CIE 1976 UCS diagram showing the location of the Planckian Locus, the locations of Standard Illuminants A, B and C, the location of the translated SAE J578 boundaries for achromatic white light, the approximate location of the white color boundary translated from the revised Kelly chart, and the locus of binary additive mixtures from a range of amber and blue-green LEDs which is substantially coaxial with the Planckian Locus.
Figure 40:
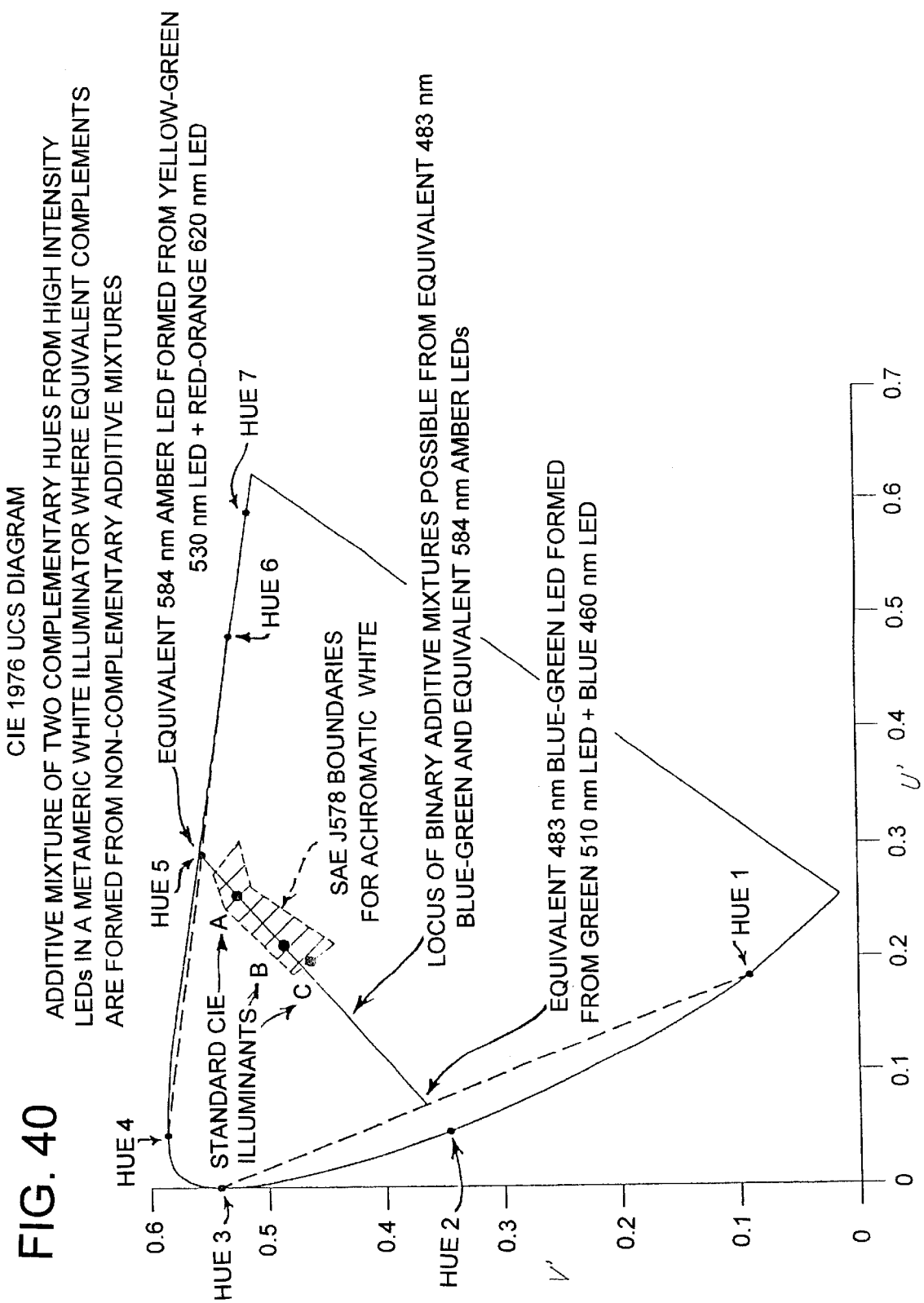
FIG. 40 is a CIE 1976 UCS diagram showing the locations of Standard Illuminants A, B, and C, the location of the translated SAE J578 boundaries for achromatic white light, and the locus of binary additive mixtures from equivalent 584 nm amber and equivalent 483 nm blue-green LEDs which is substantially coaxial with the Planckian Locus.

The flexibility of the present invention is further amplified by application of additive color techniques to synthesize the end member constituents of the binary-complementary LED light mixture described hereinabove. This approach is best understood by reference to FIG. 40, which illustrates the use of additive sub-combinations of non-complementary LEDs to form effective binary complements corresponding to the two types of LEDs discussed hereinabove. Hues 1–7 represent the emissions from LEDs as follows: hue 1 is purple-blue or blue for LEDs with a peak wavelength between 420 nm and 476 nm, hue 2 is blue-green for LEDs with a peak wavelength between 476 nm and 492 nm, hue 3 is green for LEDs with a peak wavelength between 492 nm and 530 nm, hue 4 is yellow-green or yellow for LEDs with a peak wavelength between 530 nm and 572 nm, hue 5 is amber for LEDs with a peak wavelength between 572 nm and 605 nm, hue 6 is red-orange for LEDs with a peak wavelength between 605 nm and 635 nm, and hue 7 is red for LEDs with a peak wavelength between 635 nm and 680 nm. An additive mixture of light from one or more LEDs with hues 6 or 7 and one or more LEDs with hue 4 can be combined to form light having the same hue and substantially the same saturation as LED light with hue 5. Thus an equivalent or substitute for the amber LEDs of FIG. 38 is synthesized by additive combination of the emitted light from two types of LEDs whose emissions are characterized by hues 6 or 7 and 5, respectively. In a similar fashion, an additive mixture of light from one or more LEDs with hue 1 and one or more LEDs with hue 3 can be combined to form light having the same hue and substantially the same saturation as LED light with hue 2, thus synthesizing an equivalent or substitute for the blue-green LEDs of FIG. 38.

When a non-complementary sub-combination of LED light is used to synthesize an equivalent or substitute to one of the end members of the aforementioned binary complementary mixture, then the resultant light from the sub-combination is mixed with its binary complement or effective binary complement and projected via a lens and/or other optical elements to form an effective metameric white illumination. This can be important in commercial practice, where prolonged supply disruptions are common for LEDs of one variety or another due to explosive growth in market demand or insufficient LED manufacturer capacity. As explained herein, such a disruption can be mitigated in the case of the present invention by the use of sub-combinations of more readily available alternative LEDs to form equivalent complements.

Incorporating LEDs, the vehicle has a number of advantages over prior art incandescent lights as follows:

Because individual LED chips are extremely small, typically measuring 0.008 inches×0.008 inches×0.008 inches, they approximate a point source better than most incandescent filaments and the collimating optics (such as lenses and reflectors) used with either the conventional discrete LEDs or chip-on-board LEDs can perform their intended function with much greater effectiveness. The resultant LED illuminator projects a more uniform and precisely tailored and directed intensity distribution.

LEDs have an extraordinarily long life compared with the typical 1,000–2,000 hour life for incandescent lights. A typical LED will last anywhere from 200,000 to 2 million hours, depending on its design, manufacturing process, and operating regime. LEDs are also much more rugged than incandescent bulbs; they are more resistant to mechanical shock and vibration, thermal shock and impact from flying debris. They further are virtually impervious to the on-off switching transients which cause substantial reliability problems for incandescent systems. The lifetime and reliability advantage is significant, and when coupled with their inherent ruggedness, the advantage of using LEDs becomes striking.

Comparing an amber LED (Part No. HLMT-DL00, from Hewlett Packard) with a 0.72 W power dissipation from the circuit in FIG. 21, with a Philips type 192 lamp run at 13.0 Volt, using the method set forth in Military Specification HDBK-217F-1, illustrates the significant disparity in calculated failure rate. The results show that the amber LED would have a 0.17 percent failure rate whereas the incandescent lamp would have a failure rate of 99.83 percent over the same time period.

Finally, incandescent lamps possess very low electrical resistance when first energized until they heat up to incandescence and therefore draw an inrush current which can be 12–20 times their normal operating current. This inrush places tremendous thermo-mechanical stresses on the filament of the lamp, and commonly contributes to premature failure at a fraction of rated service life (much shorter than the service life of a vehicle). Inrush current also stresses other electronic components in or attached to the illuminator system such as the power supplies, connectors, wire harnesses, fuses and relays such that all of these components must be designed to withstand repeated exposure to this large transient. LEDs have no inrush current and therefore avoid all of these issues.

The "bloom time" for an incandescent lamp or time it takes for the lamp to become fully bright after its supply voltage is initially applied is very long—in excess of 0.2 seconds for many lamps. Although extremely fast response times are not mandatory in a vehicle light, a fast response characteristic is advantageous for electronic control of intensity and color mix proportions as discussed below. Further, certain binary complementary metameric white LED illuminator applications such as lamps aiding surveillance may benefit from a strobe-like ability to become bright quickly upon electronic activation.

An important criterion for an effective illuminator is that its projected light must conform to accepted definitions of white light as previously described at reasonable operating ranges. Inasmuch as the additive complementary color mixture of the present invention depends on overlapping of projected beams from the member LEDs of the plurality in the illuminator, it is important to understand that each illuminator of the present invention will have a minimum operating distance for well-blended metameric white light. Depending on the actual LED array and associated optics utilized in a given embodiment, this distance will vary widely. Typically, good beam mixing (and thus balanced additive complementary light combination to produce reasonably uniform white light) requires a minimum operating range of about 10 times the average distance between each LED and its nearest color complement in the plurality. This minimum operating range for good beam mixing is very dependent on the application requirements and optics used, however, and can be a much larger multiple of complementary LED pitch spacing.

The pitch spacing between LEDs, array size of the plurality of the LEDs in the illuminator, and the characteristics of the collimating optics and diffusers used determine the distribution of constituent light in the illuminator's beam. Fortunately, these can be tailored to meet almost any desired combination of far-field intensity distribution, aperture, beam cut-off angle, color uniformity, and minimum operating range for effective uniform white illumination. For an electric bicycle headlamp, the predetermined distance for effective white illumination may be 5 feet and conventional discrete LEDs may be suitable as the plurality in the illuminator. For an instrument panel indicia backlight, however, the predetermined distance for effective uniform illumination may be 0.25 inches or less and a chip-on-board LED array using low f# lenslets will almost certainly be required.

Figure 41:
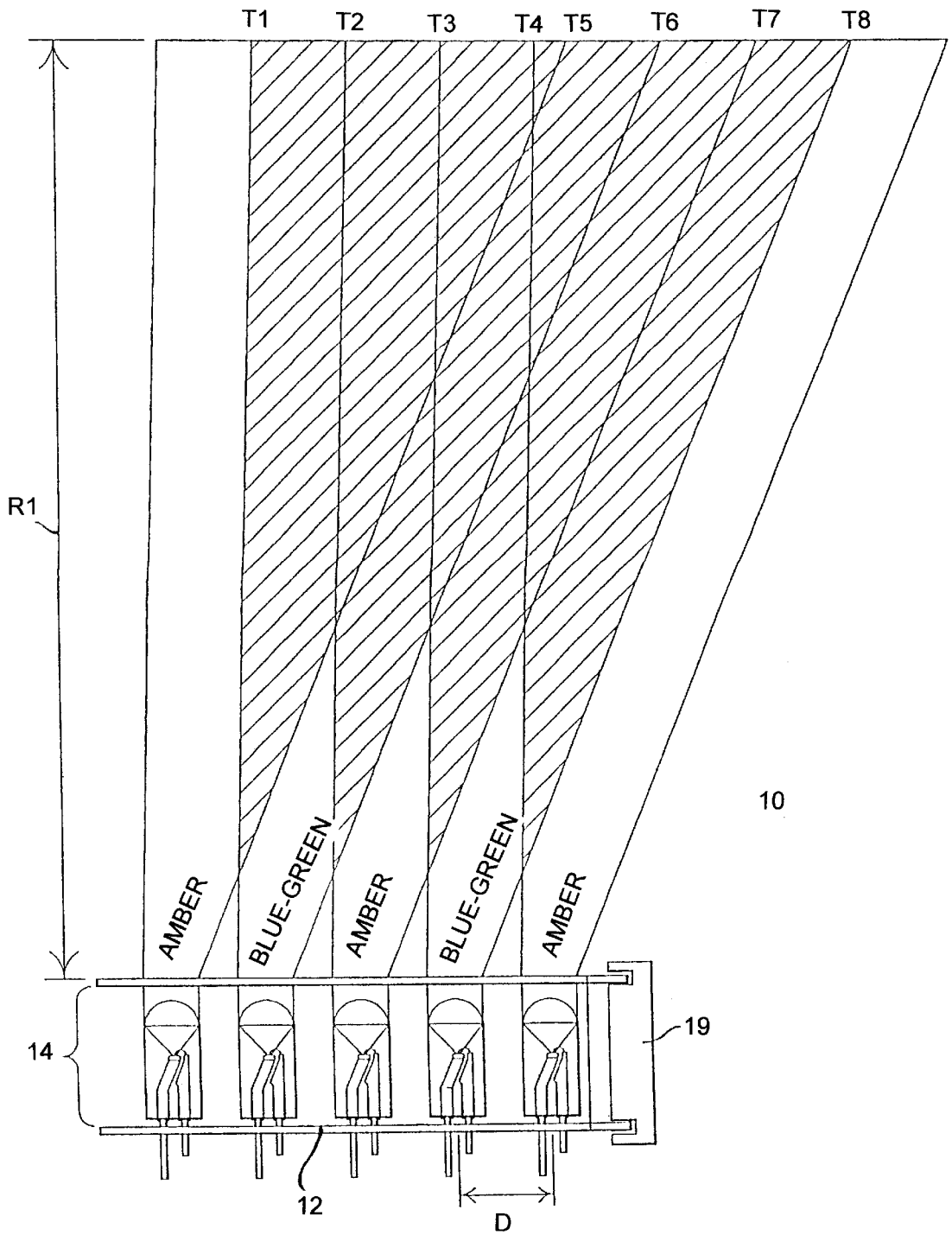
FIG. 41 is an illustrative illumination pattern for an illuminator assembly according to the present invention.

Referring to FIG. 41, the level of mixing of light from the five LEDs, as well as the luminous output, depend on the distance R1 and also depend on the distance D between complementary LEDs. If the LEDs in the plurality are packed closer together, the light mixes completely at a shorter projected distance and the uniformity of the color and illuminance of the combined beam is improved. The pitch spacing D between complementary LEDs in the plurality can vary widely from approximately 0.020 inches (for a chip-on-board LED array) to as much as 3 inches for a spotlight or greater for various floodlight applications, but is preferably as small as possible. Conventional discrete LEDs often have their own integral optical elements assembly, and therefore, there is a limit on how closely they can be packed together. The five T 1-¾ LEDs used to gather the above data were placed in a row approximately 0.4 inches apart.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

The invention claimed is:

1. A vehicle signal lamp assembly comprising:
a support structure for mounting to a vehicle;
a lens mounted to said support structure;
a first set of LEDs mounted to said support structure behind said lens, said first set of LEDs being activated in response to a first activation signal such that colored light is emitted from said lens; and
a second set of LEDs mounted to said support structure behind said lens, said second set of LEDs being selectively activated in response to a second activation signal such that substantially white light is emitted from the lamp assembly, wherein said second set of LEDs include LEDs that emit binary complementary colors, and wherein said vehicle signal lamp assembly is capable of projecting white illumination of greater than 15 lux at a predetermined distance of 10 times the minimum distance between any two of said LEDs in said second set of LEDs.

2. A vehicle lamp assembly for mounting to a vehicle comprising:
- at least one multichip white-light-emitting discrete LED device, said LED device including:
  - a lead frame,
  - at least two LED chips mounted on said lead frame, and
  - a polymer encapsulant for encapsulating said LED chips on said lead frame, wherein when energized, said LED chips emit light having two different and complementary spectral bands that together form white light.

3. The vehicle lamp assembly of claim 2, wherein said first LED chip is activated in response to a first activation signal such that light is emitted from said lamp assembly having a first hue, and both said first and second LED chips are activated in response to a second activation signal such that substantially white light is emitted from the lamp assembly.

4. The vehicle lamp assembly of claim 2 further including a lens positioned in front of said LED device.

5. The vehicle lamp assembly of claim 4, wherein said lens includes first and second lens regions.

6. The vehicle lamp assembly of claim 4, wherein said first and second lens regions are clear.

7. The vehicle lamp assembly of claim 4, wherein said first lens region is red.

8. The vehicle lamp assembly of claim 4, wherein said lens is configured to be mounted to an inside surface of a rear window of the vehicle.

9. The vehicle lamp assembly of claim 8, wherein said rear window is made of privacy glass.

10. The vehicle lamp assembly of claim 4, wherein said lens is configured to be mounted integrally within a window frame.

11. The vehicle lamp assembly of claim 2 and further including a camera and a support structure, wherein said camera and said at least one white-light-emitting discrete LED device are mounted on said support structure and oriented to emit light in a rearward direction from the vehicle and to capture images to the rear of the vehicle for display to a vehicle operator, wherein said camera captures images at periodic intervals and said at least one LED device is periodically activated to emit light during those intervals when said camera is not capturing images.

12. The vehicle lamp assembly of claim 2, wherein at least one of said LED chips emits red light.

13. The vehicle lamp assembly of claim 2, wherein said LED device further comprises an additional LED chip that emits red light.

14. The vehicle lamp assembly of claim 2, wherein said LED device emits red light in response to a brake signal.

15. The vehicle lamp assembly of claim 2, wherein said assembly is adapted to be mounted to the rear of the vehicle and to function as a center high-mounted stop light.

16. The vehicle lamp assembly of claim 2, wherein said LED device emits substantially white light in response to a back-up activation signal to serve as a back-up light.

17. The vehicle lamp assembly of claim 2, wherein said LED device emits substantially white light to function as a rear illumination light.

18. The vehicle lamp assembly of claim 17, wherein said LED device functions as a cargo light.

19. The vehicle lamp assembly of claim 2, wherein said LED device emits colored light in responsive to a turn signal.

20. The vehicle lamp assembly of claim 19, wherein said colored light is red.

21. The vehicle lamp assembly of claim 2, wherein said LED device emits red light in response to a running light signal.

22. A vehicle lamp assembly for mounting to a vehicle comprising at least one multichip LED device, said multichip LED device including a first LED chip and a second LED chip, where said first LED chip emits light having a first hue that is different from a second hue of light that is emitted by said second LED chip, said multichip LED device being selectively activated in response to an activation signal such that when the activation signal is received both said first and second LED chips are proportionately energized and light projected from said first and second LED chips overlaps and forms effective white light.

23. The vehicle lamp assembly of claim 22, wherein said lamp assembly is mounted to the rear of the vehicle and said LED device is oriented to emit light in a rearward direction from the vehicle.

24. The vehicle lamp assembly of claim 22, wherein said LED device further includes:
- an electrically conductive lead frame, wherein said first and second LED chips are mounted on said lead frame, and
- a polymer encapsulant for encapsulating said first and second LED chips on said lead frame, wherein said LEDs emit light through said encapsulant.

25. The vehicle lamp assembly of claim 22, wherein said lamp assembly is configured to be mounted to an inside surface of a rear window of the vehicle.

26. The vehicle lamp assembly of claim 25, wherein said rear window is made of privacy glass.

27. The vehicle lamp assembly of claim 22, wherein said lamp assembly is configured to be mounted integrally within a window frame.

28. The vehicle lamp assembly of claim 22 further comprising a camera and a lens, wherein said camera and said at least one multichip LED device are mounted behind said lens.

29. A vehicle lamp assembly comprising:
- a lamp structure comprising at least two LED chips, said lamp structure adapted for mounting to a vehicle,
- wherein, when proportionally energized, said LED chips emit light having two different and complementary spectral bands other than red and that together form effective white light.

30. The vehicle lamp assembly of claim 29, wherein said LED chips are mounted on a common support structure.

31. The vehicle lamp assembly of claim 30, wherein said common support structure is a leadframe of a discrete LED device having an encapsulant that encapsulates the LED chips on said leadframe.

32. The vehicle lamp assembly of claim 30, wherein said common support structure is a substrate and the lamp assembly further includes an encapsulant that encapsulates the LED chips on said substrate.

33. The vehicle lamp assembly of claim 29, wherein said plurality of LED chips are packaged in discrete LED device packages.

34. The vehicle lamp assembly of claim 33, wherein each LED device package emits white light.

35. The vehicle lamp assembly of claim 34 and further including additional LED device packages that emit light of colors other than white.

36. The vehicle lamp assembly of claim 34, wherein the vehicle lamp assembly is configured for mounting to the exterior of the vehicle and functions as an illuminator assembly.

37. The vehicle lamp assembly of claim 34, wherein the vehicle lamp assembly is configured for mounting to the interior of the vehicle and functions as an illuminator assembly.

38. The vehicle lamp assembly of claim 34 and further including a lens, wherein each of said plurality of LED device packages are mounted behind said lens.

39. The vehicle lamp assembly of claim 34 and further including a support member, wherein each of said plurality of LED device packages are mounted to said support member.

40. The vehicle lamp assembly of claim 39 and further including a lens mounted to said support member, wherein each of said plurality of LED device packages are mounted behind said lens.

41. The vehicle lamp assembly of claim 29, wherein said lamp structure is adapted for mounting to the vehicle so as to illuminate at least a portion of the interior of the vehicle.

42. The vehicle lamp assembly of claim 29, wherein said lamp structure is adapted for mounting to the vehicle so as to illuminate at least a portion of the exterior of the vehicle.

* * * * *

UNITED STATES PATENT AND TRADEMARK OFFICE
CERTIFICATE OF CORRECTION

PATENT NO. : 6,550,949 B1
DATED : April 22, 2003
INVENTOR(S) : Frederick T. Bauer et al.

It is certified that error appears in the above-identified patent and that said Letters Patent is hereby corrected as shown below:

<u>Title page,</u>
Item [75], Inventors, add -- Robert C. Knapp, Coloma, MI (US); and Robert R. Turnbull, Holland, MI (US) --.

<u>Column 6,</u>
Line 27, "arid" should be -- and --.
Lines 62-63, delete "application Ser.".

<u>Column 9,</u>
Line 1, delete "application Ser.".

<u>Column 15,</u>
Line 42, "PCT/US096/07382" should be -- PCT/US96/07382 --.

<u>Column 17,</u>
Line 27, "descended" should be -- described --.

<u>Column 20,</u>
Line 5, "chips 16" should be -- chips 1016 --.

<u>Column 33,</u>
Line 66, "responsive" should be -- response --.

Signed and Sealed this

Twenty-third Day of December, 2003

JAMES E. ROGAN
*Director of the United States Patent and Trademark Office*